United States Patent
Zhang et al.

(10) Patent No.: US 7,413,998 B2
(45) Date of Patent: Aug. 19, 2008

(54) BIASED PULSE DC REACTIVE SPUTTERING OF OXIDE FILMS

(75) Inventors: Hongmei Zhang, San Jose, CA (US); Mukundan Narasimhan, San Jose, CA (US); Ravi B. Mullapudi, San Jose, CA (US); Richard E. Demaray, Portola Valley, CA (US)

(73) Assignee: SpringWorks, LLC, Minnetonka, MN (US)

( * ) Notice: Subject to any disclaimer, the term of this patent is extended or adjusted under 35 U.S.C. 154(b) by 5 days.

(21) Appl. No.: 11/228,717

(22) Filed: Sep. 16, 2005

(65) Prior Publication Data

US 2006/0057283 A1    Mar. 16, 2006

Related U.S. Application Data

(62) Division of application No. 10/101,863, filed on Mar. 16, 2002.

(51) Int. Cl.
*H01L 21/31* (2006.01)
*H01L 21/469* (2006.01)

(52) U.S. Cl. .............. 438/769; 438/771; 257/E21.273; 257/E21.278; 257/E21.462

(58) Field of Classification Search ................ 438/769, 438/770, 771, 787, 788, 533; 257/E21.273, 257/E21.278, E21.462; 204/192.12, 192.15
See application file for complete search history.

(56) References Cited

U.S. PATENT DOCUMENTS

| | | |
|---|---|---|
| 3,309,302 A | 3/1967 | Heil |
| 3,616,403 A | 10/1971 | Collins et al. |
| 3,850,604 A | 11/1974 | Klein |
| 4,006,070 A | 2/1977 | King et al. |
| 4,111,523 A | 9/1978 | Kaminow et al. |
| 4,437,966 A | 3/1984 | Hope et al. |
| 4,587,225 A | 5/1986 | Tsukuma et al. |
| 4,619,680 A | 10/1986 | Nourshargh et al. |
| RE32,449 E | 6/1987 | Claussen |
| 4,710,940 A | 12/1987 | Sipes, Jr. |

(Continued)

FOREIGN PATENT DOCUMENTS

EP    0 510 883 A2    10/1992

(Continued)

OTHER PUBLICATIONS

Belkind, A. et al., "Pulsed-DC Reactive Sputtering of Dielectrics: Pulsing Parameter Effects," 43rd Annual Technical Conference Proceedings-Denver: 86-90 (Apr. 15-20, 2000).

(Continued)

*Primary Examiner*—Michelle Estrada
(74) *Attorney, Agent, or Firm*—Finnegan, Henderson, Farabow, Garrett & Dunner, L.L.P.

(57) ABSTRACT

A biased pulse DC reactor for sputtering of oxide films is presented. The biased pulse DC reactor couples pulsed DC at a particular frequency to the target through a filter which filters out the effects of a bias power applied to the substrate, protecting the pulsed DC power supply. Films deposited utilizing the reactor have controllable material properties such as the index of refraction. Optical components such as waveguide amplifiers and multiplexers can be fabricated using processes performed on a reactor according to the present invention.

13 Claims, 27 Drawing Sheets

U.S. PATENT DOCUMENTS

| | | |
|---|---|---|
| 4,785,459 A | 11/1988 | Baer |
| 4,915,810 A | 4/1990 | Kestigian et al. |
| 4,978,437 A | 12/1990 | Wirz |
| 5,085,904 A | 2/1992 | Deak et al. |
| 5,107,538 A | 4/1992 | Benton et al. |
| 5,119,460 A | 6/1992 | Bruce et al. |
| 5,173,271 A | 12/1992 | Chen et al. |
| 5,174,876 A | 12/1992 | Buchal et al. |
| 5,196,041 A | 3/1993 | Tumminelli et al. |
| 5,200,029 A | 4/1993 | Bruce et al. |
| 5,206,925 A | 4/1993 | Nakazawa et al. |
| 5,225,288 A | 7/1993 | Beeson et al. |
| 5,237,439 A | 8/1993 | Misono et al. |
| 5,252,194 A | 10/1993 | Demaray et al. |
| 5,287,427 A | 2/1994 | Atkins et al. |
| 5,296,089 A | 3/1994 | Chen et al. |
| 5,303,319 A | 4/1994 | Ford et al. |
| 5,306,569 A | 4/1994 | Hiraki |
| 5,309,302 A | 5/1994 | Vollmann |
| 5,338,625 A | 8/1994 | Bates et al. |
| 5,355,089 A | 10/1994 | Treger |
| 5,381,262 A | 1/1995 | Arima et al. |
| 5,427,669 A | 6/1995 | Drummond |
| 5,457,569 A | 10/1995 | Liou et al. |
| 5,475,528 A | 12/1995 | LaBorde |
| 5,478,456 A | 12/1995 | Humpal et al. |
| 5,483,613 A | 1/1996 | Bruce et al. |
| 5,499,207 A | 3/1996 | Miki et al. |
| 5,512,147 A | 4/1996 | Bates et al. |
| 5,538,796 A | 7/1996 | Schaffer et al. |
| 5,555,127 A | 9/1996 | Abdelkader et al. |
| 5,563,979 A | 10/1996 | Bruce et al. |
| 5,565,071 A | 10/1996 | Demaray et al. |
| 5,569,520 A | 10/1996 | Bates |
| 5,591,520 A | 1/1997 | Migliorini et al. |
| 5,597,660 A | 1/1997 | Bates |
| 5,603,816 A | 2/1997 | Demaray et al. |
| 5,607,560 A | 3/1997 | Hirabayashi et al. |
| 5,607,789 A | 3/1997 | Treger et al. |
| 5,612,152 A | 3/1997 | Bates |
| 5,613,995 A | 3/1997 | Bhandarkar et al. |
| 5,654,054 A | 8/1997 | Tropsha et al. |
| 5,654,984 A | 8/1997 | Hershbarger et al. |
| 5,681,671 A | 10/1997 | Orita et al. |
| 5,686,360 A | 11/1997 | Harvey, III et al. |
| 5,689,522 A | 11/1997 | Beach |
| 5,693,956 A | 12/1997 | Shi et al. |
| 5,718,813 A | 2/1998 | Drummond |
| 5,719,976 A | 2/1998 | Henry et al. |
| 5,731,661 A | 3/1998 | So et al. |
| 5,738,731 A | 4/1998 | Shindo et al. |
| 5,755,938 A | 5/1998 | Fukui et al. |
| 5,757,126 A | 5/1998 | Harvey, III et al. |
| 5,762,768 A | 6/1998 | Goy et al. |
| 5,771,562 A | 6/1998 | Harvey, III et al. |
| 5,792,550 A | 8/1998 | Phillips et al. |
| 5,811,177 A | 9/1998 | Shi et al. |
| 5,830,330 A | 11/1998 | Lantsman |
| 5,831,262 A | 11/1998 | Greywall et al. |
| 5,841,931 A | 11/1998 | Foresi et al. |
| 5,847,865 A | 12/1998 | Gopinath et al. |
| 5,849,163 A | 12/1998 | Ichikawa et al. |
| 5,853,830 A | 12/1998 | McCaulley et al. |
| 5,855,744 A | 1/1999 | Halsey et al. |
| 5,870,273 A | 2/1999 | Sogabe et al. |
| 5,882,946 A | 3/1999 | Otani |
| 5,900,057 A | 5/1999 | Buchal et al. |
| 5,930,584 A | 7/1999 | Sun et al. |
| 5,942,089 A | 8/1999 | Sproul et al. |
| 5,948,215 A | 9/1999 | Lantsman |
| 5,952,778 A | 9/1999 | Haskal et al. |
| 5,961,682 A | 10/1999 | Lee et al. |
| 5,966,491 A | 10/1999 | DiGiovanni |
| 5,977,582 A | 11/1999 | Fleming et al. |
| 6,001,224 A | 12/1999 | Drummond et al. |
| 6,004,660 A | 12/1999 | Topolski et al. |
| 6,024,844 A | 2/2000 | Drummond et al. |
| 6,046,081 A | 4/2000 | Kuo |
| 6,051,114 A | 4/2000 | Yao et al. |
| 6,051,296 A | 4/2000 | McCaulley et al. |
| 6,052,397 A | 4/2000 | Jeon et al. |
| 6,057,557 A | 5/2000 | Ichikawa |
| 6,058,233 A | 5/2000 | Dragone |
| 6,071,323 A | 6/2000 | Kawaguchi |
| 6,077,642 A | 6/2000 | Ogata et al. |
| 6,080,643 A | 6/2000 | Noguchi et al. |
| 6,088,492 A | 7/2000 | Kaneko et al. |
| 6,093,944 A | 7/2000 | VanDover |
| 6,106,933 A | 8/2000 | Nagai et al. |
| 6,117,279 A | 9/2000 | Smolanoff et al. |
| 6,146,225 A | 11/2000 | Sheats et al. |
| 6,154,582 A | 11/2000 | Bazylenko et al. |
| 6,157,765 A | 12/2000 | Bruce et al. |
| 6,162,709 A | 12/2000 | Raoux et al. |
| 6,165,566 A | 12/2000 | Tropsha |
| 6,176,986 B1 | 1/2001 | Watanabe et al. |
| 6,197,167 B1 | 3/2001 | Tanaka |
| 6,198,217 B1 | 3/2001 | Suzuki et al. |
| 6,204,111 B1 | 3/2001 | Uemoto et al. |
| 6,210,544 B1 | 4/2001 | Sasaki |
| 6,214,660 B1 | 4/2001 | Uemoto et al. |
| 6,232,242 B1 | 5/2001 | Hata et al. |
| 6,236,793 B1 | 5/2001 | Lawrence et al. |
| 6,242,129 B1 | 6/2001 | Johnson |
| 6,248,291 B1 | 6/2001 | Nakagama et al. |
| 6,248,640 B1 | 6/2001 | Nam |
| 6,261,917 B1 | 7/2001 | Quek et al. |
| 6,280,585 B1 | 8/2001 | Obinata et al. |
| 6,281,142 B1 | 8/2001 | Basceri et al. |
| 6,287,986 B1 | 9/2001 | Mihara |
| 6,288,835 B1 | 9/2001 | Nilsson et al. |
| 6,290,821 B1 | 9/2001 | McLeod |
| 6,290,822 B1 | 9/2001 | Fleming et al. |
| 6,300,215 B1 | 10/2001 | Shin |
| 6,302,939 B1 | 10/2001 | Rabin et al. |
| 6,306,265 B1 | 10/2001 | Fu et al. |
| 6,344,419 B1 | 2/2002 | Forster et al. |
| 6,350,353 B2 | 2/2002 | Gopalraja et al. |
| 6,356,694 B1 | 3/2002 | Weber |
| 6,358,810 B1 | 3/2002 | Dornfest et al. |
| 6,361,662 B1 | 3/2002 | Chiba et al. |
| 6,365,319 B1 | 4/2002 | Heath et al. |
| 6,391,166 B1 | 5/2002 | Wang |
| 6,409,965 B1 | 6/2002 | Nagata et al. |
| 6,413,382 B1 | 7/2002 | Wang et al. |
| 6,413,645 B1 | 7/2002 | Graff et al. |
| 6,416,598 B1 | 7/2002 | Sircar |
| 6,423,776 B1 | 7/2002 | Akkapeddi et al. |
| 6,433,380 B2 | 8/2002 | Shin |
| 6,444,750 B1 | 9/2002 | Touhsaent |
| 6,452,717 B1 | 9/2002 | Endo |
| 6,488,822 B1 | 12/2002 | Moslehi |
| 6,506,289 B2 | 1/2003 | Demaray et al. |
| 6,511,615 B1 | 1/2003 | Dawes et al. |
| 6,533,907 B2 | 3/2003 | Demaray et al. |
| 6,537,428 B1 | 3/2003 | Xiong et al. |
| 6,563,998 B1 | 5/2003 | Farah et al. |
| 6,576,546 B2 | 6/2003 | Gilbert et al. |
| 6,602,338 B2 | 8/2003 | Chen et al. |
| 6,605,228 B1 | 8/2003 | Kawaguchi et al. |
| 6,615,614 B1 | 9/2003 | Makikawa et al. |
| 6,632,563 B1 | 10/2003 | Krasnov et al. |
| 6,673,716 B1 | 1/2004 | D'Couto et al. |
| 6,750,156 B2 | 6/2004 | Le et al. |

| | | |
|---|---|---|
| 6,760,520 B1 | 7/2004 | Medin et al. |
| 6,768,855 B1 | 7/2004 | Bakke et al. |
| 6,827,826 B2 | 12/2004 | Demaray et al. |
| 6,846,765 B2 | 1/2005 | Imamura et al. |
| 6,849,165 B2 | 2/2005 | Koppel et al. |
| 6,884,327 B2 | 4/2005 | Pan et al. |
| 7,262,131 B2 | 8/2007 | Narasimhan et al. |
| 2001/0027159 A1 | 10/2001 | Kaneyoshi |
| 2001/0031122 A1 | 10/2001 | Lackritz et al. |
| 2001/0034106 A1 | 10/2001 | Moise et al. |
| 2001/0041460 A1 | 11/2001 | Wiggins |
| 2002/0033330 A1 | 3/2002 | Demaray et al. |
| 2002/0076133 A1 | 6/2002 | Li et al. |
| 2002/0106297 A1 | 8/2002 | Ueno et al. |
| 2002/0134671 A1 | 9/2002 | Demaray et al. |
| 2002/0170821 A1 | 11/2002 | Sandlin et al. |
| 2002/0191916 A1 | 12/2002 | Frish et al. |
| 2003/0019326 A1 | 1/2003 | Han et al. |
| 2003/0022487 A1 | 1/2003 | Yoon et al. |
| 2003/0042131 A1 | 3/2003 | Johnson |
| 2003/0044118 A1 | 3/2003 | Zhou et al. |
| 2003/0063883 A1 | 4/2003 | Demaray et al. |
| 2003/0077914 A1 | 4/2003 | Le et al. |
| 2003/0079838 A1 | 5/2003 | Brcka |
| 2003/0097858 A1 | 5/2003 | Strohhofer et al. |
| 2003/0127319 A1 | 7/2003 | Demaray et al. |
| 2003/0134054 A1 | 7/2003 | Demaray et al. |
| 2003/0141186 A1 | 7/2003 | Wang et al. |
| 2003/0143853 A1 | 7/2003 | Celii et al. |
| 2003/0173207 A1 | 9/2003 | Zhang et al. |
| 2003/0173208 A1 | 9/2003 | Pan et al. |
| 2003/0174391 A1 | 9/2003 | Pan et al. |
| 2003/0175142 A1 | 9/2003 | Milonopoulou et al. |
| 2003/0185266 A1 | 10/2003 | Henrichs |
| 2003/0234835 A1 | 12/2003 | Torii et al. |
| 2004/0077161 A1 | 4/2004 | Chen et al. |
| 2004/0105644 A1 | 6/2004 | Dawes |
| 2004/0259305 A1 | 12/2004 | Demaray et al. |
| 2005/0000794 A1 | 1/2005 | Demaray et al. |
| 2005/0006768 A1 | 1/2005 | Narasimhan et al. |
| 2005/0048802 A1 | 3/2005 | Zhang et al. |
| 2005/0175287 A1 | 8/2005 | Pan et al. |
| 2005/0183946 A1 | 8/2005 | Pan et al. |
| 2006/0054496 A1 | 3/2006 | Zhang et al. |
| 2006/0057304 A1 | 3/2006 | Zhang et al. |
| 2006/0071592 A1 | 4/2006 | Narasimhan et al. |
| 2006/0134522 A1 | 6/2006 | Zhang et al. |
| 2007/0053139 A1 | 3/2007 | Zhang et al. |

FOREIGN PATENT DOCUMENTS

| | | |
|---|---|---|
| EP | 0 652 308 A2 | 10/1994 |
| EP | 0 639 655 A1 | 2/1995 |
| EP | 0 820 088 A2 | 1/1998 |
| EP | 0 867 985 B1 | 9/1998 |
| EP | 1068899 A1 | 1/2001 |
| EP | 1 092 689 A1 | 4/2001 |
| EP | 1 189 080 A2 | 3/2002 |
| JP | 2-054764 A2 | 2/1990 |
| JP | 6-010127 A | 1/1994 |
| JP | 6-100333 A | 12/1994 |
| JP | 7-224379 A | 8/1995 |
| JP | 7-233469 | 9/1995 |
| KR | 2002-26187 | 4/2002 |
| WO | WO 96/23085 | 8/1996 |
| WO | WO 97/35044 | 9/1997 |
| WO | WO 00/21898 A1 | 4/2000 |
| WO | WO 00/22742 A2 | 4/2000 |
| WO | WO 00/36665 A1 | 6/2000 |
| WO | WO 01/82297 A1 | 11/2001 |
| WO | WO 01/86731 | 11/2001 |
| WO | WO 02/12932 A2 | 2/2002 |
| WO | WO 2004/021532 A1 | 3/2004 |
| WO | WO 2004/077519 A2 | 9/2004 |
| WO | WO 2004/106581 A2 | 12/2004 |
| WO | WO 2004/106582 A2 | 12/2004 |
| WO | WO 2006/063308 A2 | 6/2006 |
| WO | WO 2007/027535 A2 | 3/2007 |

OTHER PUBLICATIONS

Scholl, R., "Power Supplies for Pulsed Plasma Technologies: State-Of-The-Art And Outlook," Advances Energy Industries, Inc., pp. 1-8 (1999).
Scholl, R., "Power Systems for Reactive Sputtering of Insulating Films," Advances Energy Industries, Inc., pp. 1-8 (Aug. 2001).
Office Action dated Dec. 1, 2006, in U.S. Appl. No. 10/291,179.
Response to Office Action and Terminal Disclaimer dated Mar. 1, 2007, in U.S. Appl. No. 10/291,179.
Office Action dated Dec. 18, 2006, in U.S. Appl. No. 09/903,081.
Response to Office Action dated Mar. 19, 2007, in U.S. Appl. No. 09/903,081.
Office Action dated Dec. 1, 2006, in U.S. Appl. No. 11/100,856.
Response to Office Action dated Mar. 1, 2007, in U.S. Appl. No. 11/100,856.
Response to Office Action dated Feb. 6, 2007, in U.S. Appl. No. 10/101,863.
Response to Office Action dated Dec. 6, 2006, in U.S. Appl. No. 10/954,182.
Office Action dated Mar. 14, 2007, in U.S. Appl. No. 10/954,182.
Supplemental Preliminary Amendment dated Feb. 6, 2007, in U.S. Appl. No. 11/228,834.
Supplemental Preliminary Amendment dated Feb. 6, 2007, in U.S. Appl. No. 11/191,643.
Response to Office Action dated Feb. 20, 2007, in U.S. Appl. No. 10/650,461.
Office Action dated Mar. 6, 2007, in U.S. Appl. No. 10/650,461.
Notice of Allowance dated Feb. 21, 2007, in U.S. Appl. No. 10/789,953.
Response to Office Action dated Dec. 21, 2006, in U.S. Appl. No. 11/228,805.
Response to Office Action dated Nov. 8, 2006, to the Korean Patent Office in Application No. 10-2005-7016055.
Response to Office Action dated Jan. 26, 2007, in U.S. Appl. No. 10/851,542.
Notice of Allowance dated Feb. 22, 2007, in U.S. Appl. No. 10/851,542.
Supplemental Notice of Allowance dated Mar. 15, 2007, in U.S. Appl. No. 10/851,542.
Preliminary Amendment dated Jul. 21, 2006, in U.S. Appl. No. 11/297,057.
Supplemental Preliminary Amendment, Substitute Specification with Markings, Substitute Specification without Markings, and Replacement Drawing Sheets dated Dec. 6, 2006 in U.S. Appl. No. 11/297,057.
Continuation application and Preliminary Amendment dated Dec. 13, 2006.
Voluntary Amendment dated Aug. 15, 2006 in TW Appl. No. 94143175.
PCT International Search Report and Written Opinion for Application No. PCT/US05/44781 dated Oct. 3, 2006.
Response to Office Action dated Nov. 21, 2007, in U.S. Appl. No. 10/291,179.
Response to Office Action dated Dec. 5, 2007, in U.S. Appl. No. 09/903,081.
Final Office Action dated Jan. 29, 2008, in U.S. Appl. No. 09/903,081.
Amendment/RCE filed Oct. 31, 2007, in U.S. Appl. No. 11/100,856.
Office Action dated Jan. 25, 2008, in U.S. Appl. No. 11/100,856.
Office Action dated Nov. 15, 2007, in U.S. Appl. No. 10/101,863.
Response to Office Action dated Dec. 18, 2007, in U.S. Appl. No. 10/101,863.
Notice of Allowance dated Jan. 25, 2008, in U.S. Appl. No. 10/101,863.
Amendment/RCE filed Oct. 24, 2007, in U.S. Appl. No. 10/954,182.
Office Action dated Nov. 15, 2007, in U.S. Appl. No. 10/954,182.

Response to Office Action dated Dec. 18, 2007, in U.S. Appl. No. 10/954,182.
Notice of Allowance dated Feb. 1, 2008, in U.S. Appl. No. 10/954,182.
Amendment/RCE filed Oct. 31, 2007, in U.S. Appl. No. 10/650,461.
Office Action dated Nov. 16, 2007, in U.S. Appl. No. 10/650,461.
Response to Office Action dated Nov. 21, 2007, in U.S. Appl. No. 10/291,179.
Response to Office Action dated Dec. 5, 2007, in U.S. Appl. No. 09/903,081.
Final Office Action dated Jan. 29, 2008, in U.S. Appl. No. 09/903,081.
Amendment/RCE dated Oct. 31, 2007, in U.S. Appl. No. 11/100,856.
Office Action dated Jan. 25, 2008, in U.S. Appl. No. 11/100,856.
Office Action dated Nov. 15, 2007, in U.S. Appl. No. 10/101,863.
Response to Office Action dated Dec. 18, 2007, in U.S. Appl. No. 10/101,863.
Notice of Allowance dated Jan. 25, 2008, in U.S. Appl. No. 10/101,863.
Amendment/RCE dated Oct. 24, 2007, in U.S. Appl. No. 10/954,182.
Office Action dated Nov. 15, 2007, in U.S. Appl. No. 10/954,182.
Response to Office Action dated Dec. 18, 2007, in U.S. Appl. No. 10/954,182.
Notice of Allowance dated Feb. 1, 2008, in U.S. Appl. No. 10/954,182.
Amendment/RCE dated Oct. 31, 2007, in U.S. Appl. No. 10/650,461.
Office Action dated Nov. 16, 2007, in U.S. Appl. No. 10/650,461.
Office Action dated Feb. 15, 2008, in U.S. Appl. No. 10/850,968.
Dorey, R.A., "Low temperature micromoulding of functional ceramic devices," Grant summary for GR/S84156/01 for the UK Engineering and Physical Sciences Research Council, 2 pages(2004).
Howson, R.P., "The reactive sputtering of oxides and nitrides," Pure & Appl. Chem. 66(6):1311-1318 (1994).
Office Action issued on Aug. 4, 2005, in U.S. Appl. No. 10/101,863.
Office Action issued on Aug. 8, 2005 in U.S. Appl. No. 10/101,341.
Office Action dated May 21, 2007, in U.S. Appl. No. 10/291,179.
Final Office Action dated Apr. 13, 2007, in U.S. Appl. No. 09/903,081.
Amendment/RCE filed Aug. 9, 2007, in U.S. Appl. No. 09/903,081.
Office Action dated Sep. 5, 2007, in U.S. Appl. No. 09/903,081.
Final Office Action dated Sep. 7, 2007, in U.S. Appl. No. 11/100,856.
Final Office Action dated May 2, 2007, in U.S. Appl. No. 10/101,863.
Response to Final Office Action filed Oct. 2, 2007, in U.S. Appl. No. 10/101,863.
Response to Office Action filed Mar. 30, 2007, in U.S. Appl. No. 10/954,182.
Notice of Non-Compliant Amendment dated Apr. 12, 2007, in U.S. Appl. No. 10/954,182.
Response to Notice of Non-Compliant Amendment filed Apr. 23, 2007, in U.S. Appl. No. 10/954,182.
Final Office Action dated Jul. 24, 2007, in U.S. Appl. No. 10/954,182.
Preliminary Amendment dated Sep. 16, 2005, in U.S. Appl. No. 11/228,834.
Preliminary Amendment dated Jul. 27, 2005, in U.S. Appl. No. 11/191,643.
Corrected Preliminary Amendment dated Sep. 19, 2005, in U.S. Appl. No. 11/191,643.
Response to Office Action filed Jul. 9, 2007, in U.S. Appl. No. 10/650,461.
Final Office Action dated Oct. 10, 2007, in U.S. Appl. No. 10/650,461.
Notice of Allowance dated Mar. 26, 2007, in U.S. Appl. No. 11/228,805.
Corrected Notice of Allowance dated Jun. 7, 2007, in U.S. Appl. No. 11/228,805.
Supplemental Notice of Allowance dated Jul. 5, 2007, in U.S. Appl. No. 11/228,805.
Preliminary Amendment filed Mar. 22, 2007, in U.S. Appl. No. 11/726,972.
Voluntary Amendment filed Mar. 8, 2007, in Taiwan Application No. 93114518.
Second Supplemental Preliminary Amendment filed May 31, 2007, in U.S. Appl. No. 11/297,057.
PCT International Preliminary Report on Patentability dated Jun. 21, 2007, in International Application No. PCT/US2005/044781.
Office Action issued Sep. 21, 2005 in U.S. Appl. No. 11/100,856.
Office Action issued on Oct. 25, 2005, in U.S. Appl. No. 10/954,182.
Office Action issued on Oct. 3, 2005 in U.S. Appl. No. 10/650,461.
Affinito et al., "PML/oxide/PML Barrier Layer Performance Differences Arising from Use of UV or Electron Beam Polymerization of the PML Layers," Thin Solid Films vol. 308-309, pp. 19-25 (1997).
Affinito et al., "Polymer-Oxide Transparent Barrier Layers," Society of Vacuum Coaters, 39th Ann. Technical Conference Proceedings, May 5-10, 1996, Philadelphia, PA, pp. 392-397 (1996).
Alder, T. et al., "High-Efficiency Fiber-to-Chip Coupling Using Low-Loss Tapered Single-Mode Fiber," IEEE Photonics Technology Letters, 12(8):1016-1018 (2000).
Almeida, Vilson R. et al., "Nanotaper for compact mode conversion," Optics Letters, 28(15):1302-1304 (2003).
Asghari et al., "ASOC—A Manufacturing Integrated Optics Technology," Part of the SPIE Conference on Integrated Optics Devices III, vol. 3620, pp. 252-262 (Jan. 1999).
Barbier et al, "Amplifying Four-Wavelength Combiner, Based on Erbium/Etterbium-Doped Waveguide Amplifiers and Integrated Splitters", IEEE Photonics Technology Lettters, vol. 9, pp. 315-317, 1997, 4 pages.
Barbier, Denis, "Performances and potentioal applications of erbium doped planar waveguide amplifiers and lasers," GeeO, pp. 58-66 (dated unknown).
Beach R.J., "Theory and optimization of lens ducts," Applied Optics, 35:12:2005-15 (1996).
Belkind et al., "Using pulsed direct current power for reactive sputtering of $Al_2O_3$," J. Vac. Sci. Technol. A 17(4), pp. 1934-1940 (Jul. 1999).
Bestwick, T., "ASOC silicon integrated optics technology," Part of the SPIE Conferences on Photonics Packaging and Integration, SPIE vol. 3631, pp. 182-190 (Jan. 1999).
Borsella et al., "Structural incorporation of silver insoda-lime glass by the ion-exchange process: a photoluminescence spectroscopy study", Applied Physics A 71, pp. 125-132 (2000).
Byer et al., "Nonlinear Optics and Solid-state Lasers," IEEE Journal on Selected Topics in Quantum Electronics, vol. 6, No. 6, pp. 921-929 (Nov. 2000).
Campbell et al., "Titanium dioxide ($TiO_2$)-based gate insulators," IBM J. Res. Develop. 43(3), 383-391, (May 1999).
Chang, C.Y. (edited by), "ULSI Technology," The McGraw-Hill Companies, Inc., New York, 1996, Chapter 4, pp. 169-170, 226-231 (1996).
Chen et al. "Development of Supported Bifunctional Electrocatalysts for Unitized Regenerative Fuel Cells," Journal of the Electrochemical Society, 149(8), A1092-99, (2002).
Choi et al., "Er-Al-codoped silicate planar light waveguide-type amplifier fabricated by radio-frequency sputtering," Optics Letters, vol. 25, No. 4, pp. 263-265 (Feb. 15, 2000).
Cooksey et al. "Predicting Permeability & Transmission Rate for Multilayer Materials," Foodtechnology, vol. 53, No. 9, pp. 60-63 (Sep. 1999).
Crowder, et al., "Low-Temperature Single-Crystal Si TFT's Fabricated on Si Films Processed via Sequential Lateral Solidification," IEEE, vol. 19, No. 8 (Aug. 1998), pp. 306-308.
Delavaux et al., "Integrated optics erbium ytterbium amplifier system in 10 Gb/s fiber transmission experiment", 22nd European Conference on Optical Communication—ECOC' 96, Oslo, 4 pages (1996).
Distributed Energy Resources: Fuel Cells, Projects, http://www.eere.energy.gov/der/fuel_cells/projects.html (2003).
DuPont Teijin Films, Mylar 200 SBL 300, Product Information (2000).
Electrometals Technologies Limited, Financial Report for the year 2002, Corporate Directory, Chairman's Review, Review of Operations (2002).
E-Tek website: FAQ, Inside E-Tek, E-Tek News, Products; http://www.etek-inc.com/ (2003).

Flytzanis et al, "nonlinear Optics in Composite Materials," E. Wolf, Progress in Optics XXIX (c) Elsevier Scince Publishers B.V., pp. 323-425 (1991).

Frazao et al., "EDFA Gain Flattening Using Long-Period Fibre Gratings Based on the Electric Arc Technique," (date unknown).

Fujii et al, "1.54 mm photoluminescence of $Er^{3+}$ doped into $SiO_2$ films containing Si nanocrystals: Evidence for energy transfer from Si nanocrystals for $Er^{3+}$", Appl. Phys. Lett. 71 (9), pp. 1198-1200 (Sep. 1997).

Garcia, C. "Size Dependence of Lifetime and Absorption Cross Section of Si Nanocrystals Embedded in $SiO_2$," Appl. Phys. Lett., vol. 82, No. 10, pp. 1595-1597 (Mar. 2003).

Goossens et al., "Sensitization of $TiO_2$ with p-type semiconductor polymers," Delft Interfaculty Research Center, Delft University of Technology Laboratory of Inorganic Chemistry, The Netherlands (1998).

Greene et al., "Morphological and electrical properties of rf sputtered Y203-doped Zr02 thin films," J. Vac. Sci. Tecnol., vol. 13, No. 1 (Jan./Feb. 1976), pp. 72-75.

Han, Hak-Seung et al. "Optical Gain at 1.54 □m in Erbium-Doped Silicon Nanocluster Sensitized Waveguide," Appl. Phys. Lett., vol. 79, No. 27, pp. 4568-4570 (Dec. 2001).

Hayakawa et al., "Enhanced fluorescence from $Eu^{3+}$ owing to surface plasma oscillation of silver particles in glass", Journal of Non-Crystalline Solids, vol. 259, pp. 16-22 (1999).

Hayakawa et al, "Field enhancement effect of small Ag particles on the fluorescence from $Eu^{3+}$-doped $SiO_2$ glass", Appl. Phys. Lett., vol. 74, No. 11, pp. 1513-1515 (Mar. 1999).

Hayfield, P.C.S., "Development of a New Material-Monolithic Ti4O7 Ebonix Ceramic," Royal Society Chemistry, (2002).

Hehlen et al. "Spectroscopic Properties of $Er^{3+}$ - and $Yb^{3+}$-doped Soda-Lime Silicate and Aluminosilicate Glasses," Physical Review B, vol. 56, No. 15, pp. 9302-9318 (Oct. 1997).

Hehlen et al. "Uniform Upconversion in High-Concentration $Er^{3+}$-doped Soda Lime Silicate and Aluminosilicate Glasses," Optics Letters, vol. 22, No. 11, pp. 772-774 (Jun. 1997).

Horst et al., "Compact, Tunable Optical Devices in Silicon-Oxynitride Wave Guide Technology," IBM Research Division, 3 pages (1999).

Hubner, J. and Guldberg-Kjaer, S., "Planar Er-and Yb-Doped Amplifiers and Lasers," COM Technical University of Denmark, 10.sup.th European Conf. On Integrated Optics, Session WeB2, pp. 71-74 (2001).

Hwang, Man-Soo et al., "The effect of pulsed magnetron sputtering on the properties of indium tin oxide thin films," Elsevier Science B.V., p. 29-33, (2003).

Im, et al. "Controlled Super-lateral Growth of Si Films for Microstructural Manipulation and Optimization," Materials Science Program (1998), pp. 603-617.

Im, et al., "Crystalline Si Films for Integrated Active-Matrix LiquidCrystal Displays," MrS Bulletin (Mar. 1996), pp. 39-48.

Im, et al., "Single-crystal Si films for thin-film transistor devices," American Institute of Physics (1997), pp. 3434-3436.

Itoh, M. et al., "Large reduction of singlemode-fibre coupling loss in 1.5% delta planar lightwave circuits using spot-size converters," Electronics Letters, 38(2):72-74 (2002).

Jackson et al. "An Accurate Compact EDFA Model," Dept. of Electrical and Computer Engineering, University of BC, date unknown.

Janssen et al. "Photoinduced electron transfer from conjugated polymers onto nanocrystalline $TiO_2$," Eindhoven University of Technology, The Netherlands, date unknown.

Johnson, J.E. et al., "Monolithically Integrated Semiconductor Optical Amplifier and Electroabsorption Modulator with Dual-Waveguide Spot-Size Converter Input," IEEE Journal of Selected Topics in Quantum Electronics, 6(1):19-25, (2000).

Jonsson L.B. et al. "Frequency response in pulsed DC reactive sputtering processes," Thin Solid Films, vol. 365, pp. 43-48 (2000).

Kato et al., "Recent progress on PLC hybrid integration," Part of the SPIE Conference on Optoelectric Integrated Circuits III, SPIE. vol. 3631, pp. 28-36 (Jan. 1999).

Kato, Kuniharu et al., "PLC Hybrid Integration Technology and Its Application to Photonic Components," IEEE Journal of Selected Topics in Quantum Electronics, 6(1):4-13 (2000).

Kelly et al., "Reactive pulsed magnetron sputtering process for alumina films," J. Vac. Sci. Technol. A 18(6), pp. 2890-2896 (Nov. 2000).

Kelly et al., "Control of the structure and properties of aluminum oxide coatings deposited by pulsed magnetron sputtering," J. Vac. Sci. Technol. A 17(3), pp. 945-953 (May 1999).

Kik, P.G. et al. "Gain Limiting Processes in Er-doped Si Nanocrystal Waveguides in $SiO_2$," J. Appl. Phys., vol. 91, No. 1, pp. 534-536 (Jan. 1, 2002).

Kim et al. "Frequency-dependent pulsed direct current magnetron sputtering of titanium oxide films," J. Vac. Sci. Technol. A 19(2); 429-434 (Mar. 2001).

Kim et al. "Mixture Behaviour and Microwave Dielectric Properties in the Low-fired $TiO_2$-CuO System," Jpn. J. Appl. Phys., 39, 2696-2700, (2000).

Ladouceur, F. et al., "8.8 Evaluation of Results", Silica-based Buried Channel Waveguides and Devices,, Chapman & Hall, London, pp. 98-99 (1996).

Ladouceur, F. et al., "Effect of side wall roughness in buried channel waveguides," IEEE Proc., vol. 141, pp. 242-248 (Aug. 1994).

Lamb, William B., "Designing Nonfoil Containing Skins for VIP Applications," DuPont via Symposium Presenation, (1999).

Lamb, William et al. "Designing Non-Foil Containing Skins for Vacuum InsulationPanel (VIP) Applications," Vuoto, vol. XXVIII, No. 1-2—Gennaio-Giugno 1999, pp. 55-58 (1999).

Lange et al, "High Gain Ultra-Short Length Phosphate glass Erbium-Doped Fiber Amplifier Material", OSA Optical Fiber Communications (OFC), 3 pages (2002).

Laporta et al, "Diode-pumped cw bulk Er: Yb: glass laser", 1952 Optics Letters/vol. 16, No. 24/Dec. 15, 6 pages (1991).

Laurent-Lund, C. et al., "PECVD Grown Multiple Core Planar Waveguides with Extremely Low Interface Reflections and Losses," IEEE Photonics Technology Letters, vol. 10, No. 10, pp. 1431-1433 (Oct. 1998).

Lee et al., "Effect of size and roughness on light transmission in a S/SiO.sub.2 waveguide: Experiments and model," Department of Materials Science and Engineering, Massachusetts Institute of Technology, (Jul. 12, 2000).

Lee et al. "Effects of interfacial layer growth on the electrical characteristics of thin titanium oxide films on silicon," Applied Physics Letters, 74(21), 3143-3145, (May 1999).

Love, J.D. et al., "Quantifying Loss Minimisation in Single-Mode Fibre Tapers," Electronics Letters, 22(17):912-914, (1986).

Mardare et al. "On the structure of Titanium Oxide Thin Films," Analele Stiintifice Ale Universitatii AL. I. Cuza IASI, vol. XLV-XLVI, 201-208 (1999).

Marques, P.V.S. et al., "Planar Silica-on-Silicon Waveguide Lasers Based in Two Layer Core Devices," 10.sup.th European Conference on Integrated Optics, Session WeB2, pp. 79-82 (2001).

Meijerink et al, Luminescence of $AG^+$ in Crystalline and Glassy $SrB_4O_7$, Journal of Physics and Chemistry of Solids, vol. 54, No. 8, pp. 901-906, (1993).

Mesnaoui et al, "Spectroscopic properties of $AG^+$ ions in phospage glasses of $NaPO_3.AgPO_3$ system", European Journal of Solid State and Inorganic Chemistry, vol. 29, pp. 1001-1013, 14 pages (1992).

Mitomi, O. et al., Design of a Single-Mode Tapered Waveguide for Low-Loss Chip-to-Fiber Coupling,: IEEE Journal of Quantum Electronics, 30(8):1787-1793, (1994).

Mizuno et al. "Temperature dependence of oxide decomposition on titanium surfaces in UHV," submitted to Journal of Vacuum Science and Technology, (Oct. 28, 2001).

Ohkubo et al., "Polarization-Insensitive Arrayed-Waveguide Grating Using Pure Si)2 Cladding," Fifth Optoelectronics and Communication Conference (OECC 2000) Technical Digest, 2 pages (Jul. 2000).

Ohmi et al., "Rare earth metal oxides for high-K gate insulator," Tokyo Institute of Technology, date unknown.

Ohtsuki et al., "Gain Characteristics of a high concentration $Er^{3+}$-doped phosphate glass waveguide", J. Appl. Phys. 78(6), pp. 3617-3621 (1995).

Ono et al., "Design of a Low-loss Y-branch Optical Waveguide," Fifth Optoelectronic and Communications Conference (OECC 2000) Technical Digest, 2 pages (Jul. 2000).

Padmini et al. "Realization of High Tunability Barium Strontium Titanate Thin Films by RF Magnetron Sputtering," College of Engineering, University of California, Santa Barbara, date unknown.

Pan et al., "Planar Er3+-doped aluminosilicate waveguide amplifier with more than 10 dB gain across C-band," Optical Society of America, 3 pages (2000).

Peters et al., "Formation mechanism of silver nanocrystals made by ion irradiation of $Na^+$—$Ag^+$ ion-exchanged sodalime silicate glass", Nuclear Instruments and Methods in Physics Research B 168, pp. 237-244 (2000).

Rajarajan, M. et al., "Numerical Study of Spot-Zise Expanders for an Efficient OEIC to SMF Coupling," *IEEE Photonics Technology Letters*, 10(8):1082-1084, (1998).

Ramaswamy et al., "Ion-Exchanged Glass Waveguides: A Review", *Journal of Lightwave Technology*, vol. 6, No. 6, pp. 984-1001 (1988).

Roberts et al., "The Photoluminescence of Erbium-doped Silicon Monoxide," Department of Electronics and Computer Science, 7 pages (Jun. 1996).

Sanyo Vacuum Industries Co., Ltd. Products Info, $TiO_2$ (2003). http://www.sanyovac.co.jp/Englishweb/products/ETiO2.htm.

Schermer, R. et al., "Investigation of Mesa Dielectric Waveguides,", Proceedings of the OSA Integrated Photonics Research Topical Meeting and Exhibit, Paper No. IWB3 (Jun. 2001).

Schiller et al. "PVD Coating of Plastic Webs and Sheets with High Rates on Large Areas," European Materials Research Society 1999 Spring Meeting, Jun. 1-4, 1999, Strasbourg, France (1999).

Second International Symposium of Polymer Surface Modification: Relevance to Adhesion, Preliminary Program (1999).

Seventh International Conference on $TiO_2$ Photocatalysis: Fundamentals & Applications, Toronto, Ontario, Canada, Final Program (Nov. 17-21, 2002).

Sewell, P. et al., "Rib Waveguide Spot-Size Transformers: Modal Properties," *Journal of Lightwave Technology*, 17(5):848-856, (1999).

Shaw et al. "Use of Vapor Deposited Acrlate Coatings to Improve the Barrier Properties of MetallizedFilm," Society of Vacuum Coaters 505/856-7168, 37th Annual Technical Conference Proceedings, pp. 240-244 (1994).

Shin et al. "Dielectric and Electrical Properties of Sputter Grown $(Ba,Sr)TiO_3$ Thin Films," J. Appl. Phys., vol. 86, No. 1, pp. 506-513 (Jul. 1999).

Shmulovich et al., "Recent progress in Erbium-doped waveguide amplifiers," Bell Laboratories, 3 pages (1999).

Slooff et al, "Optical properties of Erbium-doped organic polydentate cage complexes", *J. Appl. Phys.* 83, pp. 497-503 (Jan. 1998).

Smith, R.E., "Reduced Coupling Loss Using a Tapered-Rib Adiabatic-Following Fiber Coupler," *IEEE Photonics Technology Letters*, 8(8):1052-1054 (1996).

Strohhofer, et al. "Energy transfer to $Er^{3+}$ in Ag ion-exchanged glass", FOM Institute for Atomic and Molecular Physics, 10 pages, date unknown.

Sugiyama et al., "Gas Permeation Through the Pinholes of Plastic Film Laminated with Aluminium Foil," Vuoto, vol. XXVIII, N. 1-2—Gennaio-Guigno (1999).

Tervonen, A., "Challenges and opportunities for integrated optics in optical networks," Part of the SPIE Conference in Integrated Optics Devices III, SPIE vol. 3620, pp. 2-11 (Jan. 1999).

Ting et al., "Study of planarized sputter-deposited SiO2," J. Vac. Sci. Technol., 15(3) pp. 1105-1112 (May/Jun. 1978).

Treichel et al., "The influence of pulsed magnetron sputtering on topography and crystallinity of TiO2 films on glass," *Space and Coatings Technology*, vol. 123, pp. 268-272 (2000).

Tukamoto, H. et al., "Electronic Conductivity of $LiCoO_2$ and Its Enhancement by Magnesium Doping," J. Electrochem. Soc., vol. 44, No. 9, pp. 3164-3168 (Sep. 1997).

Van Dover, R.B. "Amorphous Lanthanide-Doped $TiO_x$ Dielectric Films," Appl. Phys. Lett., vol. 74, No. 20, pp. 3041-3043 (May 1999).

Viljanen et al, "Planar Optical Coupling Elements for Multimode Fibers with Two-Step Ion Migration Process", Applied Physics, 24, No. 1, pp. 61-63 (Jan. 1981).

Villegas et al, "Optical spectroscopy of a soda lime glass exchanged with silver", Physics and Chemistry of Glasses 37(6), pp. 248-253 (1996).

Von Rottkay et al. "Influence of stoichiometry on electrochromic cerium-titanium oxide compounds," Lawrence Berkeley National Laboratory, UC Berkeley, CA, date unknown.

Westlinder et al. "Simulation and Dielectric Characterization of Reactive dc Magnetron Cosputtered $(Ta_2O_5)_{1-x}(TiO_2)_x$ Thin Films," J. Vac. Sci. Technol. B, vol. 20, No. 3, pp. 855-861 (May/Jun. 2002).

Wilkes, Kenneth T. "Gas Permeation Through Vacuum Barrier Films and its Effect on VIP Thermal Performance," Vacuum Insulation Panel Symp., Baltimore, Maryland, (May 3, 1999).

Yanagawa, H. et al., "Index-and-Dimensional Taper and Its Application to Photonic Devices," *Journal of Lightwave Technology*, 10(5):587-591 (1992).

Yoshikawa, K. et al., "Spray formed aluminium alloys for sputtering targets," *Power Metallurgy*, vol. 43, No. 3 (2000).

Zhang, Hongmei et al. "High Dielectric Strength, High k $TiO_2$ Films by Pulsed DC, Reactive Sputter Deposition," (2001).

Office Action issued on Sep. 27, 2004 in U.S. Appl. No. 10/291,179.
Response to Office Action filed Mar. 14, 2005 in U.S. Appl. No. 10/291,179.
Office Action issued on Jun. 15, 2005 in U.S. Appl. No. 10/291,179.
Office Action issued on May 2, 2002 in U.S. Patent No. 6,533,907.
Response to Office Action filed Sep. 3, 2002 in U.S. Patent No. 6,533,907.
Office Action issued on Feb. 12, 2004 in U.S. Appl. No. 09/903,081.
Response to Office Action filed Aug. 10, 2004 in U.S. Appl. No. 09/903,081.
Office Action issued on Sep. 10, 2004 in U.S. Appl. No. 09/903,081.
Office Action issued on Feb. 12, 2004 in U.S. Appl. No. 09/903,081.
Amendment/RCE filed Aug. 10, 2004 in U.S. Appl. No. 09/903,081.
Office Action issued on Sep. 10, 2004 in U.S. Appl. No. 09/903,081.
Office Action issued on Mar. 17, 2005 in U.S. Appl. No. 09/903,081.
Response to Office Action filed Jun. 17, 2005 in U.S. Appl. No. 09/903,081.
Office Action issued on Jul. 8, 2005 in U.S. Appl. No. 09/903,081.
Office Action issued on May 14, 2003 in U.S. Appl. No. 10/101,492.
Response to Office Action filed Aug. 14, 2003 in U.S. Appl. No. 10/101,492.
Office Action issued on Sep. 3, 2003 in U.S. Appl. No. 10/101,492.
Response to Office Action filed Mar. 3, 2004 in U.S. Appl. No. 10/101,492.
Office Action issued on Feb. 24, 2004 in U.S. Appl. No. 10/101,863.
Response to Office Action filed Jul. 23, 2004 in U.S. Appl. No. 10/101,863.
Office Action issued on Oct. 6, 2004 in U.S. Appl. No. 10/101,863.
Office Action dated Jan. 13, 2005, received in U.S. Appl. No. 10/101,863.
Response to office Action filed Jun. 10, 2005 in U.S. Appl. No. 10/101,863.
Office Action issued on Aug. 4, 2005, in U.S. Appl. No. 10/101,863.
Office Action dated Mar. 25, 2005, received in U.S. Appl. No. 10/954,182.
Office Action issued on Oct. 22, 2003 in U.S. Appl. No. 10/101,341.
Response to Office Action filed Feb. 23, 2004 in U.S. Appl. No. 10/101,341.
Office Action issued on Jun. 10, 2004 in U.S. Appl. No. 10/101,341.
Response to Office Action filed Dec. 8, 2004 in U.S. Appl. No. 10/101,341.
Office Action issued on May 4, 2004 in U.S. Appl. No. 10/101,493.
International Search Report issued on Nov. 21, 2003 in PCT/US03/24809.
Office Action issued on Mar. 14, 2005 in U.S. Appl. No. 10/789,953.
International Search Report issued on Oct. 11, 2004 in PCT/US2004/005531.
Written Opinion issued on Oct. 11, 2004 in PCT/US2004/005531.
Office Action issued Mar. 24, 2005 in U.S. Appl. No. 10/851,542.
Pct international Search Report of Application No. PCT/US2004/014524 dated Mar. 2, 2005.
PCT International Search Report of Application No. PCT/US2004/014523 dated Jan. 17, 2005.

Agrawal, G.P., in: Fiber-Optic Communication Systems, 2nd Edition, John Wiley & Sons, New York, pp. 361-399 and 415 (1997).

Cocorullo, G. et al., "Amorphous silicon waveguides and light modulators for integrated photonics realized by low-temperature plasma-enhanced chemical-vapor deposition," Optics Lett. 21(24):2002-2004 (1996).

Masuda, H. & Kawai, S., "Wide-band and gain-flattened hybrid fiber amplifier consisting of an EDFA and a multiwavelength pumped raman amplifier," IEEE Photonics Technology Lett. 11(6):647-649 (1999).

Snoeks, E. et al., "Cooperative upconversion in erbium-implanted soda-lime silicate glass optical waveguides," J. Opt. Soc. Am. B 12(8):1468-1474 (1995).

Response to Office Action filed Oct. 17, 2005 in U.S. Appl. No. 10/291,179.

Final Office Action issued on Dec. 14, 2005 in U.S. Appl. No. 10/291,179.

Response to Final Office Action filed Apr. 14, 2006, in U.S. Appl. No. 10/291,179.

Office Action mailed Apr. 27, 2006, in U.S. Appl. No. 10/291,179.

Response to Office Action filed Jul. 27, 2006, in U.S. Appl. No. 10/291,179.

Final Office Action dated Oct. 12, 2006, in U.S. Appl. No. 10/291,179.

Response to Final Office Action mailed Nov. 3, 2006, in U.S. Appl. No. 10/291,179.

Office Action issued Nov. 28, 2001, for US Patent No. 6,506,289.

Response to Office Action filed Feb. 20, 2002, for US Patent No. 6,506,289.

Office Action issued Apr. 17, 2002, for US Patent No. 6,506,289.

Response to Office Action filed Jul. 17, 2002, for US Patent No. 6,506,289.

Notice of Allowance mailed Aug. 6, 2002, for US Patent No. 6,506,289.

Ex parte Quayle Action mailed Nov. 10, 2003 for US Patent No. 6,827,826.

Notice of Allowance mailed Mar. 25, 2004 for US Patent No. 6,827,826.

PCT Invitation to Pay Additional Fees for PCT/US01/22750, dated Mar. 13, 2002.

PCT International Search Report for PCT/US01/22750, dated Jul. 19, 2002.

PCT Written Opinion for PCT/US01/22750, dated Jul. 23, 2002.

PCT International Preliminary Examination Report for PCT/US01/22750, dated Oct. 8, 2002.

Notice of Allowance issued on Oct. 8, 2002, in U.S. Patent No. 6,533,907.

Amendment/RCE filed Mar. 10, 2005 in U.S. Appl. No. 09/903,081.

Office Action issued on Nov. 28, 2005 in U.S. Appl. No. 09/903,081.

Response to Office Action filed Feb. 28, 2006 in U.S. Appl. No. 09/903,081.

Final Office Action mailed May 8, 2006 in U.S. Appl. No. 09/903,081.

Amendment dated Oct. 19, 2006, in U.S. Appl. No. 09/903,081.

Notice of Allowance issued on Oct. 21, 2004, in U.S. Appl. No. 10/101,492.

Response to Office Action filed Feb. 17, 2006 in U.S. Appl. No. 11/100,856.

Final Office Action mailed Jun. 9, 2006 in U.S. Appl. No. 11/100,856.

Response to Office Action filed Sep. 11, 2006 in U.S. Appl. No. 11/100,856.

Response to Office Action filed Dec. 5, 2005, in U.S. Appl. No. 10/101,863.

Final Office Action issued on Feb. 14, 2006, in U.S. Appl. No. 10/101,863.

Response to Office Action filed Feb. 24, 2006, in U.S. Appl. No. 10/101,863.

Office Action mailed Mar. 22, 2006, in U.S. Appl. No. 10/101,863.

Response to Office Action filed Jun. 12, 2006, in U.S. Appl. No. 10/101,863.

Office Action mailed Sep. 6, 2006, in U.S. Appl. No. 10/101,863.

Response to Office Action filed Jul. 25, 2005 in U.S. Appl. No. 10/954,182.

Response to Office Action filed Dec. 21, 2005 in U.S. Appl. No. 10/954,182.

Office Action issued on Mar. 9, 2006, in U.S. Appl. No. 10/954,182.

Response to Office Action filed Aug. 9, 2006 in U.S. Appl. No. 10/954,182.

Office Action dated Oct. 31, 2006, in U.S. Appl. No. 10/954,182.

Response to Office Action filed Jan. 3, 2006 in U.S. Appl. No. 10/650,461.

Office Action issued on Mar. 23, 2006, in U.S. Appl. No. 10/650,461.

Response to Office Action filed Jul. 24, 2006, in U.S. Appl. No. 10/650,461.

Final Office Action mailed Oct. 19, 2006, in U.S. Appl. No. 10/650,461.

Voluntary Amendment filed Jul. 26, 2006 in TW Appl. No. 92123625.

International Preliminary Examination Report mailed on Apr. 15, 2004 in PCT/US03/24809.

Office Action issued on Dec. 2, 2005 in U.S. Appl. No. 10/789,953.

Response to Office Action filed Mar. 2, 2006 in U.S. Appl. No. 10/789,953.

Final Office Action issued on May 19, 2006 in U.S. Appl. No. 10/789,953.

Response to Final Office Action filed Aug. 3, 2006, in U.S. Appl. No. 10/789,953.

Notice of Allowance mailed Oct. 23, 2006, in U.S. Appl. No. 10/789,953.

Office Action dated Oct. 12, 2006, for U.S. Appl. No. 11/228,805.

Office Action dated Sep. 22, 2006 from Korean Patent Office in Appl. No. 10-2005-7016055.

Office Action from Singapore Patent Office in Appl. No. 200505388-9, dated Mar. 20, 2006.

Response to Office Action from Singapore Patent Office in Appl. No. 200505388-9, dated Aug. 11, 2006.

Response to Office Action dated Jul. 25, 2005 in U.S. Appl. No. 10/851,542.

Office Action issued on Oct. 19, 2005 in U.S. Appl. No. 10/851,542.

Response to Office Action filed Jan. 19, 2006 in U.S. Appl. No. 10/851,542.

Office Action mailed Apr. 19, 2006 in U.S. Appl. No. 10/851,542.

Response to Office Action filed Jul. 26, 2006 in U.S. Appl. No. 10/851,542.

Final Office Action dated Oct. 26, 2006, in U.S. Appl. No. 10/851,542.

PCT International Preliminary Report on Patentability for Application No. PCT/US2004/014524, dated Dec. 8, 2005.

PCT International Search Report and Written Opinion for Application No. PCT/US2004/014523 dated Jan. 17, 2005.

PCT International Preliminary Report on Patentability for Application No. PCT/US2004/014523, dated Dec. 8, 2005.

Notice of Allowance dated Mar. 4, 2008, in U.S. Appl. No. 10/291,179.

Response to Communication filed Feb. 25, 2008, in U.S. Appl. No. 11/100,856.

Office Action dated Apr. 28, 2008, in U.S. Appl. No. 11/100,864.

Response to Office Action filed Apr. 16, 2008, in U.S. Appl. No. 10/650,461.

Office Action dated Feb. 26, 2008, in U.S. Appl. No. 11/218,652.

PCT International Search Report and Written Opinion for Application No. PCT/US06/33315 mailed Feb. 28, 2008.

| Material (Er/Yb/Al/Si) | Expected index (Post anneal) | Actual index (Post anneal) | Process Conditions (Annealed 725c 30min) |
|---|---|---|---|
| 0.8/0.8/41.4/57 | 1.506 | 1.510 | 6KW, Ar-60, O2-28sccm, 120Khz, 2.2us, 60mm T-W Space, 4-5mm T-M Space, 0-400W Bias |
| 1.6/0.5/49/48.9 | 1.526 | 1.528 | 6KW, Ar-60, O2-28sccm, 120Khz, 2.2us, 60mm T-W Space, 4-5mm T-M Space, 0-400W Bias |
| 0/0/8/92 | 1.452 | 1.456-1.459 | 4.5KW, Ar-30-60, O2-28-44, 120-200Khz, 2.2us, 60-85mm T-W Space, 4-5mm T-M Space, 0-400W Bias |
| 0/0/40/60 | 1.504 | 1.486-1.501 | 3.0-4.5KW, Ar-30, O2-44, 75-200Khz, 2.2-3.0us, 60-85mm T-W Space, 4-5mm T-M Space, 0-400W Bias |
| 0/0/50/50 | 1.520 | 1.491-1.503 | 4.0-5KW, Ar-30, O2-44, 75-200Khz, 2.2-3.0us, 60-85mm T-W Space, 4-5mm T-M Space, 0-400W Bias |
| 0/0/65/35 | 1.544 | 1.545-1.560 | 4.5-5.5KW, Ar-75-90, O285-100, 200Khz, 2.2us, 85mm T-W Space, 4-5mm T-M Space, 0-400W Bias |
| 0/0/30/70 | 1.490 | 1.562 (high Fe content) | 5.0KW, Ar-75, O2-100, 200Khz, 2.2us, 85mm T-W Space, 4-5mm T-M Space, 0-400W Bias |
| 1.5/0/48.5/50 | 1.523 | 1.509-1.513 | 6KW, Ar-60, O2-28sccm, 120Khz, 2.2us, 60mm T-W Space, 4-5mm T-M Space, 0-400W Bias |

FIG. 9

| Bias Power (Watts) | DC Power (KW) | Pulsing Freq (KHz) | Reverse Time (μs) | Ar Flow (sccms) | O2 Flow (sccms) | Wafer Position | Target To Wafer Spacing (mm) | Refractive Index Avg (@1550nm) | Refractive Index STD (@1550nm) | Dep Rate (um/Hr) |
|---|---|---|---|---|---|---|---|---|---|---|
| 150 | 4.5 | 200 | 2.2 | 100 | 100 | 1 | 55 | 1.461508 | 0.000535 | 0.957654 |
| 150 | 4.5 | 200 | 2.2 | 100 | 100 | 2 | 55 | 1.462329 | 0.000376 | 0.962581 |
| 400 | 4.5 | 200 | 2.2 | 100 | 100 | 1 | 55 | 1.462774 | 0.000103 | 0.814007 |
| 400 | 4.5 | 200 | 2.2 | 100 | 100 | 2 | 55 | 1.463583 | 0.000095 | 0.824566 |

FIG. 10

SYMMORPHIX PVD ALUMINOSILICATE

BIASED PULSE DC REACTIVE SPUTTERING OF OXIDE FILMS

This is a division of application Ser. No. 10/101,863, filed Mar. 16, 2002, which is incorporated herein by reference.

BACKGROUND

1. Field of the Invention

The present invention relates to deposition of oxide and oxynitride films and, in particular, to deposition of oxide and oxynitride films by pulsed DC reactive sputtering.

2. Discussion of Related Art

Deposition of insulating materials and especially optical materials is technologically important in several areas including production of optical devices and production of semiconductor devices. In semiconductor devices, doped alumina silicates can be utilized as high dielectric insulators.

The increasing prevalence of fiber optic communications systems has created an unprecedented demand for devices for processing optical signals. Planar devices such as optical waveguides, couplers, splitters, and amplifiers, fabricated on planar substrates, like those commonly used for integrated circuits, and configured to receive and process signals from optical fibers are highly desirable. Such devices hold promise for integrated optical and electronic signal processing on a single semiconductor-like substance.

The basic design of planar optical waveguides and amplifiers is well known, as described, for example, in U.S. Pat. Nos. 5,119,460 and 5,563,979 to Bruce et al., U.S. Pat. No. 5,613,995 to Bhandarkar et al., U.S. Pat. No. 5,900,057 to Buchal et al., and U.S. Pat. No. 5,107,538 to Benton et al., to cite only a few. These devices, very generally, include a core region, typically bar shaped, of a certain refractive index surrounded by a cladding region of a lower refractive index. In the case of an optical amplifier, the core region includes a certain concentration of a dopant, typically a rare earth ion such as an erbium or praseodymium ion which, when pumped by a laser, fluoresces, for example, in the 1550 nm and 1300 nm wavelength ranges used for optical communication, to amplify the optical signal passing through the core.

As described, for example, in the patents by Bruce et al., Bhandarkar et al, and Buchal et al., planar optical devices may be fabricated by process sequences including forming a layer of cladding material on a substrate; forming a layer of core material on the layer of cladding mater; patterning the core layer using a photolighotgraphic mask and an etching process to form a core ridge; and covering the core ridge with an upper cladding layer.

The performance of these planar optical devices depends sensitively on the value and uniformity of the refractive index of the core region and of the cladding region, and particularly on the difference in refractive index, $\Delta n$, between the regions. Particularly for passive devices such as waveguides, couplers, and splitters, $\Delta n$ should be carefully controlled, for example to values within about 1%, and the refractive index of both core and cladding need to be highly uniform, for some applications at the fewer than parts per thousand level. In the case of doped materials forming the core region of planar optical amplifiers, it is important that the dopant be uniformly distributed so as to avoid non-radiative quenching or radiative quenching, for example by upconversion. The refractive index and other desirable properties of the core and cladding regions, such as physical and chemical uniformity, low stress, and high density, depend, of course, on the choice of materials for the devices and on the processes by which they are fabricated.

Because of their optical properties, silica and refractory oxides such as $Al_2O_3$, are good candidate materials for planar optical devices. Further, these oxides serve as suitable hosts for are earth dopants used in optical amplifiers. A common material choice is so-called low temperature glasses, doped with alkali metals, boron, or phosphorous, which have the advantage of requiring lower processing temperatures. In addition, dopants are used to modify the refractive index. Methods such as flame hydrolysis, ion exchange for introducing alkali ions in glasses, sputtering, and various chemical vapor deposition processes (CVD) have been used to form films of doped glasses. However, dopants such as phosphorous and boron are hygroscopic, and alkalis are undesirable for integration with electronic devices. Control of uniformity of doping in CVD processes can be difficult and CVD deposited films can have structural defects leading to scattering losses when used to guide light. In addition, doped low temperature glasses may require further processing after deposition. A method for eliminating bubbles in thin films of sodium-boro-silicate glass by high temperature sintering is described, for example, in the '995 patent to Bhandarkar et al.

Typically, RF sputtering has been utilized for deposition of oxide dielectric films. However, RF sputtering utilizes ceramic targets which are typically formed of multiple smaller tiles. Since the tiles can not be made very large, there may be a large problem of arcing between tiles and therefore contamination of the deposited film due to this arcing. Further, the reactors required for RF sputtering tend to be rather complicated. In particular, the engineering of low capacitance efficient RF power distribution to the cathode is difficult in RF systems. Routing of low capacitance forward and return power into a vacuum vessel of the reaction chamber often exposes the power path in such a way that diffuse plasma discharge is allowed under some conditions of impedance tuning of the matching networks.

Therefore, there is a need for new methods of depositing oxide and oxynitride films and for forming planar optical devices.

SUMMARY

In accordance with the present invention, a sputtering reactor apparatus for depositing oxide and oxynitride films is presented. Further, methods for depositing oxide and oxynitride films for optical waveguide devices are also presented. A sputtering reactor according to the present invention includes a pulsed DC power supply coupled through a filter to a target and a substrate electrode coupled to an RF power supply. A substrate mounted on the substrate electrode is therefore supplied with a bias from the RF power supply.

The target can be a metallic target made of a material to be deposited on the substrate. In some embodiments, the metallic target is formed from Al, Si and various rare-earth ions. A target with an erbium concentration, for example, can be utilized to deposit a film that can be formed into a waveguide optical amplifier.

A substrate can be any material and, in some embodiments, is a silicon wafer. In some embodiments, RF power can be supplied to the wafer. In some embodiments, the wafer and the electrode can be separated by an insulating glass.

In some embodiments, up to about 10 kW of pulsed DC power at a frequency of between about 40 kHz and 350 kHz and a reverse pulse time of up to about 5 µs is supplied to the target. The wafer can be biased with up to about several hundred watts of RF power. The temperature of the substrate can be controlled to within about 10° C. and can vary from about −50° C. to several hundred degrees C. Process gasses can be fed into the reaction chamber of the reactor apparatus. In some embodiments, the process gasses can include combinations of Ar, $N_2$, $O_2$, $C_2F_6$, $CO_2$, CO and other process gasses.

Several material properties of the deposited layer can be modified by adjusting the composition of the target, the composition and flowrate of the process gasses, the power supplied to the target and the substrate, and the temperature of the substrate. For example, the index of refraction of the deposited layer depends on deposition parameters. Further, in some embodiments stress can be relieved on the substrate by depositing a thin film of material on a back side of the wafer. Films deposited according to the present invention can be utilized to form optical waveguide devices such as multiplexers and rare-earth doped amplifiers.

These and other embodiments, along with examples of material layers deposited according to the present invention, are further described below with respect to the following figures.

BRIEF DESCRIPTION OF THE FIGURES

FIG. 9 shows a graph of typical indices of refraction of material layers deposited according to the present invention.

FIG. 10 shows a table of indices of refraction for a silica layer deposited according to the present invention as a function of different process parameters.

FIG. 16A through 16D shows a TEM film deposited according to the present invention.

In the figures, elements having the same designation have the same or similar function.

DETAILED DESCRIPTION

Reactive DC magnetron sputtering of nitrides and carbides is a widely practiced technique, but the reactive dc magnetron sputtering of nonconducting oxides is done rarely. Films such as aluminum oxide are almost impossible to deposit by conventional reactive DC magnetron sputtering due to rapid formation of insulating oxide layers on the target surface. The insulating surfaces charges up and result in arcing during process. This arcing can damage the power supply, produce particles and degrade the properties of deposited oxide films.

RF sputtering of oxide films is discussed in application Ser. No. 09/903,050 (the '050 application) (now U.S. Pat. No. 6,506,289) by Demaray et al, entitled "Planar Optical Devices and Methods for Their Manufacture," assigned to the same assignee as is the present invention, herein incorporated by reference in its entirety. Further, targets that can be utilized in a reactor according to the present invention are discussed in U.S. application Ser. No. 10/101,341 (the '341 application), filed concurrently with the present disclosure, assigned to the same assignee as is the present invention, herein incorporated by reference in its entirety. A gain-flattened amplifier formed of films deposited according to the present invention are described in U.S. application Ser. No. 10/101,493 (the '493 application), filed concurrently with the present disclosure, assigned to the same assignee as is the present invention, herein incorporated by reference in its entirety. Further, a mode size converter formed with films deposited according to the present invention is described in U.S. application Ser. No. 10/101,492 (the '492 application) (now U.S. Pat. No. 6,884, 327), filed concurrently with the present disclosure, assigned to the same assignee as is the present invention, herein incorporated by reference in its entirety.

Figure 1A:
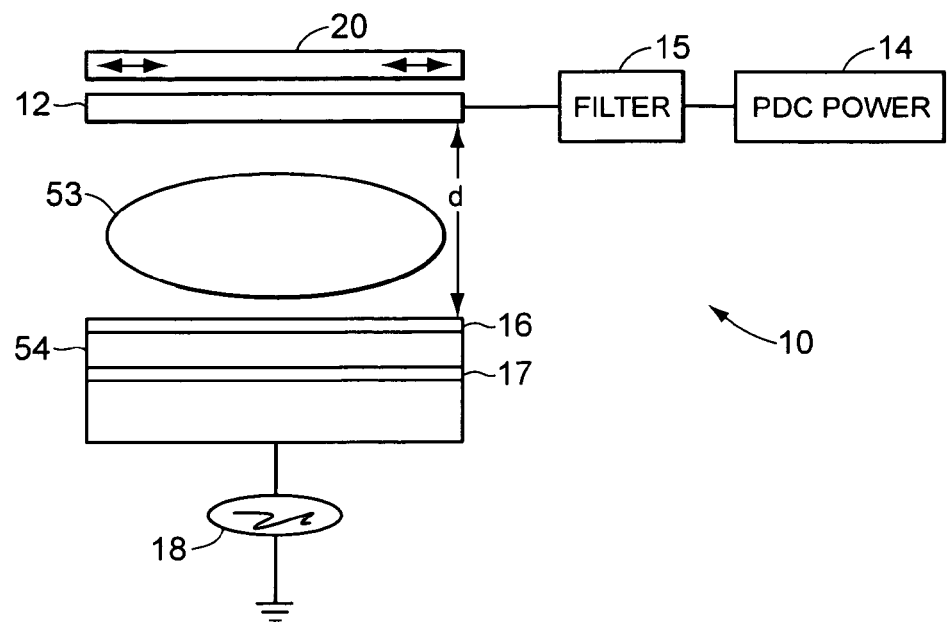
FIGS. 1A and 1B show a pulsed DC sputtering reactor according to the present invention.

FIG. 1A shows a schematic of a reactor apparatus 10 for sputtering of material from a target 12 according to the present invention. In some embodiments, apparatus 10 may, for example, be adapted from an AKT-1600 PVD (400×500 mm substrate size) system from Applied Komatsu or an AKT-4300 (600×720 mm substrate size) system from Applied Komatsu, Santa Clara, Calif. The AKT-1600 reactor, for example, has three deposition chambers connected by a vacuum transport chamber. These Komatsu reactors can be modified such that pulsed DC power is supplied to the target and RF power is supplied to the substrate during deposition of a material film.

Apparatus 10 includes a target 12 which is electrically coupled through a filter 15 to a pulsed DC power supply 14. In some embodiments, target 12 is a wide area sputter source target, which provides material to be deposited on substrate 16. Substrate 16 is positioned parallel to and opposite target 12. Target 12 functions as a cathode when power is applied to it and is equivalently termed a cathode. Application of power to target 12 creates a plasma 53. Substrate 16 is capacitively coupled to an electrode 17 through an insulator 54. Electrode 17 can be coupled to an RF power supply 18. Magnet 20 is scanned across the top of target 12.

For pulsed reactive dc magnetron sputtering, as performed by apparatus 10, the polarity of the power supplied to target 12 by power supply 14 oscillates between negative and positive potentials. During the positive period, the insulating layer on the surface of target 12 is discharged and arcing is prevented. To obtain arc free deposition, the pulsing frequency exceeds a critical frequency that depend on target material, cathode current and reverse time. High quality oxide films can be made using reactive pulse DC magnetron sputtering in apparatus 10.

Pulsed DC power supply 14 can be any pulsed DC power supply, for example an AE Pinnacle plus 10K by Advanced-Energy, Inc. With this example supply, up to 10 kW of pulsed DC power can be supplied at a frequency of between 0 and 350 KHz. The reverse voltage is 10% of the negative target voltage. Utilization of other power supplies will lead to different power characteristics, frequency characteristics and reverse voltage percentages. The reverse time on this embodiment of power supply 14 can be adjusted between 0 and 5 μs.

Filter 15 prevents the bias power from power supply 18 from coupling into pulsed DC power supply 14. In some embodiments, power supply 18 is a 2 MHz RF power supply, for example can be a Nova-25 power supply made by ENI, Colorado Springs, Colo.

Therefore, filter 15 is a 2 MHz band rejection filter. In some embodiments, the band width of the filter can be approximately 100 kHz. Filter 15, therefore, prevents the 2 MHz power from the bias to substrate 16 from damaging power supply 18.

However, both RF and pulsed DC deposited films are not fully dense and most likely have columnar structures. These columnar structures are detrimental for optical wave guide applications due to the scattering loss caused by the structure. By applying a RF bias on wafer 16 during deposition, the deposited film can be dandified by energetic ion bombardment and the columnar structure can be substantially eliminated.

In the AKT-1600 based system, for example, target 12 can have an active size of about 675.70×582.48 by 4 mm in order to deposit films on substrate 16 that have dimension about 400×500 mm. The temperature of substrate 16 can be held at between −50 C and 500 C. The distance between target 12 and substrate 16 can be between about 3 and about 9 cm. Process gas can be inserted into the chamber of apparatus 10 at a rate up to about 200 sccm while the pressure in the chamber of apparatus 10 can be held at between about 0.7 and 6 millitorr. Magnet 20 provides a magnetic field of strength between about 400 and about 600 Gauss directed in the plane of target 12 and is moved across target 12 at a rate of less than about 20-30 sec/scan. In some embodiments utilizing the AKT 1600 reactor, magnet 20 can be a race-track shaped magnet with dimension about 150 mm by 600 mm.

Figure 1B:
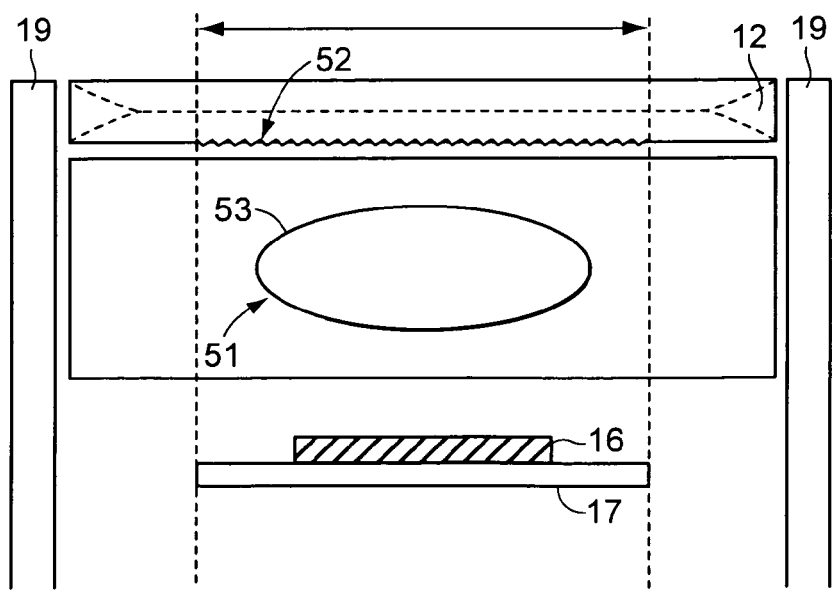
Figure 2:
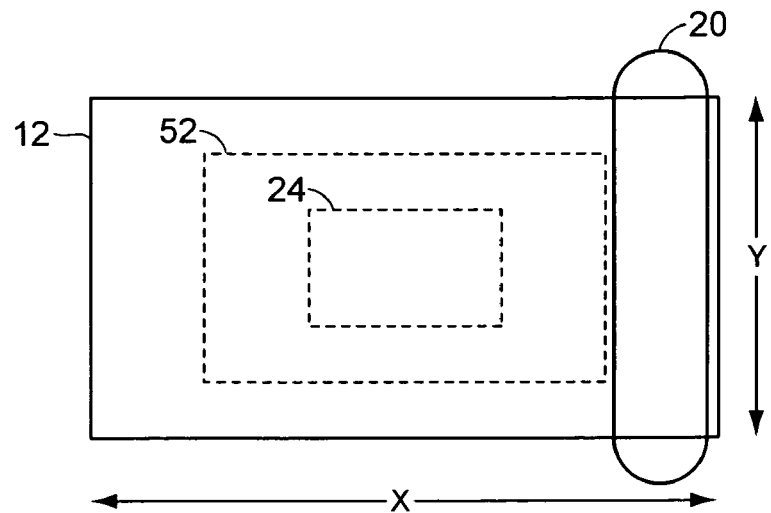
FIG. 2 shows a planar view of target utilized in a reactor as shown in FIGS. 1A and 1B.

A top down view of magnet 20 and wide area target 12 is shown in FIG. 2. A film deposited on a substrate positioned on carrier sheet 17 directly opposed to region 52 of target 12 has good thickness uniformity. Region 52 is the region shown in FIG. 1B that is exposed to a uniform plasma condition. In some implementations, carrier 17 can be coextensive with region 52. Region 24 shown in FIG. 2 indicates the area below which both physically and chemically uniform deposition can be achieved, where physical and chemical uniformity provide refractive index uniformity, for example. FIG. 2 indicates that region 52 of target 12 that provides thickness uniformity is, in general, larger than region 24 of target 12 providing thickness and chemical uniformity. In optimized processes, however, regions 52 and 24 may be coextensive.

In some embodiments, magnet 20 extends beyond area 52 in one direction, the Y direction in FIG. 2, so that scanning is necessary in only one direction, the X direction, to provide a time averaged uniform magnetic field. As shown in FIGS. 1A and 1B, magnet 20 can be scanned over the entire extent of target 12, which is larger than region 52 of uniform sputter erosion. Magnet 20 is moved in a plane parallel to the plane of target 12.

The combination of a uniform target 12 with a target area 52 larger than the area of substrate 16 can provide films of highly uniform thickness. Further, the material properties of the film deposited can be highly uniform. The conditions of sputtering at the target surface, such as the uniformity of erosion, the average temperature of the plasma at the target surface and the equilibration of the target surface with the gas phase ambient of the process are uniform over a region which is greater than or equal to the region to be coated with a uniform film thickness. In addition, the region of uniform film thickness is greater than or equal to the region of the film which is to have highly uniform optical properties such as index of refraction, density, transmission or absorptivity.

Target 12 can be formed of any materials, but is typically metallic materials such as, for example, combinations of Al and Si. Therefore, in some embodiments, target 12 includes a metallic target material formed from intermetallic compounds of optical elements such as Si, Al, Er and Yb. Additionally, target 12 can be formed, for example, from materials such as La, Yt, Ag, Au, and Eu. To form optically active films on substrate 16, target 12 can include rare-earth ions. In some embodiments of target 12 with rare earth ions, the rare earth ions can be pre-alloyed with the metallic host components to form intermetallics. See the '341 application.

In several embodiments of the invention, material tiles are formed. These tiles can be mounted on a backing plate to form a target for apparatus 10. FIG. 3A shows an embodiment of target 12 formed with individual tiles 30 mounted on a cooled backplate 25. In order to form a wide area target of an alloy target material, the consolidated material of individual tiles 30 should first be uniform to the grain size of the powder from which it is formed. It also should be formed into a structural material capable of forming and finishing to a tile shape having a surface roughness on the order of the powder size from which it is consolidated. A wide area sputter cathode target can be formed from a close packed array of smaller tiles. Target 12, therefore, may include any number of tiles 30, for example between 2 to 20 individual tiles 30. Tiles 30 are finished to a size so as to provide a margin of non-contact, tile to tile, 29 in FIG. 3A, less than about 0.010" to about 0.020" or less than half a millimeter so as to eliminate plasma processes between adjacent ones of tiles 30. The distance between tiles 30 of target 12 and the dark space anode or ground shield 19, in FIG. 1B can be somewhat larger so as to provide non contact assembly or provide for thermal expansion tolerance during process chamber conditioning or operation.

Several useful examples of target 12 that can be utilized in apparatus 10 according to the present invention include the following targets compositions: (Si/Al/Er/Yb) being about (57.0/41.4/0.8/0.8), (48.9/49/1.6/0.5), (92/8/0/0), (60/40/0/0), (50/50/0/0), (65/35/0/0), (70/30/0,0), and (50,48.5/1.5/0) cat. %, to list only a few. These targets can be referred to as the 0.8/0.8 target, the 1.6/0.5 target, the 92-8 target, the 60-40 target, the 50-50 target, the 65-35 target, the 70-30 target, and the 1.5/0 target, respectively. The 0.8/0.8, 1.6/0.5, and 1.5/0 targets can be made by pre-alloyed targets formed from an atomization and hot-isostatic pressing (HIPing) process as described in the '341 application. The remaining targets can be formed, for example, by HIPing. Targets formed from Si, Al, Er and Yb can have any composition. In some embodiments, the rare earth content can be up to 10 cat. % of the total ion content in the target. Rare earth ions are added to form active layers for amplification. Targets utilized in apparatus 10 can have any composition and can include ions other than Si, Al, Er and Yb, including: Zn, Ga, Ge, P, As, Sn, Sb, Pb, Ag, Au, and rare earths: Ge, Pr, Nd, Pm, Sm, Eu, Gd, Tb, Dy Ho, Er, Tm Yb and Lu.

Optically useful materials to be deposited onto substrate 16 include oxides, fluorides, sulfides, nitrides, phosphates, sulfates, and carbonates, as well as other wide band gap semiconductor materials. To achieve uniform deposition, target 12, itself can be chemically uniform and of uniform thickness over an extended area.

Figure 3:
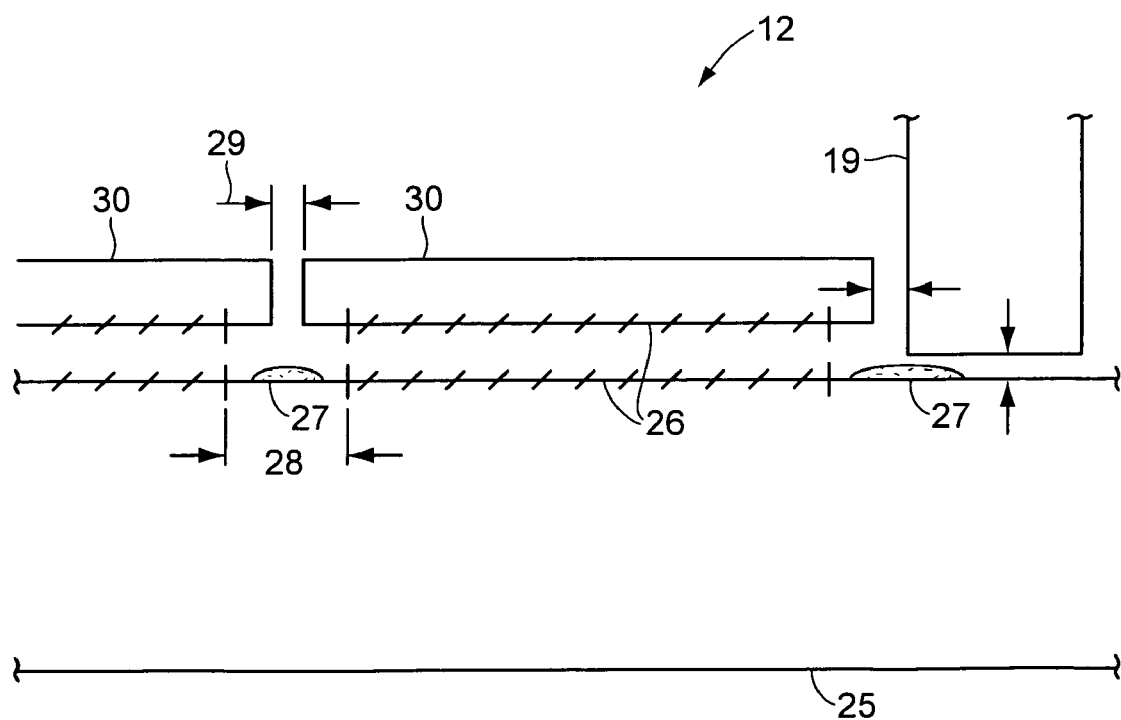
FIG. 3 shows a cross-section view of an example target utilized in a reactor as shown in FIG. 1A and 1B.

Target 12 can be a composite target fabricated from individual tiles, precisely bonded together on a backing plate with minimal separation, as is discussed further with respect to FIG. 3. In some embodiments, the mixed intermetalllics can be plasma sprayed directly onto a backing plate to form target 12. The complete target assembly can also includes structures for cooling the target, embodiments of which have been described in U.S. Pat. No. 5,565,071 to Demaray et al, and incorporated herein by reference.

Substrate 16 can be a solid, smooth surface. Typically, substrate 16 can be a silicon wafer or a silicon wafer coated with a layer of silicon oxide formed by a chemical vapor deposition process or by a thermal oxidation process. Alternatively, substrate 16 can be a glass, such as Corning 1737 (Corning Inc., Elmira, N.Y.), a glass-like material, quartz, a metal, a metal oxide, or a plastic material. Substrate 16 can be supported on a holder or carrier sheet that may be larger than substrate 16. Substrate 16 can be electrically biased by power supply 18.

In some embodiments, the area of wide area target 12 can be greater than the area on the carrier sheet on which physically and chemically uniform deposition is accomplished. Secondly, in some embodiments a central region on target 12, overlying substrate 16, can be provided with a very uniform condition of sputter erosion of the target material. Uniform target erosion is a consequence of a uniform plasma condition. In the following discussion, all mention of uniform condition of target erosion is taken to be equivalent to uniform plasma condition. Uniform target erosion is evidenced by the persistence of film uniformity throughout an extended target life. A uniformly deposited film can be defined as a film having a nonuniformity in thickness, when measured at representative points on the entire surface of a substrate wafer, of less than about 5% or 10%. Thickness nonuniformity is defined, by convention, as the difference between the minimum and maximum thickness divided by twice the average thickness. If films deposited from a target from which more than about 20% of the weight of the target has been removed continue to exhibit thickness uniformity, then the sputtering process is judged to be in a condition of uniform target erosion for all films deposited during the target life.

As shown in FIG. 1B, a uniform plasma condition can be created in the region between target 12 and substrate 16 in a region overlying substrate 16. A plasma 53 can be created in region 51, which extends under the entire target 12. A central region 52 of target 12, can experience a condition of uniform sputter erosion. As discussed further below, a layer deposited on a substrate placed anywhere below central region 52 can then be uniform in thickness and other properties (i.e., dielectric, optical index, or material concentrations).

In addition, region 52 in which deposition provides uniformity of deposited film can be larger than the area in which the deposition provides a film with uniform physical or optical properties such as chemical composition or index of refraction. In some embodiments, target 12 is substantially planar in order to provide uniformity in the film deposited on substrate 16. In practice, planarity of target 12 can mean that all portions of the target surface in region 52 are within a few millimeters of a planar surface, and can be typically within 0.5 mm of a planar surface.

Other approaches to providing a uniform condition of sputter erosion rely on creating a large uniform magnetic field or a scanning magnetic field that produces a time-averaged, uniform magnetic field. For example, rotating magnets or electromagnets can be utilized to provide wide areas of substantially uniform target erosion. For magnetically enhanced sputter deposition, a scanning magnet magnetron source can be used to provide a uniform, wide area condition of target erosion.

As illustrated in FIG. 1A, apparatus 10 can include a scanning magnet magnetron source 20 positioned above target 12. An embodiment of a scanning magnetron source used for dc sputtering of metallic films is described in U.S. Pat. No. 5,855,744 to Halsey, et. al., (hereafter '744), which is incorporated herein by reference in its entirety. The '744 patent demonstrates the improvement in thickness uniformity that is achieved by reducing local target erosion due to magnetic effects in the sputtering of a wide area rectangular target. As described in the '744 patent, by reducing the magnetic field intensity at these positions, the local target erosion was decreased and the resulting film thickness nonuniformity was improved from 8%, to 4%, over a rectangular substrate of 400×500 mm.

The process gas utilized in reactor 10 includes an inert gas, typically argon, used as the background sputtering gas. Additionally, with some embodiments of target 12, reactive components such as, for example, oxygen may be added to the sputtering gas. Other gasses such as $N_2$, $NH_3$, CO, NO, $CO_2$, halide containing gasses other gas-phase reactants can also be utilized. The deposition chamber can be operated at low pressure, often between about 0.5 millitorr and 8-10 millitorr. Typical process pressure is below about 3-5 millitorr where there are very few collisions in the gas phase, resulting in a condition of uniform "free molecular" flow. This ensures that the gas phase concentration of a gaseous component is uniform throughout the process chamber. For example, background gas flow rates in the range of up to about 200 sccm, used with a pump operated at a fixed pumping speed of about 50 liters/second, result in free molecular flow conditions.

The distance d, in FIG. 1A, between target 12 and substrate 16 can, in some embodiments, be varied between about 4 cm and about 9 cm. A typical target to substrate distance d is about 6 cm. The target to substrate distance can be chosen to optimize the thickness uniformity of the film. At large source to substrate distances the film thickness distribution is dome shaped with the thickest region of the film at the center of the substrate. At close source to substrate distance the film thickness is dish shaped with the thickest film formed at the edge of the substrate. The substrate temperature can be held constant in the range of about −40° C. to about 550° C. and can be maintained at a chosen temperature to within about 10° C. by means of preheating substrate 16 and the substrate holder prior to deposition. During the course of deposition, the heat energy impressed upon the substrate by the process can be conducted away from substrate 16 by cooling the table on which substrate 16 is positioned during the process, as known to those skilled in the art. The process is performed under conditions of uniform gas introduction, uniform pumping speed, and uniform application of power to the periphery of the target as known to skilled practitioners.

The speed at which a scanning magnet 20 can be swept over the entire target can be determined such that a layer thickness less than about 5 to 10 Å, corresponding roughly to two to four monolayers of material, is deposited on each scan. Magnet 20 can be moved at rates up to about 30 sec/one-way scan and typically is moved at a rate of about 4 sec/one-way scan. The rate at which material is deposited depends on the applied power and on the distance d, in FIG. 1A, between the target 12 and the substrate 16. For deposition of optical oxide materials, for example scanning speeds between about 2 sec/one-way scan across the target to 20-30 sec/scan provide a beneficial layer thickness. Limiting the amount of material deposited in each pass promotes chemical and physical uniformity of the deposited layer.

Substrate bias has been used previously to planarize RF sputtered deposited quartz films. A theoretical model of the mechanism by which substrate bias operates, has been put forward by Ting et al. (J. Vac. Sci. Technol. 15, 1105 (1978)). When power is applied to the substrate, a so-called plasma sheath is formed about the substrate and ions are coupled from the plasma. The sheath serves to accelerate ions from the plasma so that they bombard the film as it is deposited, sputtering the film, and forward scattering surface atoms, densifying the film and eliminating columnar structure. The effects of adding substrate bias are akin to, but more dramatic than, the effects of adding the low frequency RF component to the sputter source.

Biasing substrate 16 results in the deposited film being simultaneously deposited and etched. The net accumulation of film at any point on a surface depends on the relative rates of deposition and etching, which depend respectively, on the power applied to the target and to the substrate, and to the angle that the surface makes with the horizontal. The rate of etching is greatest for intermediate angles, on the order of 45 degrees, that is between about 30 and 60 degrees.

Powers to target 12 and substrate 16 can be adjusted such that the rates of deposition and etching are approximately the same for a range of intermediate angles. In this case, films deposited with bias sputtering have the following characteristics. At a step where a horizontal surface meets a vertical surface, the deposited film makes an intermediate angle with the horizontal. On a surface at an intermediate angle, there will be no net deposition since the deposition rate and etch rate are approximately equal. There is net deposition on a vertical surface.

Target 12 can have an active size of about 675.70×582.48 by 4 mm, for example, in a AKT-1600 based system in order to deposit films on a substrate 16 that is about 400×500 mm. The temperature of substrate 16 can be held at between −50 C and 500 C. The distance between target 12 and substrate 16 can be between 3 and 9 cm. Process gas can be inserted into the chamber of apparatus 10 at a rate of between about 30 to about 100 sccm while the pressure in the chamber of apparatus 10 can be held at below about 2 millitorr. Magnet 20 provides a magnetic field of strength between about 400 and about 600 Gauss directed in the plane of target 12 and is moved across target 12 at a rate of less than about 20-30 sec/scan.

Therefore, any given process utilizing apparatus 10 can be characterized by providing the power supplied to target 12, the power supplied to substrate 16, the temperature of substrate 16, the characteristics and constituents of the reactive gasses, the speed of the magnet, and the spacing between substrate 16 and target 12.

Sputtered oxide films according to some embodiments of the present invention can be deposited onto a Si wafer or thermal oxide wafers at pressure of between about 3 and about 6 mTorr. The ratio of $O_2$/Ar gas flow can be set at a value to ensure that target 12 is operating within a poison mode. The poison mode is defined as the ratio where the oxide is etched from the surface of target 12 as fast as the oxide layer is formed. Operating in the poison mode results in the stoichiometric film. Sub-stoichiometric oxides may not be optically transparent. The pulsing frequency range for power supply 14 can be from about up to about 250 KHz. The frequency 40 KHz is approximately the lowest frequency at which no arcing will occur during deposition in, for example, the AKT 1600 based system. The reverse pulsing time is determined by the amount of arcing generated during the process. Longer reverse time means longer discharge time and thus less arcs. However, if the reverse time is too long, the deposition rate will decrease. Power supply 18 is a 2 MHz RF power supply operated at powers up to several hundred Watts.

Figure 4:
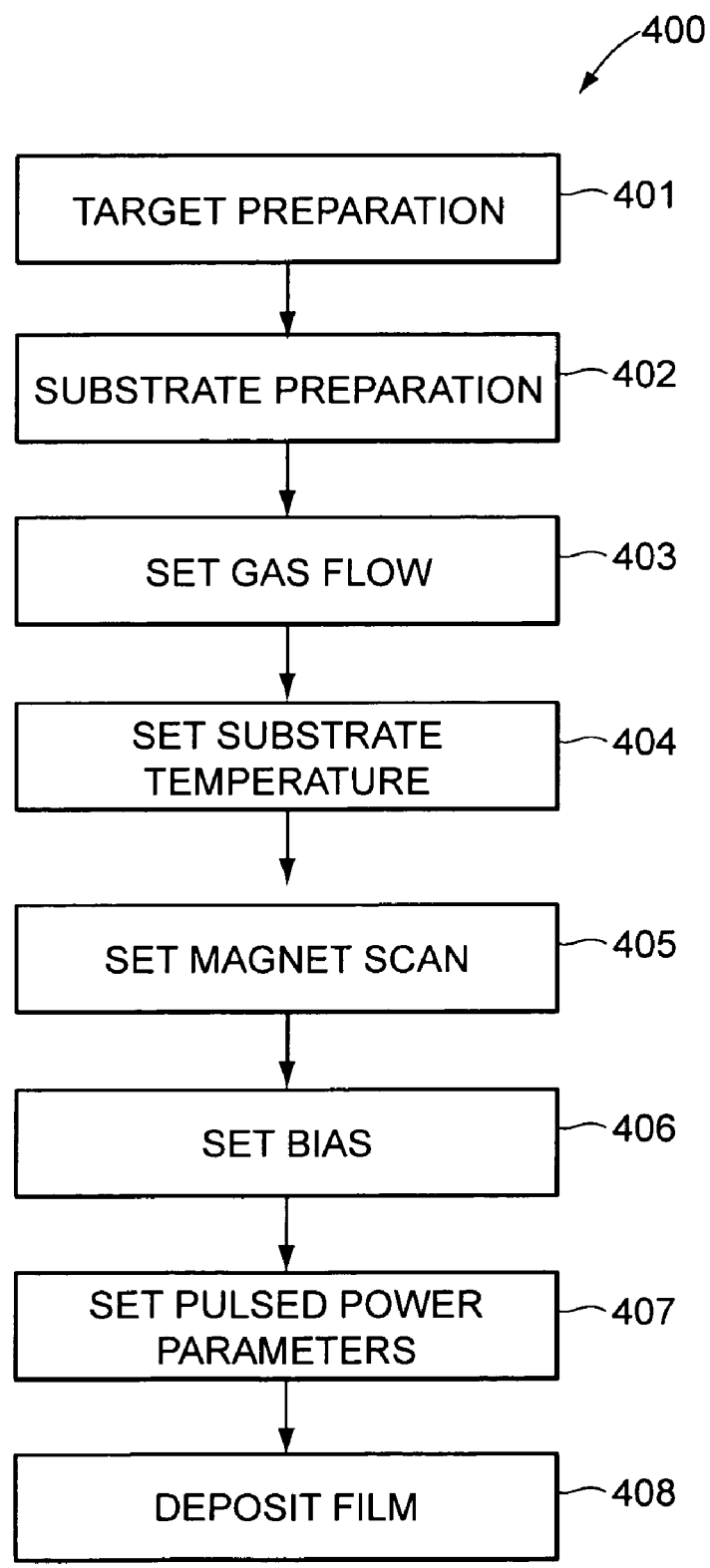
FIG. 4 shows a flow chart of an embodiment of a process for depositing a film on a substrate according to the present invention.

FIG. 4 shows an embodiment of a process procedure 400 performed on apparatus 10. In step 401, the target is prepared for the deposition. In some embodiments, target 12 can be cleaned by pure Ar sputtering. In other words, apparatus 10 is operated with pure Ar gas only (referred to as the metal mode) in order to sputter away a surface layer of target 12.

Figure 7:
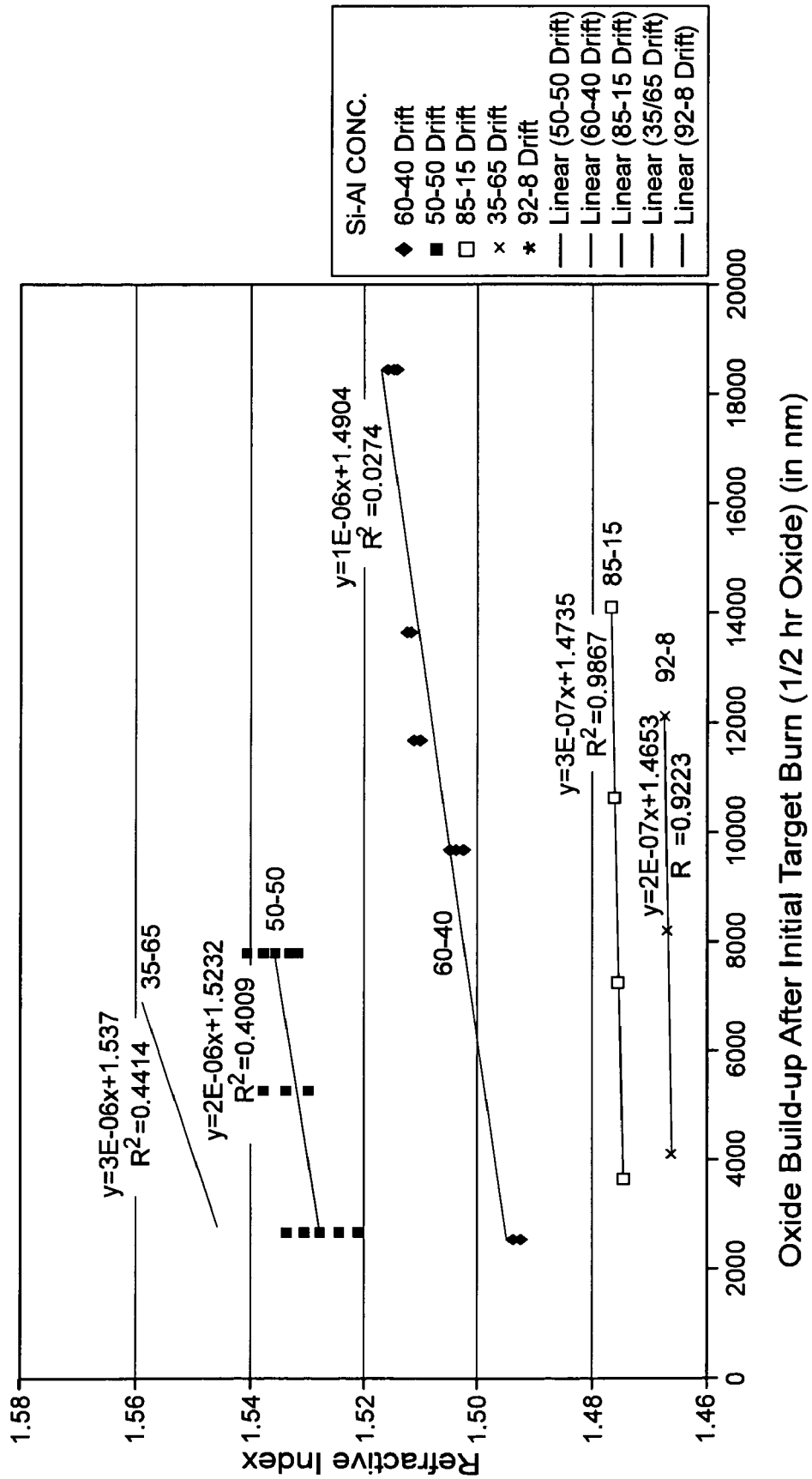
FIG. 7 shows the relationship between the index of refraction of a film as a function of deposited oxide layers according to the present invention and due to oxide build-up on the target.

FIG. 7 shows the typical drift in the index of refraction with deposition of oxide layers for several different targets over different runs for each target. In FIG. 7, the compositions of the target materials utilized in target 12 for the depositions shown are as follows: Si: 60 cat. % and Al: 40 cat. %; Si: 50 cat. % and Al: 50 cat. %; Si: 85 cat. % and Al: 15 cat. %; Si: 35 cat. % and Al: 65 cat. %; and Si: 92 cat. % and 8 cat. %. Each deposition was operated under the same process parameters: 4.5 kW of pulsed DC power at 200 kHz with a reverse time of 2.3 μs applied to target 12, $O_2$ flow at 44 sccm, Ar flow at 30 sccm introduced to apparatus 10, 100 W of bias power at 2 MHz applied to substrate 16, the temperature of substrate 16 held at 200° C., and the distance between substrate 16 and target 12 being set at 6 cm. For each target measured, the index drifted up during repeated utilization.

Figure 8:
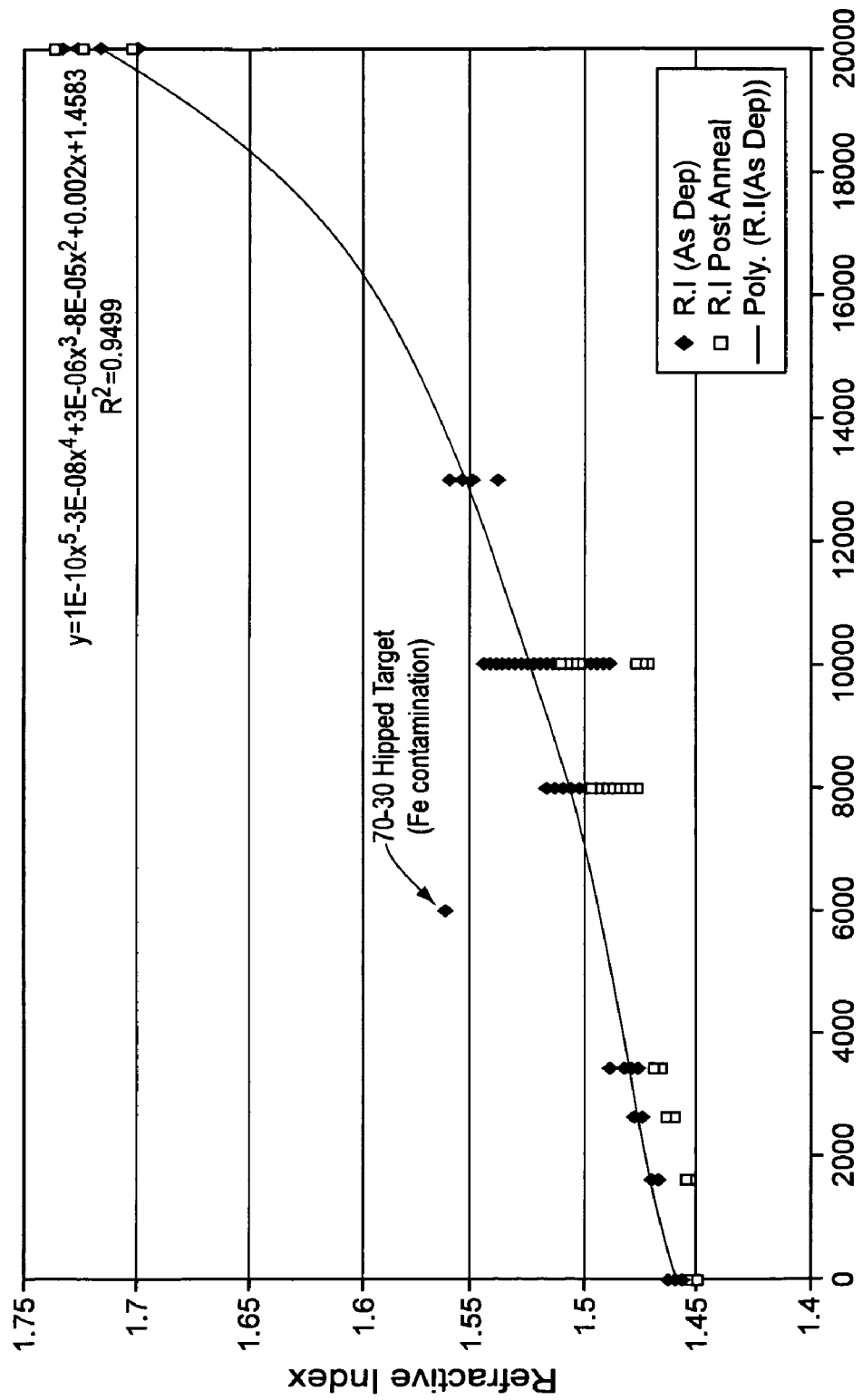
FIG. 8 shows a graph of the index of refraction of a film deposited according to the present invention as a function of the aluminum content in a composite Al/Si target.

FIG. 8 shows the relationship between the index of refraction of a film deposited according to the present invention and the amount of aluminum in the composite target. As can be seen from FIG. 8, the index of refraction of the deposited film depends strongly on the aluminum content. Therefore, as the aluminum in a metal target is depleted, the index of refraction drifts. In some embodiments, the ratio of Ar and $O_2$ utilized in the process can be maintained to provide films of uniform index over a large number of depositions on the target.

Reactive sputtering from a metal or metallic alloy target 12 can be characterized by two modes of operation. In the first mode, which is sometimes referred to as the 'metallic mode' the surface of target 12 is substantially metallic. This mode is characterized by a small addition of reactive gas to the inert gas flow of apparatus 10 as well as a higher impedance magnetron discharge. It is also characterized by incomplete oxidation of film deposited on substrate 16 and therefore higher index films. As the proportion of reactive to inert gas is increased, the sputter voltage at target 12 begins to fall at constant power.

Figure 5:
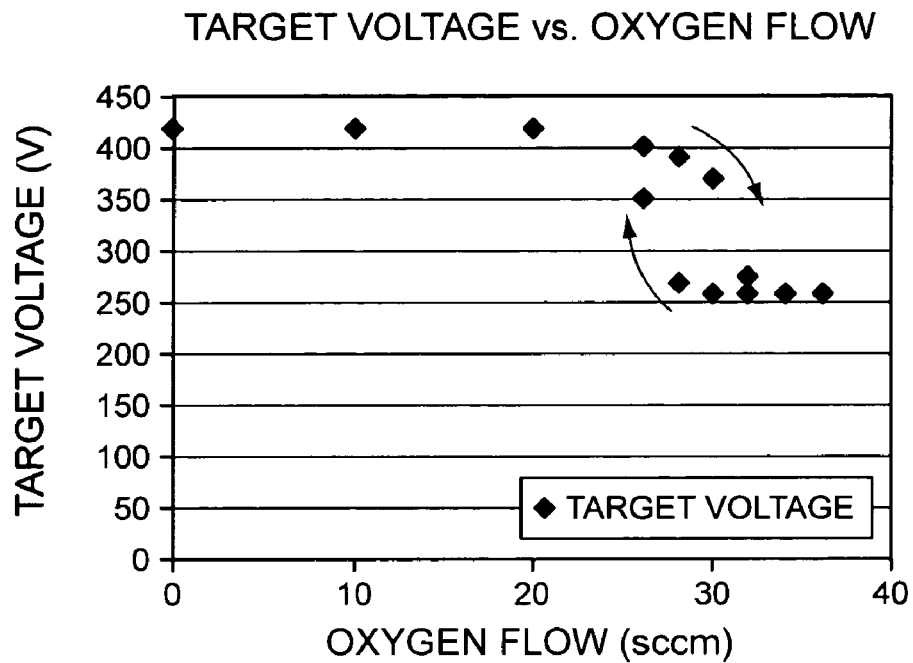
FIG. 5 shows a hysterises curve of target voltage versus oxygen flow rates for an example target in an embodiment of a reactor according to the present invention.

FIG. 5 shows the voltage on target 12 of an embodiment of apparatus 10 according to the present invention as a function of process gas constitution. In the example illustrated in FIG. 5, for example, a metallic target with composition 0.8 cat. % Er, 0.8 cat. % Yb, 57.4 cat. % Si and 41 cat. % Si, which can be formed as described in the '341 application, was sputtered in an embodiment of apparatus 10 based on the AKT-1600 PVD system with 6 kW of pulsed DC power at a frequency of 120 kHz and a reverse time of 2.3 micro seconds. The Argon gas flow was set at 60 sccm and the Oxygen gas flow was varied from zero up to 40 sccm. For more details regarding this deposition, see Example 1 below.

As shown in FIG. 5, the voltage on target 12 during deposition (the "target voltage") was constant at about 420 Volts for oxygen flow rates up to about 20 sccm. This is clearly the metallic mode of operation for this embodiment of target 12. Films deposited in this range of oxygen flow are characterized as metallic with an oxygen content that increases with oxygen flow rate during deposition. As the oxygen flow is increased up to about 26 sccm, the voltage on target 12 begins to decrease, indicating that the surface of target 12 is beginning to form an oxide layer. The oxide layer on the surface of target 12 has a higher secondary electron yield under the influence of the Argon ion flux. The additional electron flux to the magnetron electron trap increases the ion production in the plasma, which, in turn, decreases the impedance of the plasma discharge in apparatus 10.

At slightly higher oxygen flow during deposition, the oxide layer on target 12 forms a continuous layer and the voltage of target 12 during deposition falls rapidly to the range of about 190 to about 270 Volts, indicating complete coverage of the surface of target 12 with an oxide that is at least as thick as the material removed during one scan of the magnetron. Under this condition, the rate of oxide formation on the surface of target 12 equals or exceeds the rate of sputter removal of the surface of target 12 by the moving magnetron 20. This condition is sometimes referred to as the 'poisoned mode'.

Under steady state DC voltage conditions, the oxide layer on target 12 soon charges up, leading to reduced rate of sputtering and increased micro-arc discharging in apparatus 10. This discharging leads to particulation of the oxide layer on target 12, which degrades the quality of a film deposited on substrate 16. In the example shown with FIG. 5, the negative going DC Voltage is reduced at a frequency of 120 kHz to a positive value for a period of about 2.3 micro seconds per cycle, allowing charge neutralization of the surface of target 12, increasing the steady state sputter and deposition rates as well as decreasing the rate of micro-arcing.

In the case of a magnetron configuration of magnet 20 having a significant deep local target erosion (rather than a configuration of magnet 20 described above which yields uniform target erosion), the change in the target voltage of target 12 is more gradual with increasing oxygen flow since it is more difficult to establish an oxide condition at the center of an intense region of local erosion. The resulting deposited film, however, will be rich in metallic sputtered flux to the substrate in the region of higher sputter erosion, leading to non uniform stoicheometry and non-uniform indices of refraction in a film deposited on substrate 16. In the case of a scanning magnetron 20 with uniform target erosion, the change in the surface condition from metallic to poisoned is more abrupt, as the formation rate of the oxide increases to equal the sputter removal of the oxide over a wide area of the target. In this case, there is uniform distribution of sputtered oxide from the target. Uniform stoicheometry and uniform indices of refraction result for the film deposited on substrate 16.

FIG. 8 shows the range of indices of refraction of films deposited for targets of differing silica and alumina compositions, as deposited and after a subsequent anneal step. In the case of a pure silicon target, the as-deposited index of refraction can be as high as 3.4 for pure amorphous silicon. In FIG. 8, pure silica films (zero Al %) can be deposited with a reactive pulsed DC and substrate bias deposition according to the present invention with substantially complete oxygen stoicheometry, so as to approximate monolithic amorphous silica. The index of refraction of such films decreases with a subsequent heat treatment of between about 700-900° C., indicating somewhat more complete oxidation reaction of the material of the film together with some degree of stress relaxation of the film deposited on substrate 16.

At the opposite extreme, a pure aluminum embodiment of target 12 (100% Al) can be utilized to deposit films on substrate 16 under similar process conditions as is utilized to deposit pure silica films on substrate 16. In the case of the pure aluminum reactive deposition, the dependence of the index of refraction of the film deposited on substrate 16 on oxygen flow as well as on the frequency of the pulsed DC process can be examined. As a result, a larger range of effective index of refraction is achieved together with a reduced or zero dependence of the index on the subsequent anneal process. Six targets having differing aluminum composition were utilized to evaluate the index of refraction of sputtered films on substrate 16 of related composition. The largest change of index with the sputtering conditions is achieved for composition near the middle of the Al/Si composition range (about 50% Al and 50% Si).

FIG. 7 shows the change in film index for oxide films for several embodiments of target 12 and processes with an initial 30 minutes of Argon only sputtering, followed by continuous deposition with an oxygen flow rate sufficient for operation in the poisonous mode. Note that the rate of increase in the index of refraction of a resulting film deposited on substrate 16 with continuous poisoned mode deposition is proportional to the concentration of aluminum in the composition of target 12. This result is due to the depletion of the aluminum from the target surface during the metallic sputtering or pre-condition process. The aluminum in target 12 is preferentially sputtered over the silicon in target 12, leaving the surface of target 12 rich in silicon. At the onset of poisoned mode sputtering, the film deposited on substrate 16 is rich in silica and demonstrates a systematic and reproducible decrease in index of refraction. During continuous poisoned mode deposition, the silicon rich surface of target 12 can be sputtered away and the aluminum portion substantially returned to the bulk composition of target 12. Consequently, a metallic precondition step can be utilized to achieve a subsequent process for the deposition of a film having an increasing index of refraction under conditions of oxide/metal stoicheometry.

In step 402 of FIG. 4, substrate 16 is prepared. Substrate 16 can be mounted on carrier sheet 17 and placed in apparatus 10. In step 403, gas flow parameters are adjusted for the particular deposition to be performed. The constituency and flow rates of the process gas are fixed. In some embodiments, the ratio of Ar and $O_2$, for example, can be set and the flow rate of each gas set. Further, the combination of flow rate and vacuum system of apparatus 10 determines the pressure during deposition in apparatus 10.

In step 404, the substrate temperature is set. Substrate 16 may be brought to temperature over a period of time. In step 405, the scan characteristics of magnet 20 are fixed. In step 406, the power setting for power supply 18 is set. Finally, in step 407, the parameters of pulsed DC power supply 14 is set, including the power, frequency, and reverse pulsing time. In step 408, then, a film that depends oh the parameters of reactor apparatus 10 is deposited on substrate 16. In some embodiments, films deposited by procedure 400 are thermally annealed after deposition.

FIG. 4 illustrates an example deposition process only. Embodiments of deposition, processes according to the present invention can be performed in various different orders.

FIG. 9 shows a chart of various deposition parameters according to the present invention for various embodiments of target 12 and the indices of refraction, both before and after an anneal step, for the resulting deposited film on substrate 16. Each deposition was accomplished with an embodiment of apparatus 10 based on the AKT 1600 PVD reactor. Anneals were accomplished at 725° C. for 30 min. Specific examples of particular depositions and characteristics of the resulting films deposited on substrate 16 are further discussed below.

Figure 11:
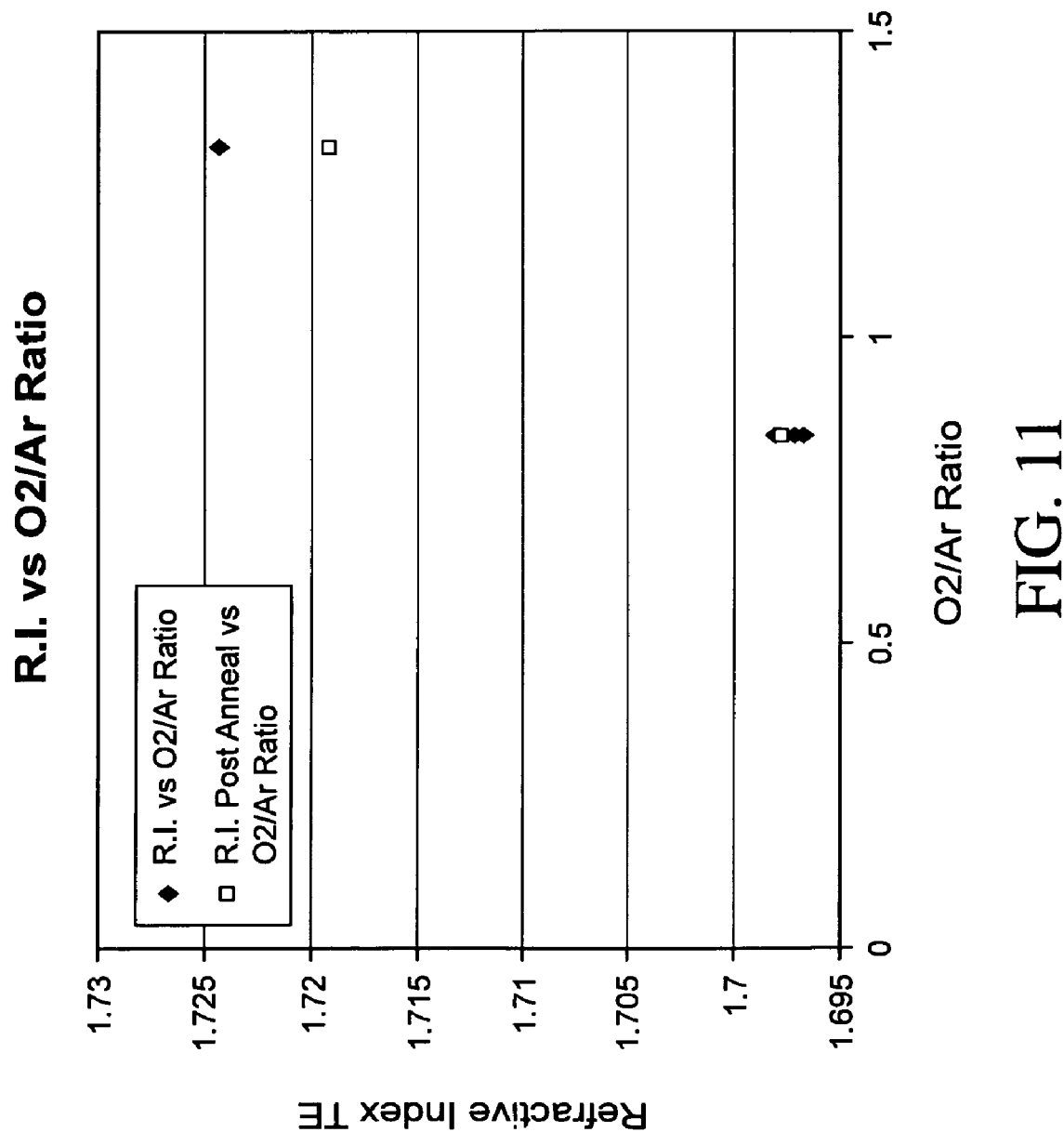
FIG. 11 shows the refractive indices as a function of $O_2$/Ar ratio utilized in an Alumina process according to the present invention.
Figure 12:
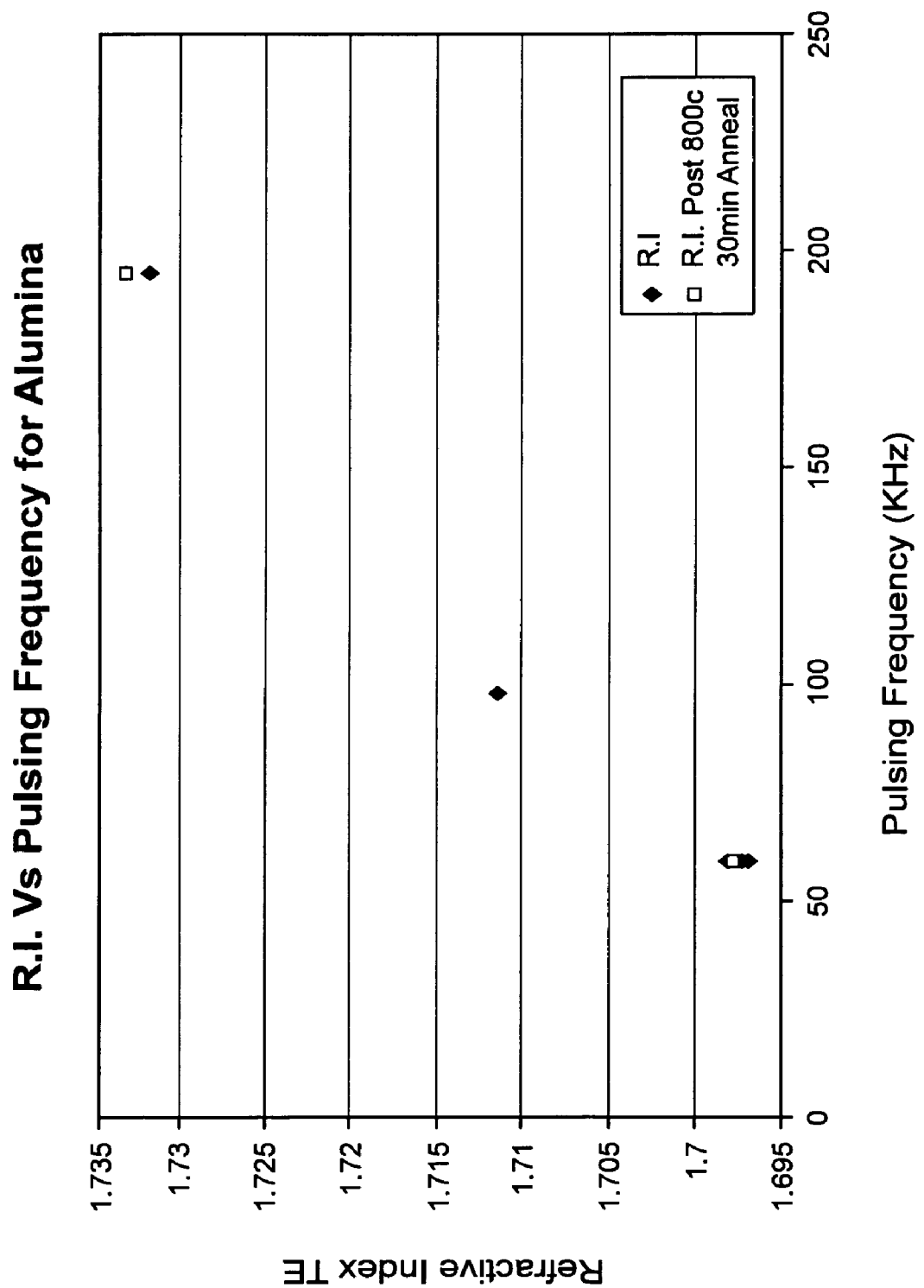
FIG. 12 shows the refractive indices as a function of DC pulsed power frequency for an Alumina layer deposited according to the present invention.

FIG. 10 shows the dependence of the index of refraction of silica layers deposited according to the present invention with process conditions. FIG. 11 shows the dependence of index of refraction on the O2/Ar flow ratio for the deposition of pure alumina according to the present invention. FIG. 12 shows the dependence of index for pure alumina films on the frequency of the pulsed DC power applied to target 12. Both parameters can be utilized to reliably control the index of refraction of films deposited on substrate 16 over a range of index values without the use of an additional cationic species, a so called 'dopant'. A third process parameter that can be utilized to adjust the index of refraction of a film deposited on substrate 16 is the bias power applied to substrate 16. Increasing the oxygen flow ratio, the frequency of the pulsed DC power applied to target 12 or the bias power applied to substrate 16 will systematically increase the index of refraction of the alumina film deposited on substrate 16. In the case of pure alumina films, minor to no change in the index occurs due to a subsequent anneal process.

Figure 13:
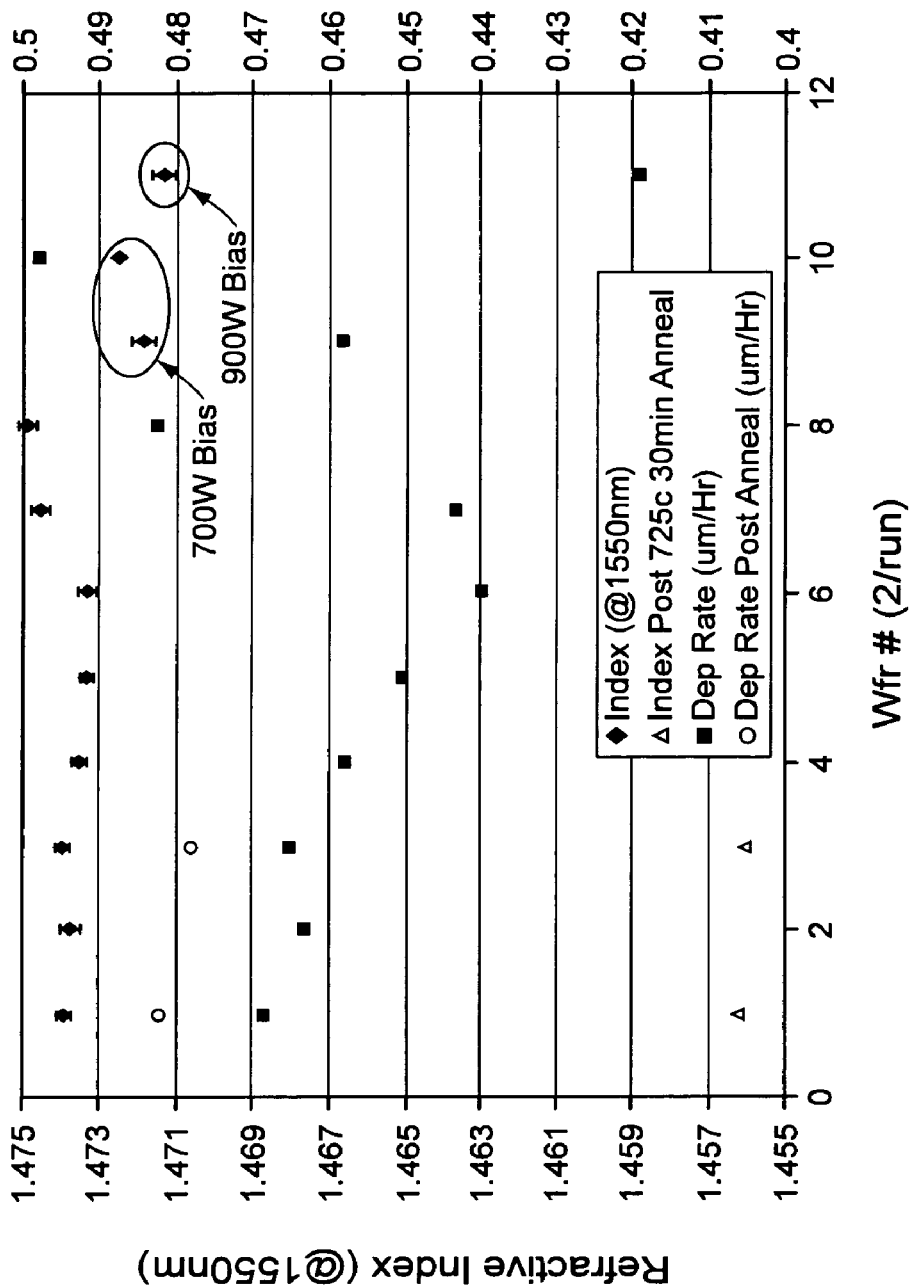
FIG. 13 shows variation in the refractive index over time during repeated depositions from a single target.

FIG. 13 shows the index of refraction of a film deposited on substrate 16 from an embodiment of target 12 with about 92 cat. % of Si and about 8 cat. % of Al for a series of sequential depositions in an embodiment of apparatus 10 based on the AKT 4300 PVD reactor, each following a metallic process condition. For constant high oxygen flow conditions, a small upward trend in the index of refraction is observed. As is generally true, the index of films deposited with higher substrate bias power is systematically lower than films deposited without substrate bias.

Figure 14:
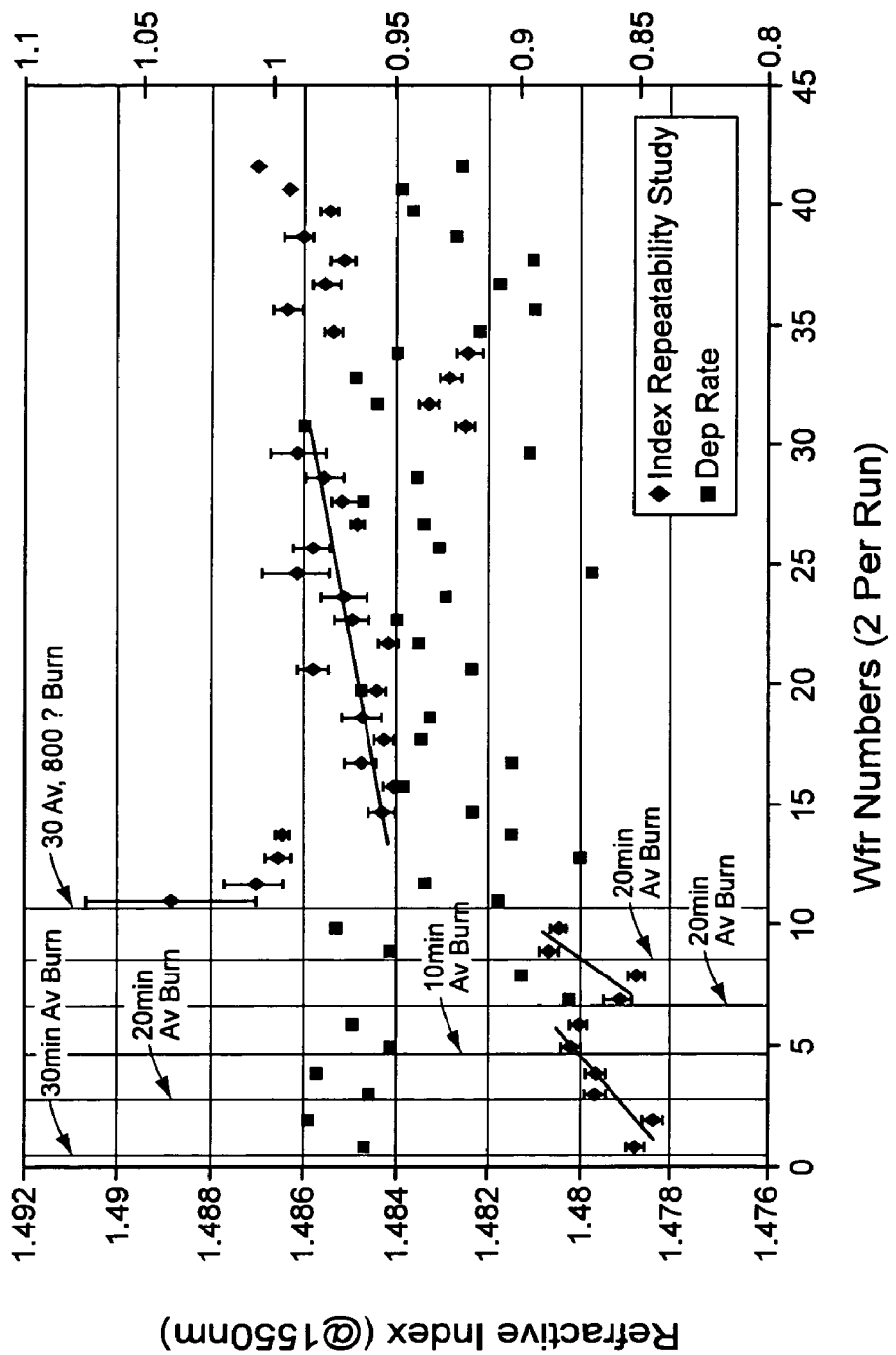
FIG. 14 shows variation in refractive index over time for repeated depositions from a target of another material layer according to the present invention.
Figure 15:
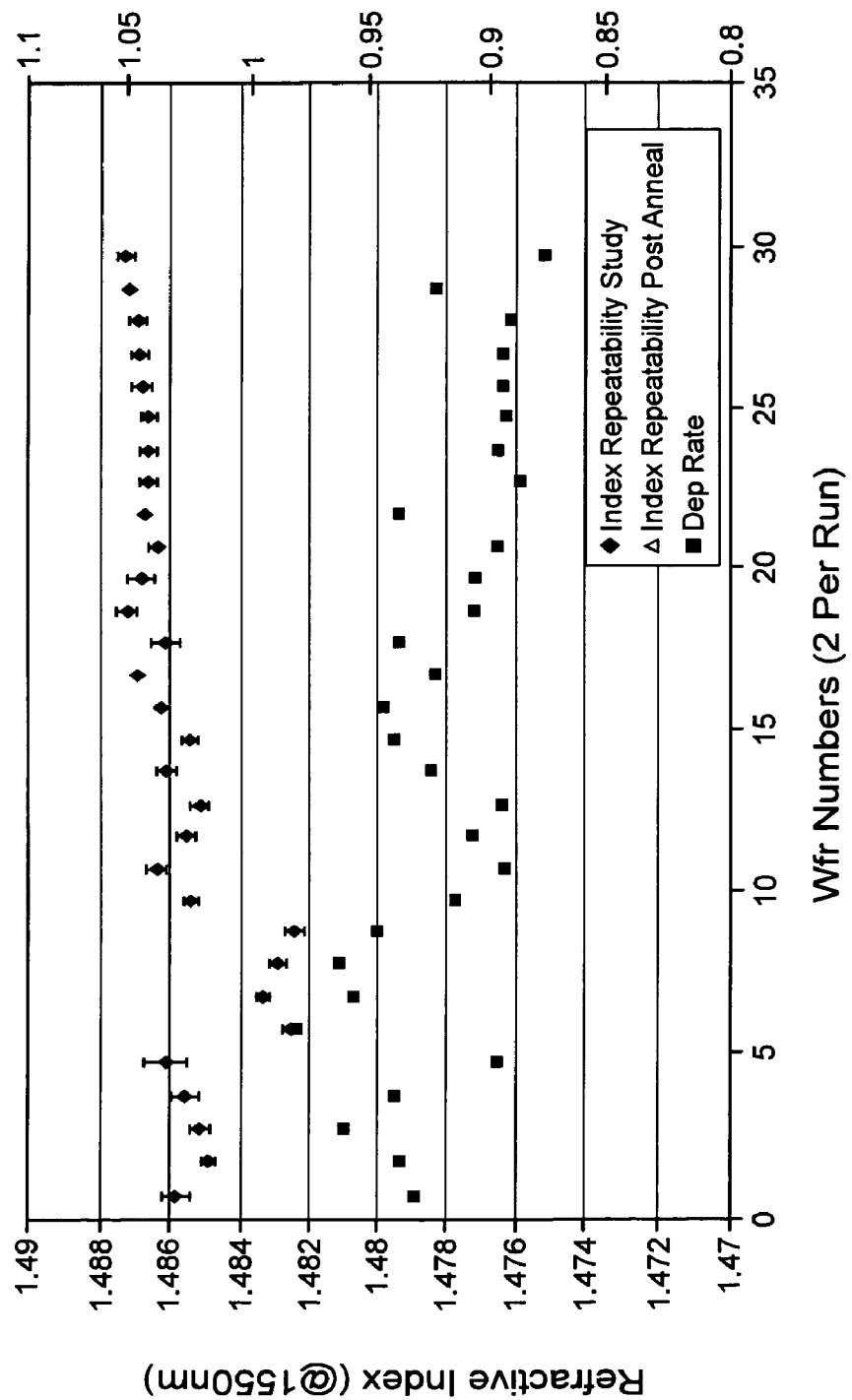
FIG. 15 shows the variation refractive index over time for repeated depositions from a target of another material layer according to the present invention.

FIG. 14 shows the upward trend of the index of refraction after metallic mode precondition of an embodiment of target 12 having composition of about 83 cat. % Si and about 17 cat. % Al for a series of depositions in an embodiment of apparatus 10 based on the AKT 1600 PVD reaction. As is shown in FIG. 14, longer metallic preconditioning of target 12 results in the index of refraction of the films deposited on substrate 16 having a higher rate of increase than for cases with less prolonged metallic preconditioning of target 12. The vertical lines on FIG. 14 indicate places where target 12 was preconditioned with only Ar for the indicated periods of time. FIG. 15 shows a decrease in the change in index for sequential films with this embodiment of target 12 deposited with reduced oxygen flow rates at a constant total pressure. A flow rate for oxygen was determined so that the run to run variation for the index of refraction of the film deposited on substrate 16 from this target was about 0.0001, (see the circled data points on the graph of FIG. 15) which is similar to the variance of the index over the entire wafer of substrate 16, which is about 70 parts per million.

Figure 16A:
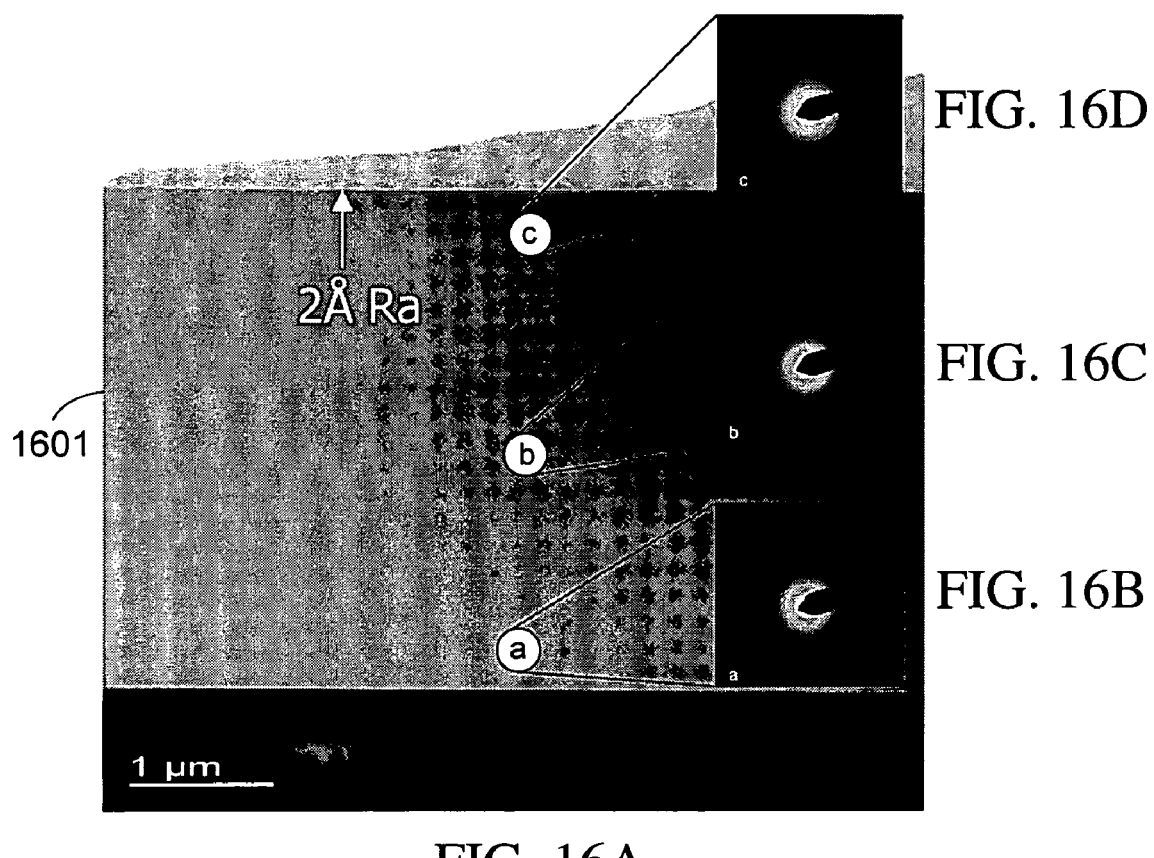

In some embodiments, films deposited by a pulsed DC biased method according to the present invention are uniformly amorphous throughout their thickness. As has been discussed above, biasing of substrate 16 leads to densification and uniformity in the deposited film. FIGS. 16A through 16D show a TEM photograph of a film 1601 deposited according to the present invention. Further, diffraction patterns shown in FIGS. 16B, 16C and 16D at points a, b and c, respectively, in deposited film 1601 show that the film is ammorphous through the thickness of the film. The diffraction patterns of FIGS. 16B, 16C and 16D show no effects of crystallization. Further, the smoothness of the surface of film 1601 indicates a defect free film. The film deposited in FIG. 16A is deposited with an 0.8/0.8 target (i.e., a target having the composition 52.0 cat. % of Si, 41.0 cat. % of Al, 0.8 cat. % of Er and 0.8 cat. % of Yb). The film is deposited at 6 kW of 120 kHz pulsed DC power with a reverse time of 2.3 µs. The Argon and Oxygen flow rates are 60 sccm and 28 sccm, respectively. Substrate 16 is biased with 100 W of power.

Figure 17:
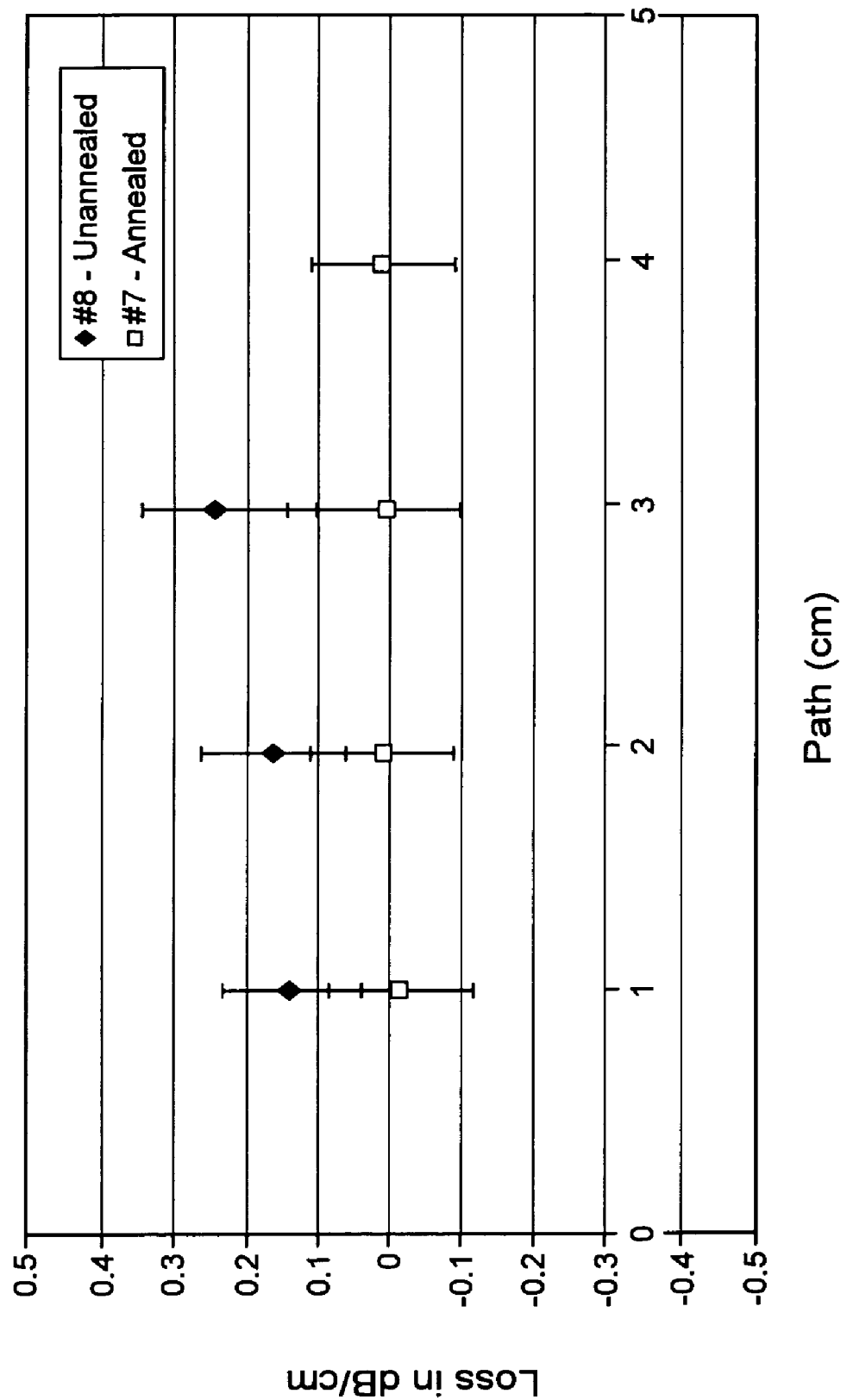
FIG. 17 shows the transparency of a film deposited according to the present invention.

FIG. 17 shows the optical loss per centimeter, measured at 1310 nm, using a three prism coupling to the so called slab mode of the film on a 10 micron oxide, silicon wafer. As deposited the biased, pulsed DC film from a 60 cat. % Si and 40 cat. % Al film demonstrated about 0.1 dB/cm loss. After an 800° C. anneal in air, the loss was less than the measurement sensitivity of the prism coupling method. This data clearly demonstrates that films deposited according to embodiments of the present invention can be used for the purpose of constructing low loss planar light wave circuits.

Deposition of films according to the present invention can be utilized to deposit cladding layers, active core layers, and passive core layers of an optical amplifier structure or optical waveguide structure. In some applications, for example multiplexer structures, the separation between adjacent waveguides can be small, for example about 8 µm. In some embodiments, the deposition parameters of the upper cladding layer can be adjusted to not only adjust the index of refraction of the layer, but also to insure that the spacing between adjacent waveguides is small.

Figure 18:
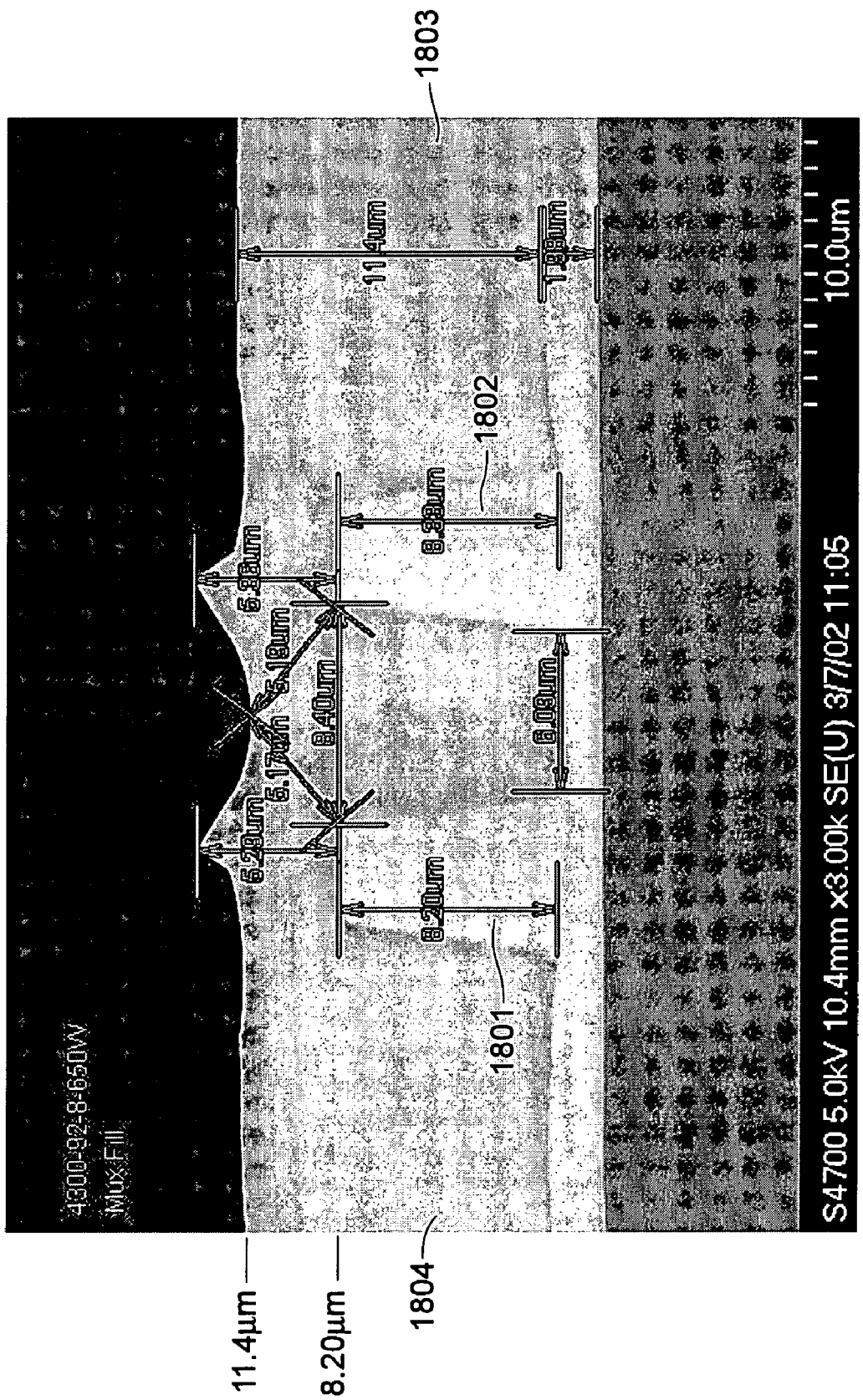
FIG. 18 shows an uppercladding layer deposited according to the present invention over a multiple-waveguide structure such that the deposited layer is substantially planarized.

FIG. 18 shows an example planarization deposition over a multiplexer structure. In the particular example of upper cladding layer 1803 shown in FIG. 18, the deposition parameters from a 92 cat. % Si and 8 cat. % Al is: 5.5 Kw of Pulsed DC power applied at 200 KHz with 2.2 µs of reverse time, gas flow of 75 sccm Ar and 100 sccm $O_2$, a substrate bias of 650 W (at 2 MHz), and a substrate temperature of 200° C. Layer 1803 was deposited with an AKT 4300 based embodiment of apparatus 10. As shown in FIG. 18, the layer thickness in areas other than over waveguide structures 1801 and 1802 is 11.4 µm. Waveguide structures 1801 and 1802 are 8.20 µm high waveguides and separated by 6.09 µm at the base and by 8.40 µm at their top. In FIG. 18, the undercladding layer 1804 is about 1.98 µm thick.

Figure 19:
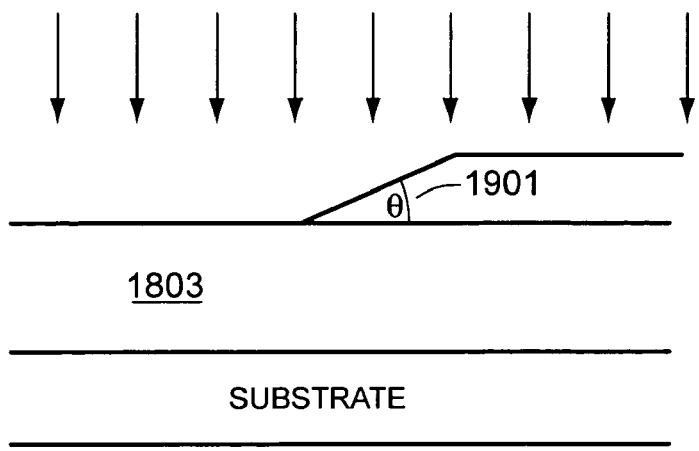
FIG. 19 illustrates the deposition of a film over a waveguide structure.
Figure 20:
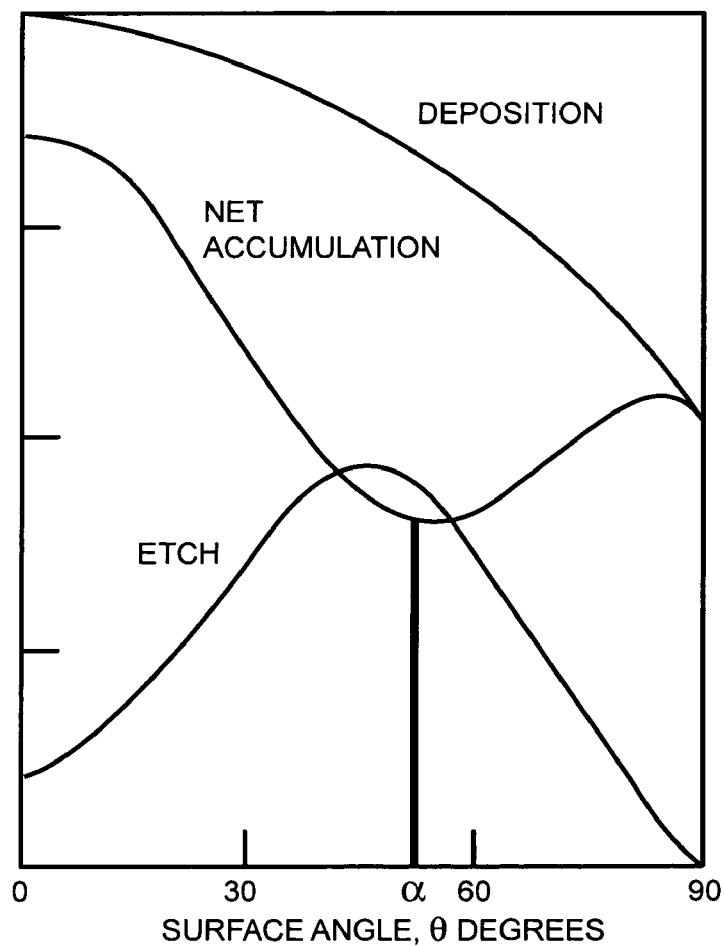
FIGS. 20 and 21 illustrate different etch and deposition rates for deposition of films as a function of the surface angle of the film.
Figure 21:
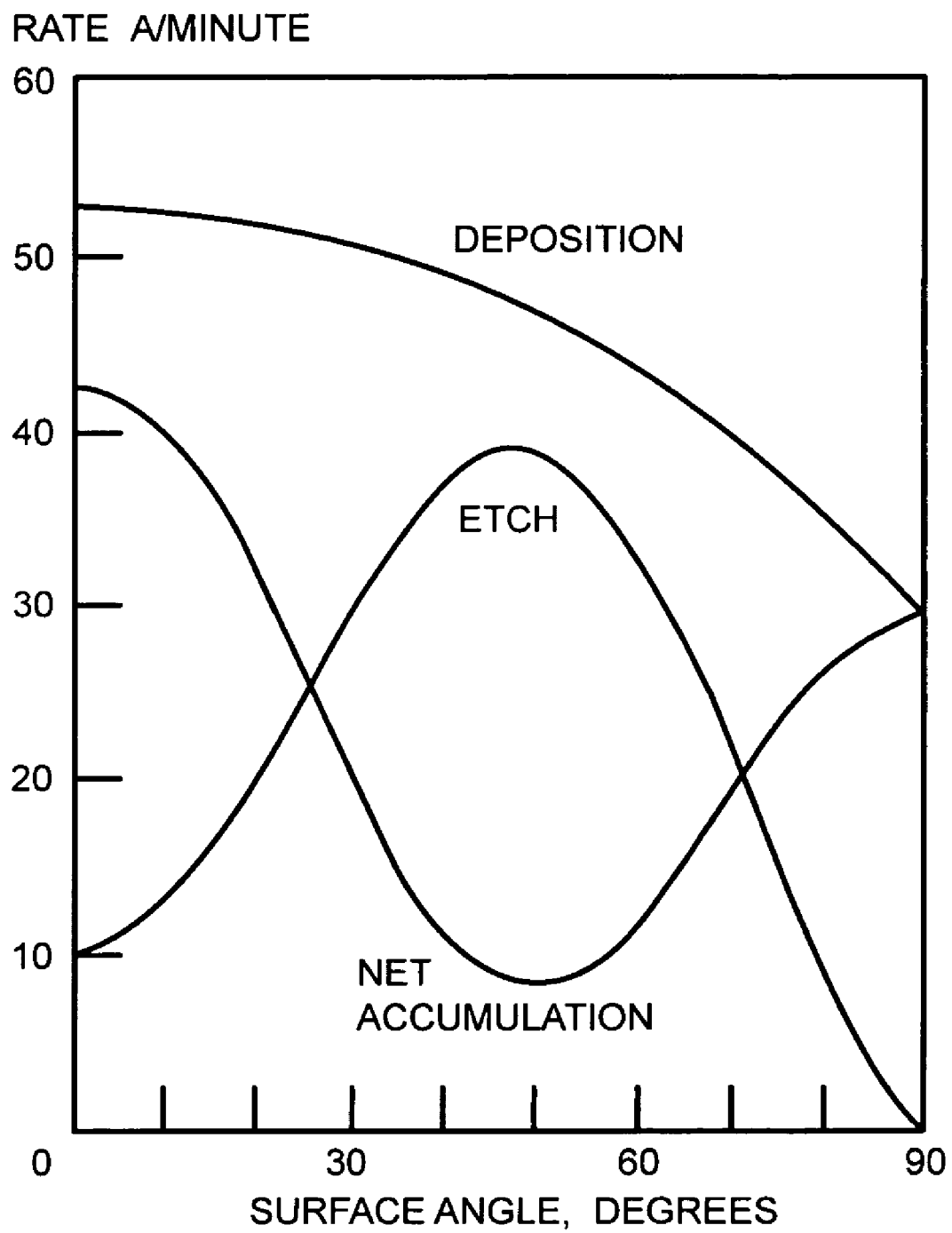

FIG. 19 illustrates deposition of material over a structure. Upper cladding layer 1803, in region 1901, will be angled from the horizontal by an angle θ. The deposition and etching rates of a deposited layer depends on the angle θ. FIGS. 20 and 21 illustrate different cases of deposition and etch rates as a function of the angle θ. The relationship between the rate of deposition and the etch rates can be adjusted by adjusting the deposition parameters. For example, the bias power to substrate 16 can be adjusted to control the relationship between the etch rates and deposition rates of material.

Figure 22:
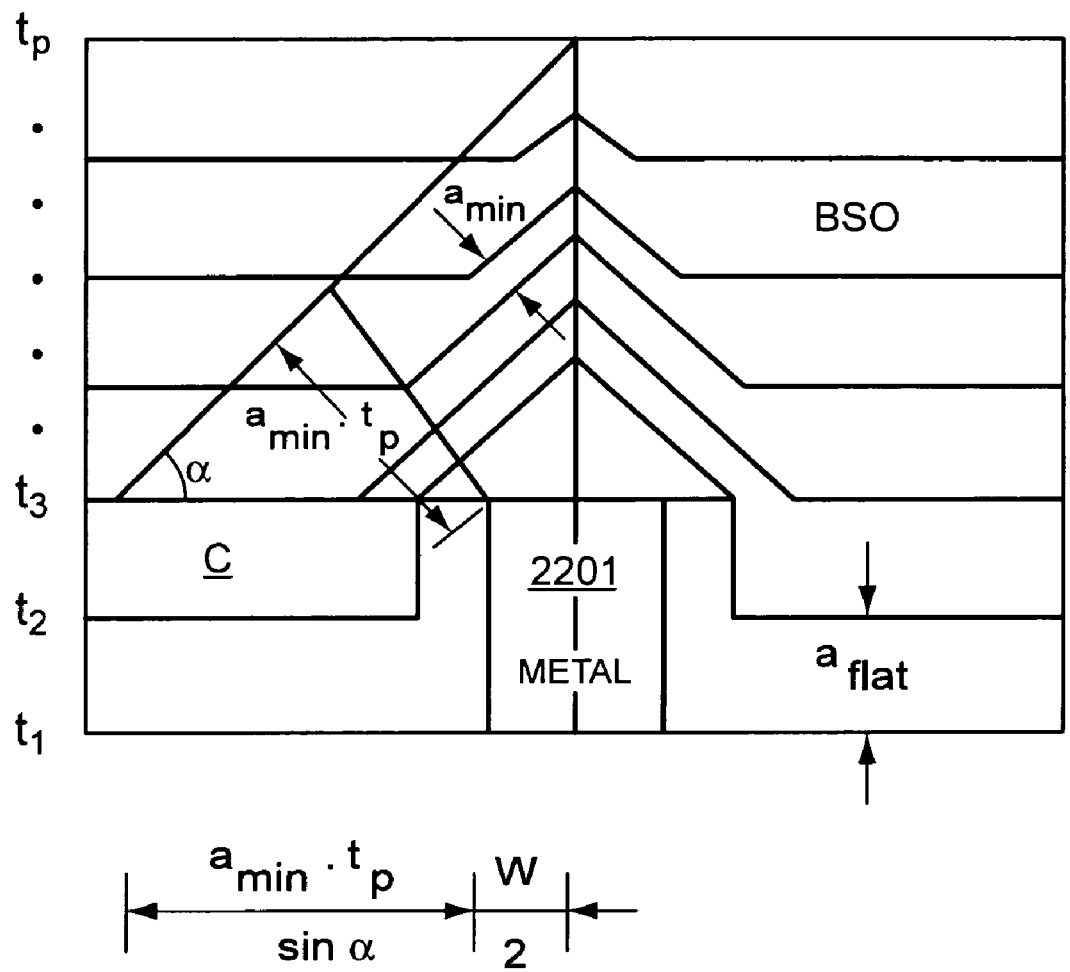
FIG. 22 illustrates calculation of the planarization time for a particular deposition process.

FIG. 22 illustrates deposition rates over a structure 2201 as a function of time. In FIG. 2201, h is the thickness deposited over structure 2201. The planarization when layer 1803 becomes flat.

The time for planarization can be estimated as $$t_p = \frac{\frac{W}{2}\tan\alpha + H}{a_{flat} - \frac{a_{min}}{\cos\alpha}},$$

where W is the width of structure 2201, H is the height of structure 2201, $a_{flat}$ refers to the accumulation rate on the flat surface, $a_{min}$ refers to the accumulation rate on the minimum accumulation slope, and α is the surface angle from the horizontal plane of the minimum accumulation slope.

Figure 23:
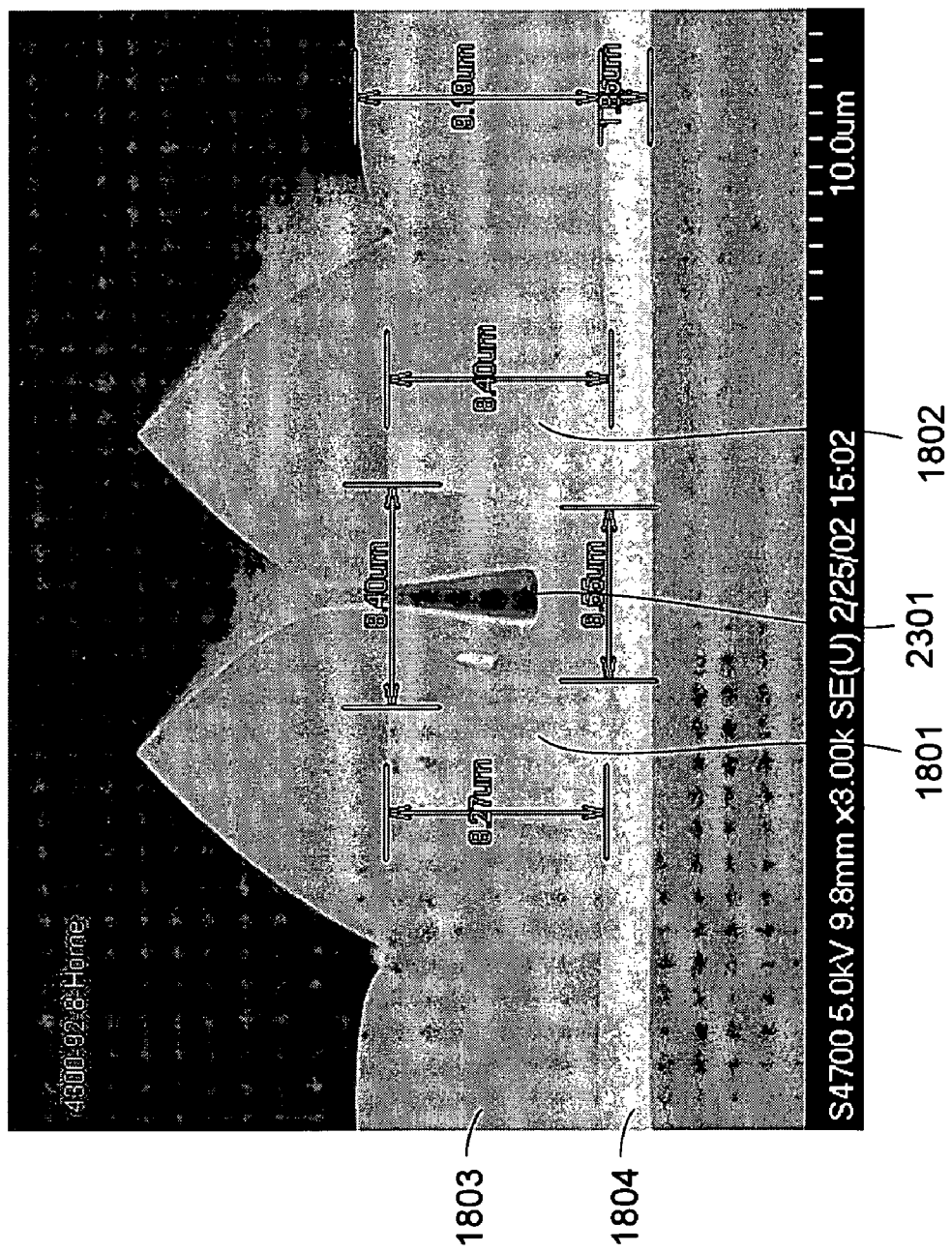
FIGS. 23 through 25 through illustrate adjustment of process parameters in order to achieve planarization of a film deposited over a waveguide structure according to the present invention.

FIG. 23 shows a deposited film 1803 as shown in FIG. 18, except that the bias power to substrate 16 is set to 400 W instead of 650 W. As can be seen in FIG. 23, a keyhole 2301 is formed with an incomplete filling of uppercladding layer 1803 between structures 1801 and 1802. Deposition of uppercladding layer 1803 substantially follows the trends illustrated in FIGS. 19 through 22.

Figure 24:
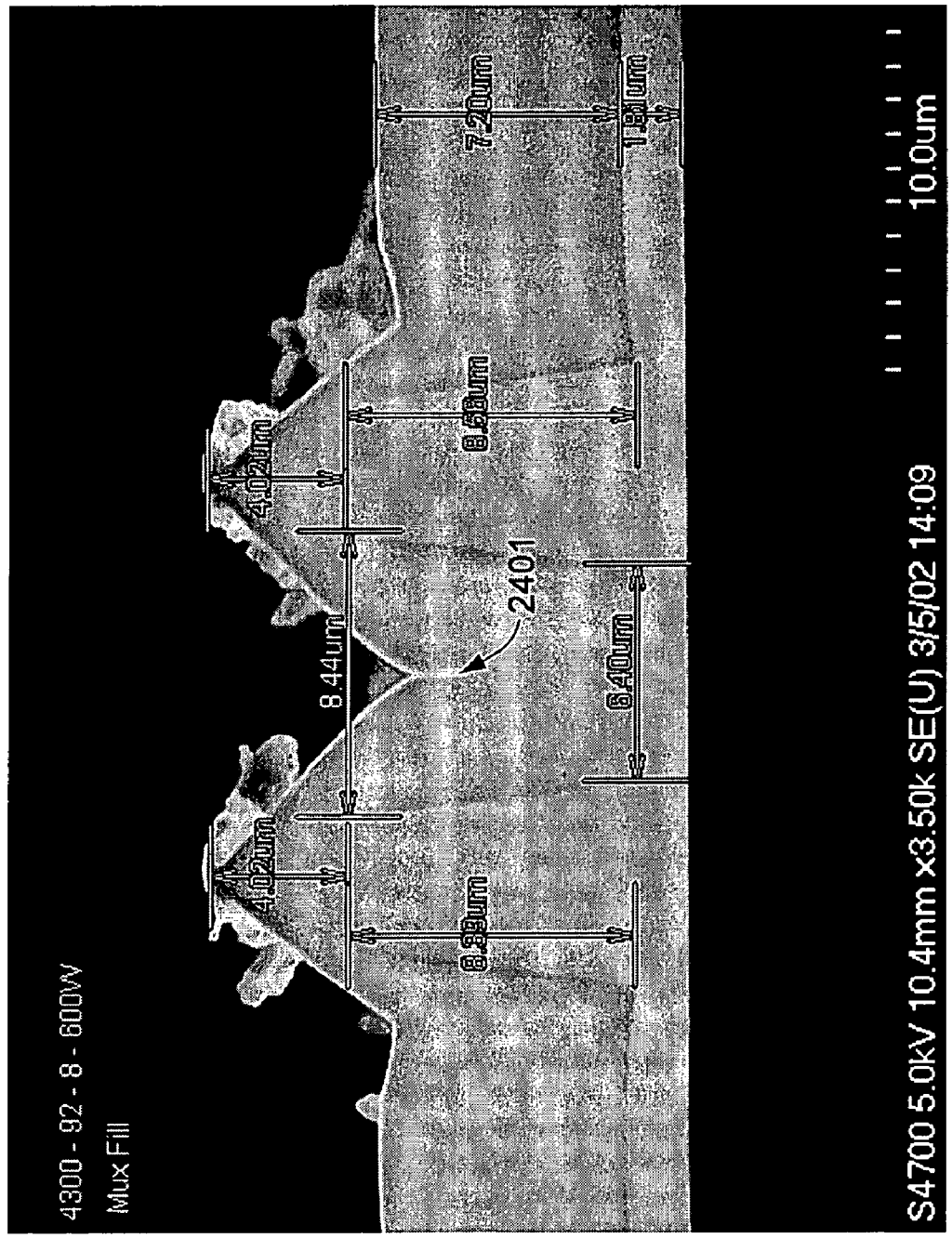
Figure 25:
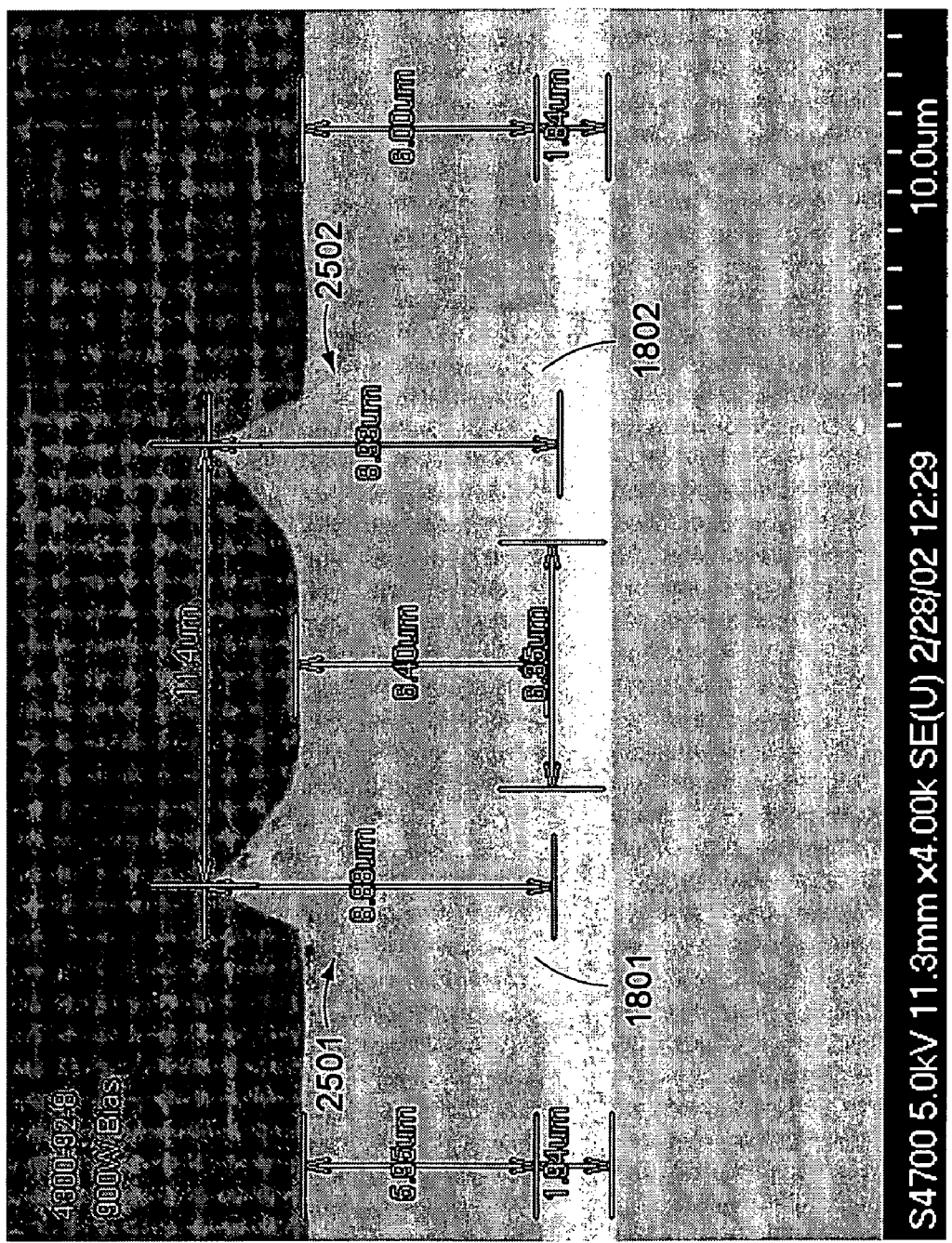

FIG. 24 shows deposition as shown in FIG. 18, except that the bias power to substrate 16 is set to 600 W instead of 650 W; As can be seen in FIG. 24, keyhole 2301 has closed leaving a small line defect 2401 in the fill.

Figure 28:
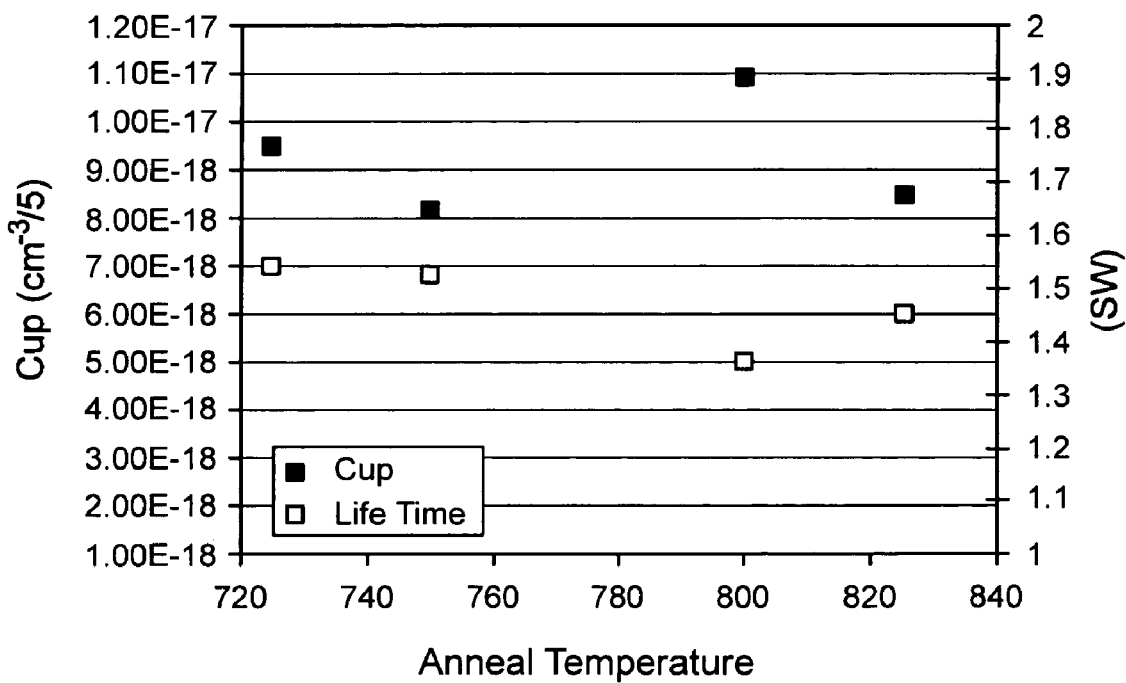
FIG. 28 shows up-conversion constants, and lifetimes of the active core layer of FIG. 27 deposited according to the present invention.

FIG. 28 shows deposition as shown in FIG. 18, except that the bias power to substrate 16 is set to 900 W instead of 650 W. As can be seen in FIG. 28, the etch rate has been increased to such an extent that the corners of structures 1801 and 1802 have been etched to form slopes 2501 and 2502, respectively.

Therefore, as illustrated in FIGS. 18 through 25, an uppercladding layer can be deposited in accordance with the present invention such that it fills the space between adjacently placed waveguides. In general, the parameters can be optimized for index control and the bias power to substrate 16 can be adjusted for fill. In some embodiments, other parameters (e.g., the constituency of process gas, frequency and power of pulsed DC power source 14, and other parameters) in order to adjust the deposition and etch rates and thereby effectively planarize the structure as described.

Therefore, depositions of various films in embodiments of apparatus 10 according to the present invention with several embodiments of target 12 and the effects on index of refraction, uniformity of films, and fill characteristics of varying several of the process parameters has been discussed above. In some embodiments, stress effects due to wafer bowing of substrate 16 can also be reduced. Wafer bowing of substrate 16 can be reduced, reducing the stress in a film deposited on substrate 16, by, for example, depositing a film on the backside of substrate 16 before deposition of a film on substrate 16. In some embodiments, a film having a similar thickness of a similar layer of material can be deposited on backside of substrate 16 prior to deposition of the film on substrate 16 according to the present invention. The wafer bowing resulting from differing thermal expansions of the film and substrate 16 is therefore countered by a similar stress from another film deposited on the backside of substrate 16.

Several specific examples film depositions utilizing apparatus 10 are discussed below. Further, examples of optical amplifiers produced utilizing the ceramic tiles according to the present invention are presented. These examples are provided for illustrative purposes only and are not intended to be limiting. Unless otherwise specified, apparatus 10 utilized in the following examples was based on the AKT 1600 reactor. Further, unless otherwise specified, the temperature of substrate 16 was held at about 200° C. and the distance between substrate 16 and target 12 was 4 s/scan. The separation between substrate 16 and target 12 is about 6 cm.

EXAMPLE 1

An AKT 1600 based reactor can be utilized to deposit a film. In this example, a wide area metallic target of dimension 550×650 mm with composition (Si/Al/Er/Yb) being about 57.0 cat. % Si, 41.4 cat. % Al, 0.8 cat. % Er, and 0.8 cat. % Yb (a "0.8/0.8" target) was fabricated as described in the '341 application.

In step 402, a 150 mm P-type silicon wafer substrate was placed in the center of a 400×500 mm glass carrier sheet 17. Power supply 14 was set to supply 6000 watts of pulse DC power at a frequency of 120 KHz with a reverse pulsing time of about 2.3 us. Magnet 20, which is a race-track shaped magnet of approximate dimension 150 mm×600 mm, was swept over the backside of the target at a rate of about 4 seconds per one-way scan. The temperature of substrate 16 was held at 200 C and 100 W of 2 MHz RF power was applied to substrate 16. The target 12 to substrate 16 distance was about 6.5 cm. The sputtering gas was a mixture of Argon and Oxygen. Substrate 16 and carrier 17 was preheated to 350° C. for at least 30 min prior to deposition. The active film was deposited in the poison mode. Deposition efficiency was approximately 1 um/hr.

FIG. 5 shows the hysteresis curve of this particular embodiment of target 12. When target 12 under goes the transition from metallic to poison mode, the target voltage drops from an average of about 420V to an average of about 260V. Before each film deposition, in step 401, target 12 is cleaned by pure Argon sputtering in the metallic mode. Then target is then conditioned in poison mode with the oxygen flow much higher than the flow required at the transition region.

Tables 1A through 1C shows some effects on the deposited films of depositions with the 0.8/0.8 target under different operating conditions. Table 1A includes photoluminescence (pumped at 532 nm) and index of refraction for films deposited on substrate 16 with different Ar/$O_2$ gas flow ratios with no bias power applied to substrate 16.

TABLE 1A

| Target Power (KW) | Ar/O2 | Frequency (KHz) | Reverse Pulsing Time (us) | Bias (W) | PL/um (532 nm) | Index |
|---|---|---|---|---|---|---|
| 6 | 30/42 | 200 | 2.3 | 0 | 1973 | 1.5142 |
| 6 | 30/36 | 200 | 2.3 | 0 | 2358 | 1.5215 |
| 6 | 60/30 | 200 | 2.3 | 0 | 3157 | 1.5229 |
| 6 | 60/28 | 200 | 2.3 | 0 | 3421 | 1.5229 |

Table 1B shows the variation in photoluminescence (pumped at 532 nm) and index of refraction of the film deposited on substrate 16 with deposition processes having with the same Ar/O$_2$ ratios but different pulsed DC power frequencies from power supply 14.

TABLE 1B

| Target Power (KW) | Ar/O2 | Frequency (KHz) | Reverse Pulsing Time (us) | Bias (W) | PL/um (532 nm) | Index |
|---|---|---|---|---|---|---|
| 3 | 60/28 | 100 | 2.3 | 100 | 1472 | 1.5146 |
| 4 | 60/28 | 75 | 3.5 | 100 | 2340 | 1.5189 |
| 6 | 60/28 | 120 | 2.3 | 100 | 5178 | 1.5220 |

Table 1C shows the photoluminescence and index as deposited where the bias power to substrate 16 is varied.

TABLE 1C

| Target Power (KW) | Ar/O2 | Frequency (KHz) | Reverse Pulsing Time (us) | Bias (W) | PL/um (532 nm) | Index |
|---|---|---|---|---|---|---|
| 6 | 60/28 | 200 | 2.3 | 0 | 3657 | 1.5230 |
| 6 | 60/28 | 200 | 2.3 | 100 | 2187 | 1.5244 |
| 6 | 60/28 | 200 | 2.3 | 200 | 3952 | 1.5229 |
| 6 | 60/28 | 200 | 2.3 | 300 | 5000 | 1.5280 |

Figure 6:
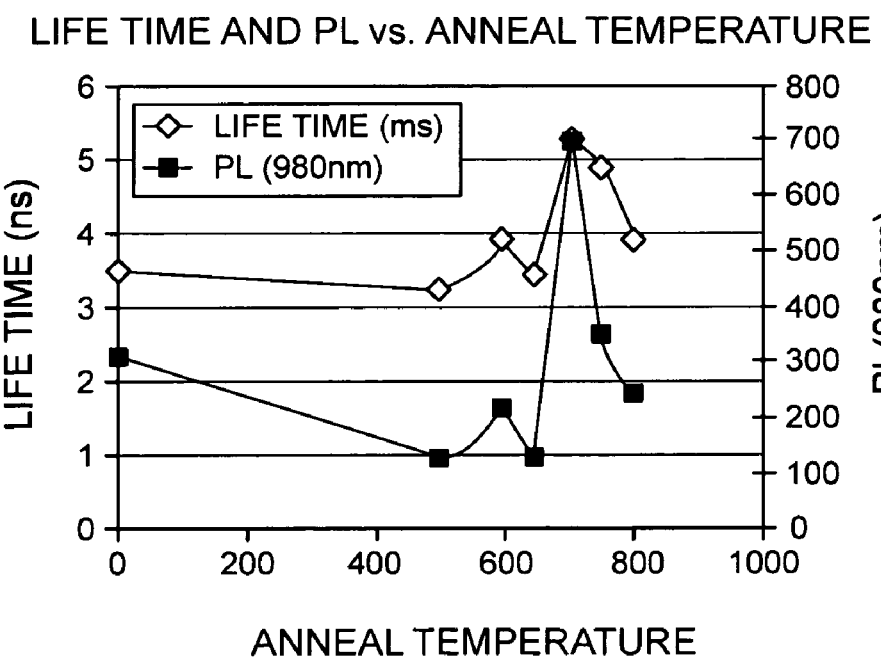
FIG. 6 shows a photo-luminescence and lifetimes of a film deposited in a process according to the present invention as a function of after deposition anneal temperature.

The photoluminescence values can be measured with a Phillips PL-100. The deposited film can be pumped with a 532 nm laser and the luminescence at 980 is measured. The index is the index of refraction. Typically, films deposited are annealed in order to activate the erbium. FIG. 6 shows the photoluminescence and lifetime versus anneal temperature for a typical film deposited as described in this example.

EXAMPLE 2

A waveguide amplifier can be deposited according to the present invention. An embodiment of target 12 having composition 57.4 cat. % Si, 41.0 cat. % Al, 0.8 cat. % Er 0.8 cat. % Yb (the "0.8/0.8 target") can be formed as disclosed in the '341 application. The Er—Yb (0.8/0.8) co-doped Alumino-Silicate film was deposited onto a 6 inch wafer of substrate 16 which includes a 10 µm thick thermal oxide substrate, which can be purchased from companies such as Silicon Quest International, Santa Clara, Calif. Target 12 was first cleaned by sputtering with Ar (80 sccm) only in the metallic mode. Target 12 was then conditioned in poison mode by flowing 60 sccm of Argon and 40 sccm of oxygen respectively. The power supplied to target 12 during conditioning was kept at about 6 kW.

An active core film was then deposited on substrate 16. The thickness of the deposited film is approximately 1.2 µm. The deposition parameters are shown in Table 2.

TABLE 2

| Target Power (KW) | Ar/O2 (sccm) | Pulsing Frequency (KHz) | Bias (W) | Reverse pulsing time (us) |
|---|---|---|---|---|
| 6 | 60/28 | 120 | 100 | 2.3 |

A straight waveguide pattern can then formed by standard photolithography techniques. The active core was etched using reactive ion etch followed by striping and cleaning. Next, a 10 µm top cladding layer is deposited using a similar deposition process according to the present invention. An embodiment of target 12 with composition 92 cat. % Si and 8 cat. % Al as shown in FIG. 9 to form the top cladding layer. The index difference between the top cladding layer and the active layer is about 3.7%. The amplifier is then annealed at 725° C. for about 30 min (see FIG. 6, for example).

The erbium excited-state lifetime and the up-conversion coefficient were measured to be 3 ms and $4.5 \times 10^{-18}$ cm$^3$/s, respectively. A net gain of about 4 dB for small signal (about −20 dBm) with fiber to waveguide and to fiber coupling was obtained. Waveguide length was 10 cm and the width was about 1.5 to 8 µm. The coupling loss between the fiber and the waveguide is 3-4 dB/facet, and passive excess loss is 0.1-0.2 dB/cm for 3 um waveguide. The waveguide was both co- and counter pumped with 150 mW 980 nm laser per facet.

EXAMPLE 3

This example describes production of a dual core Erbium/Ytterbium co-doped amplifier according to the present invention. In one example, substrate 16 is a silicon substrate with an undercladding layer of thermally oxidized SiO$_2$ of about 15 µm thick. Substrate 16 with the thermal oxide layer can be purchased from companies such as Silicon Quest International, Santa Clara, Calif. A layer of active core material is then deposited on substrate 16 with a Shadow Mask as described in the '492 application. Use of a shadow mask results in a vertical taper on each side of a finished waveguide which greatly enhances the coupling of light into and out of the waveguide.

Active core layer is deposited from a 0.8/0.8 target as described in the '247 application having composition 57.4 cat. % Si, 41.0 cat. % Al, 0.8 cat. % Er, and 0.8 cat. % Yb. The deposition parameters are identical to that of Example 2 described above. The active layer is deposited to a thickness of about 1.2 µm.

A passive layer of aluminasilicate is then deposited over the active layer. A passive layer of about 4.25 µm thickness can be deposited with an embodiment of target 12 having composition of Si/Al of about 87 cat. % Si and about 13 cat. % Al. The passive layer and active layer are then patterned by standard lithography techniques to form a core that has a width of about 5.0 µm for the active core and tapering to about 3.5 µm at the top of the passive core with an effective length of about 9.3 cm.

Upper cladding layer is then deposited from a Si/Al target of 92 cat. % Si and 8 cat. % Al. Deposition of the upper cladding layer is shown in FIG. 9. In some embodiments, the upper cladding layer can be deposited with a non-biased process. The thickness of the upper cladding layer can be about 10 µm. The amplifier formed by this process is then annealed at 725° C. for about 30 min.

The as-deposited Erbium and Ytterbium concentrations in the active layer of core 303 is $2.3 \times 10^{20}$ cm$^{-3}$ Erbium concentration and $2.3 \times 10^{20}$ cm$^{-3}$ Ytterbium concentration. The index of the core is 1.508 and the index of cladding layers are 1.4458 for undercladding layer 302 and 1.452 for uppercladding layer 304. The parameter $\Delta n/n$ is therefore about 5.0%.

Figure 26:
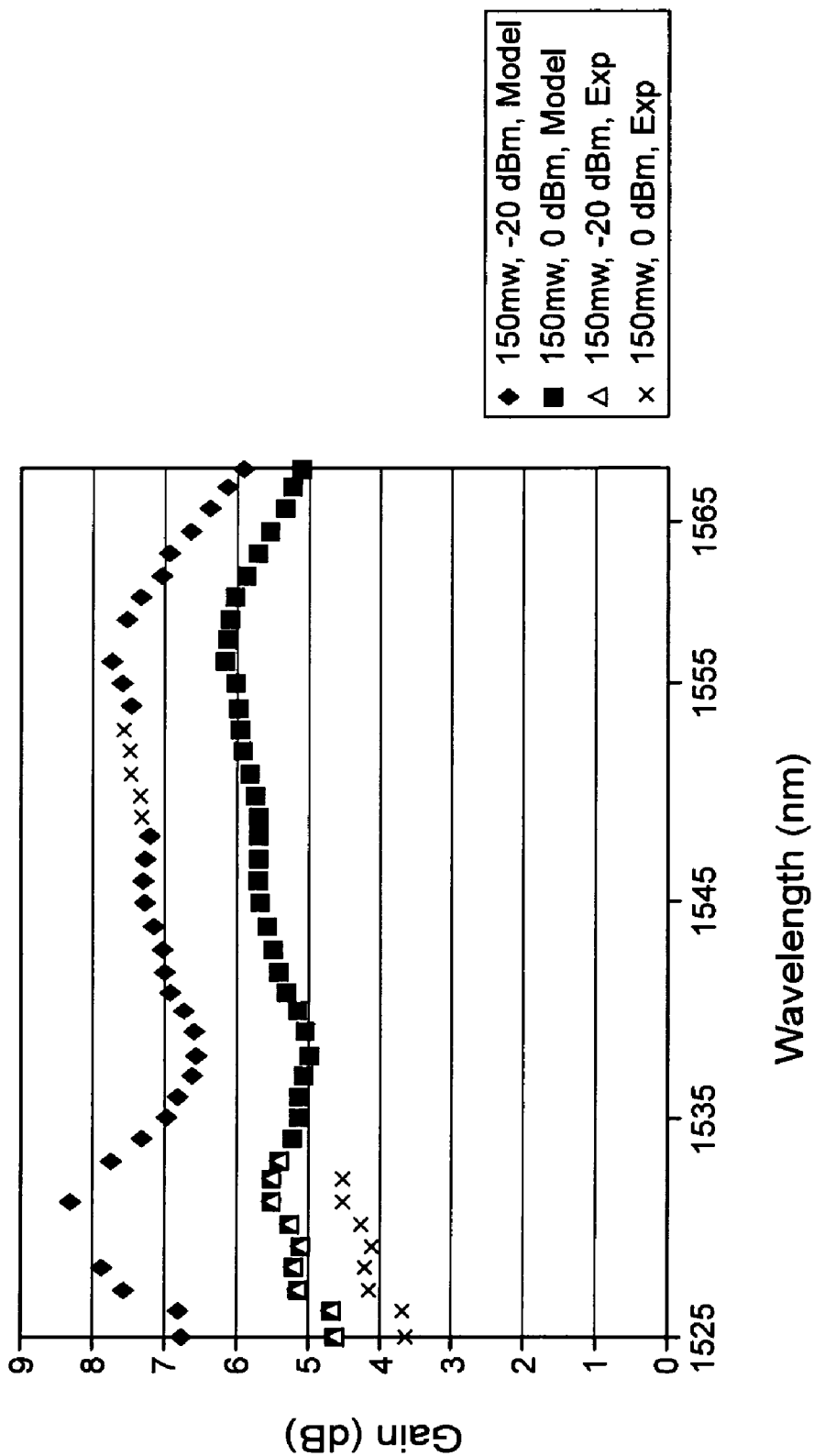
FIG. 26 shows the gain characteristics of an erbium doped waveguide amplifier formed of films depositions according to the present invention.

A reverse taper mode size converter, see the '492 application, is utilized for coupling light into waveguide amplifier 300. The insertion loss at 1310 nm is about 2 dB. FIG. 26 shows the amplifier performance of this example. In FIG. 26, amplifier 300 is pumped with 150 mW from one side pumping with 984 nm light. Gain flattening is achieved within about 1 dB in the range 1528 nm to 1562 nm for small input signals (−20 dBm). For large input signals (0 dBm), gain flattening is also achieved within about 1 dB.

EXAMPLE 4

Another example of production of a waveguide amplifier is described here. Again, substrate 16 can be a Si wafer with about a 15 μm thick thermal oxide as can be purchased from Silicon Quest International, Santa Clara, Calif. The embodiment of target 12 for the deposition of the active core can have a composition of about 50 cat. % Si, 48.5 cat. % Al, 1.5 cat. % Er (the "1.5/0" target), which can be fabricated as discussed in the '138 application. Target 12 was first cleaned by sputtering with Ar (80 sccm) only in the metallic mode. Target 12 was then conditioned in poison mode by flowing 60 sccm of Argon and 40 sccm of oxygen respectively.

The pulsed DC power supplied to target 12 was about 6 kW. Whenever a brand new target was used or when the target has been expose to atmosphere, a long time of condition (for example more than 30 hrs of conditioning) may be necessary to ensure films with the best active core property (longest life time and highest photoluminescence) are deposited. Substrate 16 is then preheat at about 350° C. for about 30 min before deposition.

The active core film was deposited onto a 6 inch thermal oxide wafer, which has been previously discussed, from the 1.5/0 target. The thermal oxide thickness was about 10 μm as described in previous examples. The active core is deposited to a thickness of about 1.2 μm with a deposition time of approximately 1 hr. The process condition are as listed in Table 4 below.

TABLE 3

| Target Power (KW) | Ar/O2 (sccm) | Pulsing Frequency (KHz) | Bias (W) | Reverse pulsing time (us) |
|---|---|---|---|---|
| 6 | 60/28 | 120 | 100 | 2.3 |

A straight waveguide pattern can then be formed by a standard photolithography procedure. The active core was etched using reactive ion etch followed by striping and cleaning. Finally, a 10 μm top cladding layer is deposited using a similar process. A target having composition 92 cat. % Si and 8 cat. % Al with deposition parameters as described in FIG. 9 was used to deposit the top cladding. The difference between the index of refraction between the core and the cladding is then about 3.7%.

Figure 27:
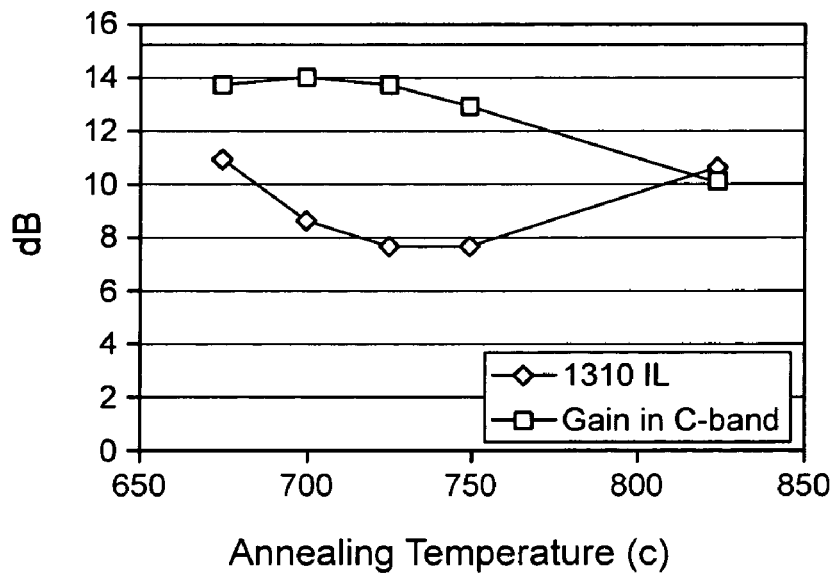
FIG. 27 shows gain, insertion loss of a waveguide with an active core deposited according to the present invention.

In this example, annealing of the amplifier structure was performed at various anneal temperatures. The results of the various anneals are shown graphically in FIGS. 27 and 28. FIG. 27 shows both internal gain in the C-band and insertion loss at 1310 nm of a 2.5 μm wide, 10.1 cm long waveguide as deposited in this example as a function of annealing temperature. The life time in ms and up-conversion constants in $cm^{-3}/s$ measurements for the deposited active core film at different annealing temperature are shown in FIG. 28.

EXAMPLE 5

Figure 29:
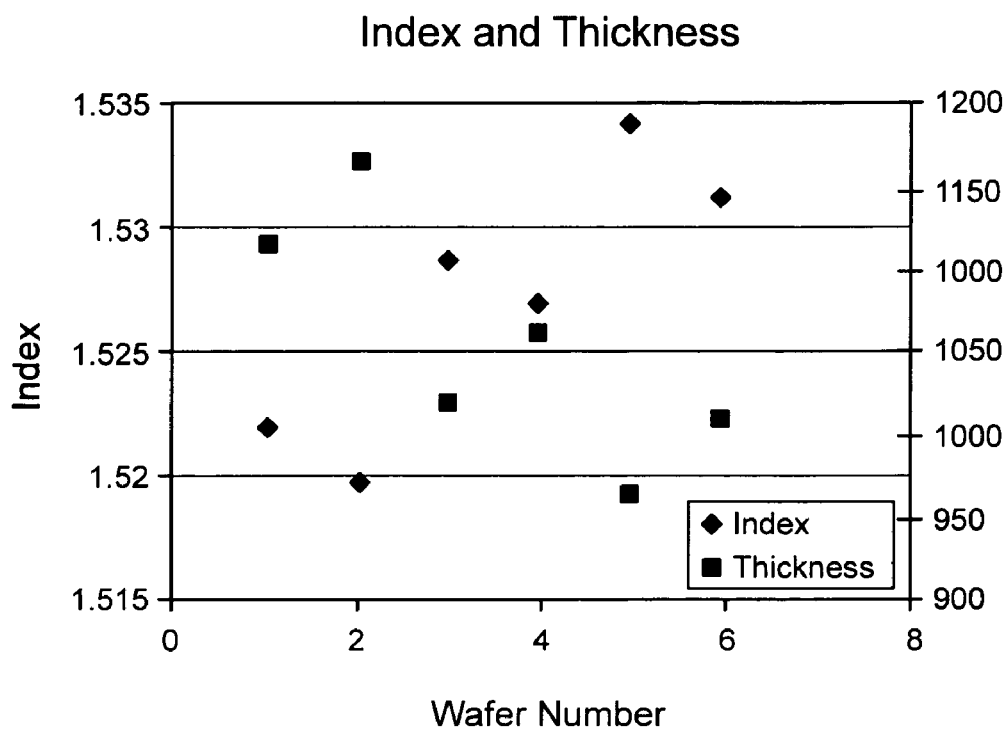
FIG. 29 shows drift in the index of refraction with subsequent depositions for films deposited from a target according to the present invention.
Figure 30:
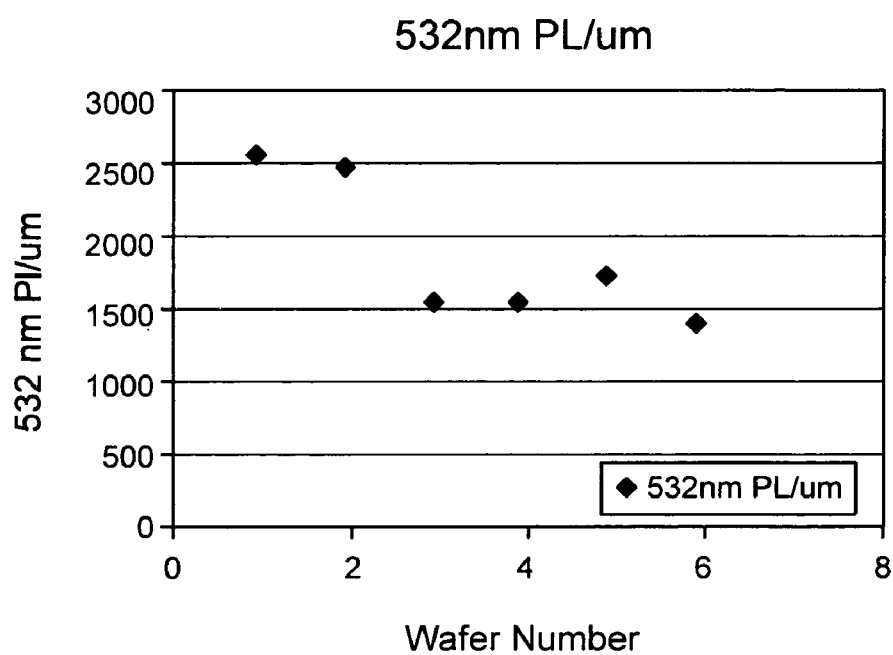
FIG. 30 shows drift in the photoluminescence with subsequent depositions according to the present invention.
Figure 31:
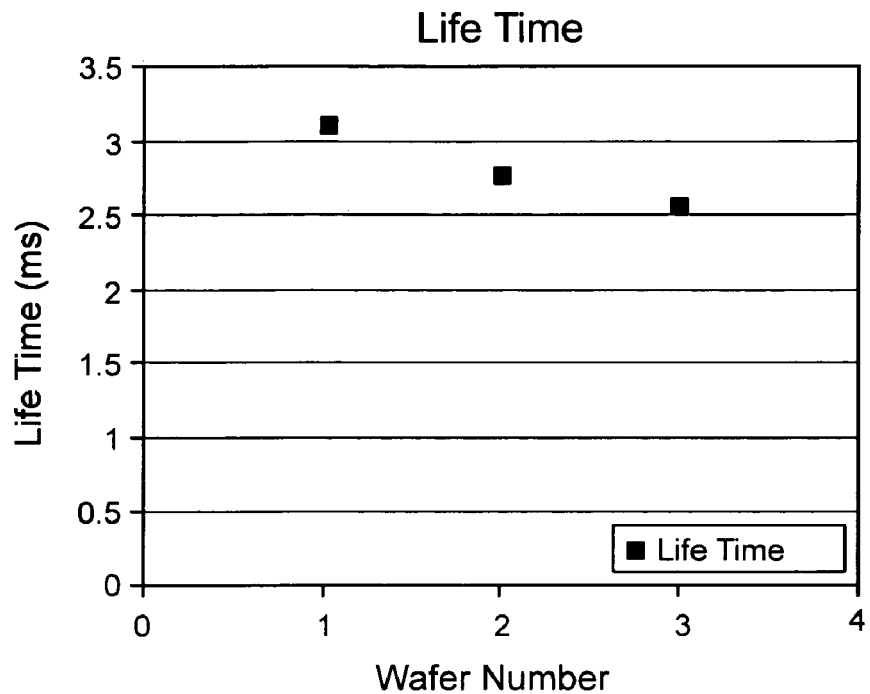
FIG. 31 shows drift in the excited state lifetime with subsequent depositions according to the present invention.

One of the problems encountered during the reactive sputtering from an alloy metallic target is that the film composition drifts from run to run due to the difference in sputtering yields from the elements that forms the target alloy. For example, with Ar as a sputtering gas, the sputtering yield of Aluminum is about 3-4 times that of Silicon, while sputtering yield of Alumina is only about 50% that of Silica. Therefore, during the metal burn in, more Aluminum is sputtered from the target, resulting in a Si rich target surface. When sputtering in the poison mode, more Silica will be removed from target. Thus, as deposition goes on, the composition of the film deposited on substrate 16 will drift from lower Alumina concentration to higher Alumina concentration. This results in the index of refraction of a film drifting up with subsequent depositions from a target 12, as is shown for the deposition described in Example 4 in FIG. 29. FIG. 30 shows the drift in photoluminescence pumped at 532 nm with subsequent depositions. FIG. 31 shows drift in the excited state lifetime with subsequent depositions from a target. The embodiment of target 12 utilized in FIGS. 29 through 31 is the 1.5/0 target and the deposition parameters are as described above in Example 4.

Figure 32:
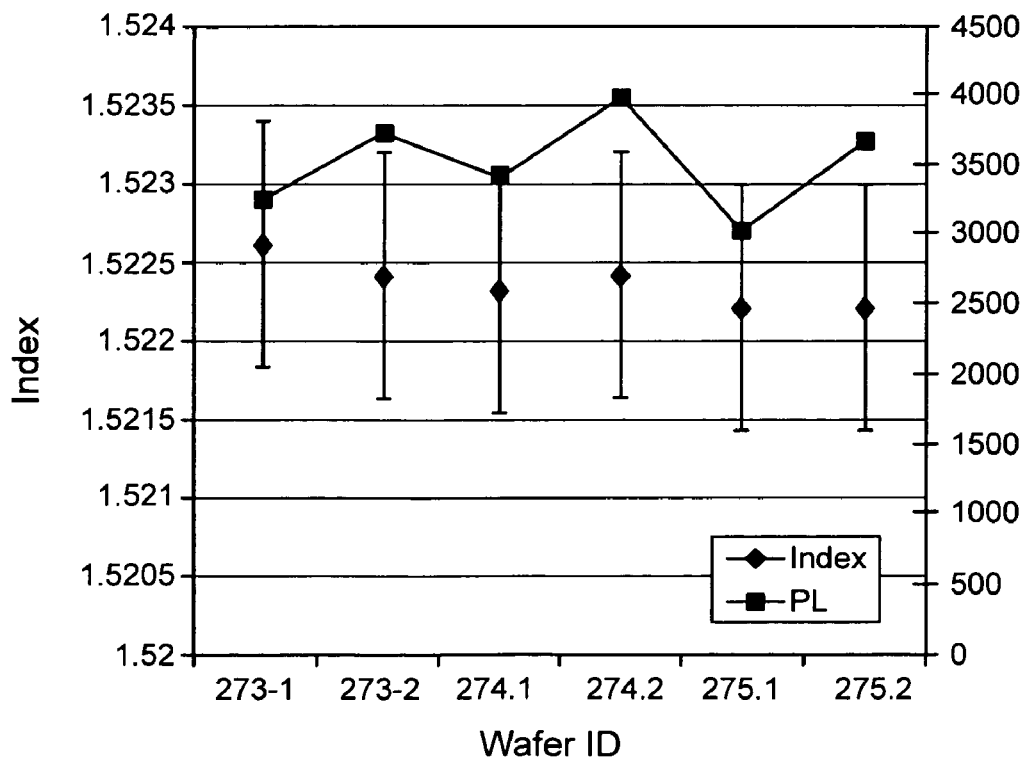
FIG. 32 shows stabilization of the index of refraction in subsequent depositions.

The drift can be stabilized by recondition target 12 prior to deposition. The recondition process (or burn in) consists of both sputtering in metallic mode and then sputtering in poison mode to condition target 12. The burn in time in metallic mode needs to be as short as possible and at the same time insure no arcing during the poison mode deposition. FIG. 32 shows the much improved drift in the index of refraction and the photoluminescence when target 12 is reconditioned between subsequent depositions.

EXAMPLE 6

This example describes the fabrication of another Er—Yb codoped waveguide amplifier according to the present invention. The active core is deposited with an embodiment of target 12 with composition about 49 cat. % Si, 48 cat. % Al, 1.6 cat. % Er and 0.5 cat. % Yb, which can be fabricated as described in the '341 application. Target 12 was first cleaned by sputtering with Ar (80 sccm) only in the metallic mode. Target 12 was then conditioned in poison mode by flowing 60 sccm of Argon and 40 sccm of oxygen respectively. The pulsed DC power supplied to target 12 was kept at 5 kW. Table 4 shows photoluminescence and index of refraction of as-deposited films from this example at some typical process conditions. The units for photoluminescence are the number of counts per micron. Lifetime and photo luminescence measured after annealing at various different temperatures are shown in Table 5.

| | Target 4 | | | | | |
|---|---|---|---|---|---|---|
| Target Power (KW) | Ar/O2 (sccm) | Pulsing Frequency (KHz) | Bias (W) | Reverse pulsing time (us) | 532 nm PL/um | Index |
| 5 | 60/34 | 120 | 100 | 2.3 | 3367 | 1.5333 |
| 5 | 60/30 | 120 | 100 | 2.3 | 3719 | 1.5334 |

TABLE 5

| Anneal Temperature ° C. | Life Time (ms) | PL (532 nm)/um |
|---|---|---|
| 725 | 3 | 7000 |
| 775 | 3 | 7000 |
| 800 | 4 | 7500 |
| 825 | 4.7 | 8560 |
| 850 | 5.8 | 10000 |
| 900 | 6.9 | 17000 |

A waveguide amplifier was fabricated using this material in the similar fashion as described in examples 2-4. The active core was first deposited on substrate 16, which includes a 10 um thermal oxide layer, using the following deposition parameters: target power 5 KW, pulsing frequency 120 KHz, bias 100W, reverse time 2.3 us, Argon and Oxygen flow are 60 sccm and 30 sccm respectively. The active core thickness is deposited to a thickness about 0.2 µm, which takes approximately 1 hr. All wafers are preheated at about 350° C. for 30 min before deposition. A straight waveguide pattern is then formed by standard photolithography procedure. The active core was etched using reactive ion etch following by striping and cleaning. Next, a 10 µm top cladding layer is deposited using similar process. The "92/8" (92 cat. % Si and 8 cat. % Al) metallic target was used to deposit top clad according to deposition parameters shown in FIG. 9, resulting in a 4% index difference between active core and cladding. The wave guide was then annealed at 800° C. for about 30 min.

This waveguide was tested for gain using the method described in previous examples. However no net gain was observed from this waveguide since the passive loss was too high.

EXAMPLE 7

In addition to active material layers (i.e., layers having rare-earth ion concentrations), passive layers can also be deposited. FIG. 9 shows deposition parameters for several target compositions, including some targets for deposition of passive (i.e., alloys of Al and Si with no rare earth ion concentration) layers. In this example, an embodiment of target 12 with a material composition of pure silicon is utilized.

Apparatus 10 can be based on an AKT 1600 reactor and deposited with about 1 to 3 kW of pulsed DC target power supplied to target 12. Particular depositions have been accomplished at 2.5 kW and 1.5 kW. The frequency of the pulsed DC power is between about 100 and 200 Khz. Some depositions were performed at 200 kHz while others were performed at 100 kHz. The reverse time was varied between about 2 µs and about 4 µs with particular depositions performed at 2.3 µs and 3.5 µs. The bias power to substrate 16 was set to zero.

Index variation of SiO2 films with bias to substrate 16 and deposition rates as a function of bias power to substrate 16 is shown in FIG. 10.

Figure 33:
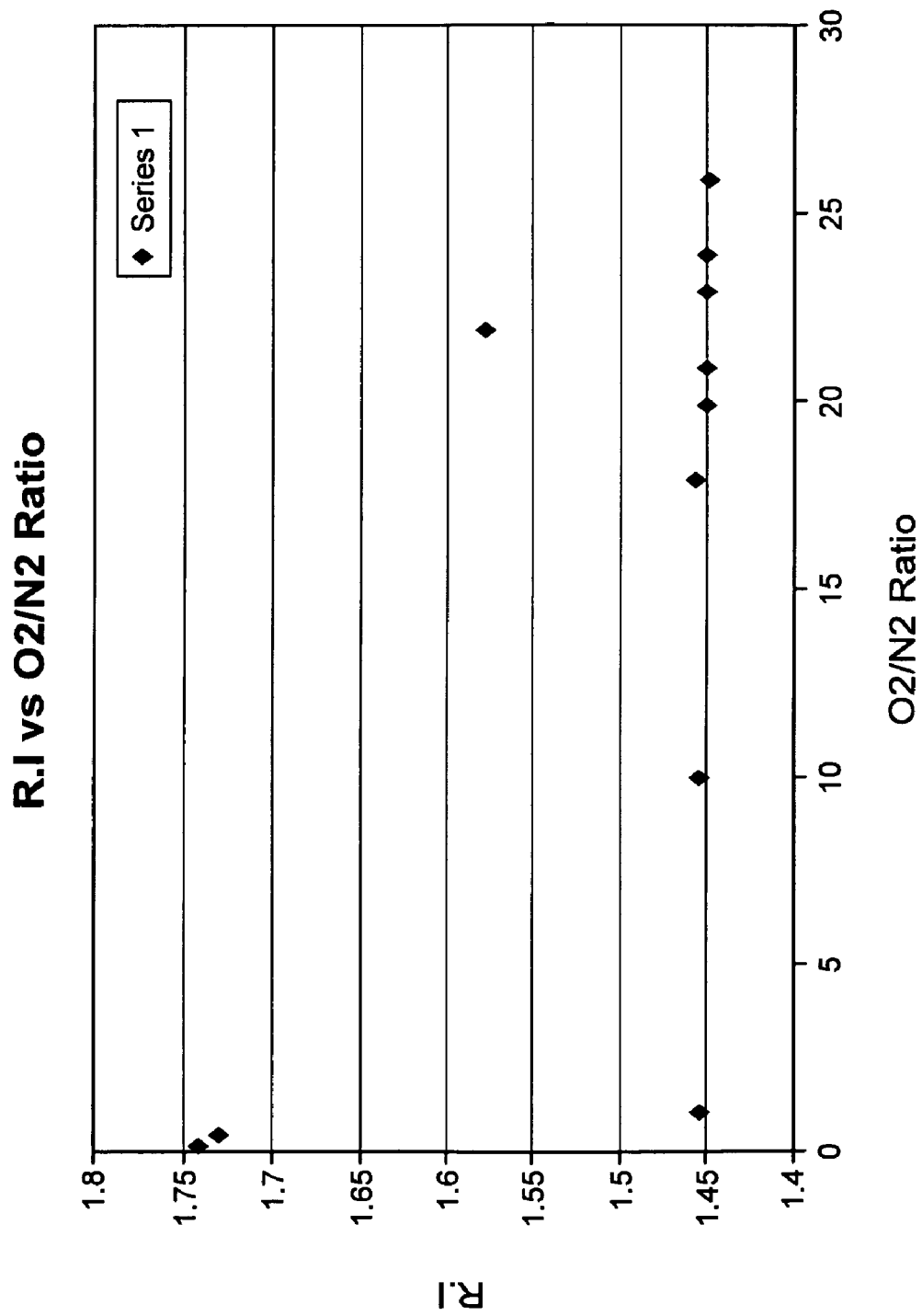
FIG. 33 shows the index of refraction of a film formed from a pure silicon target as a function of the ratio of $O_2/N_2$ in the process gas.

The process gas included a mixture of Ar, $N_2$ and $O_2$. The Ar flow rates was set at 20 sccm while the $O_2$ flow rate was varied between about 5 and about 20 sccm and the $N_2$ flow rate was varied from about 2 to about 35 sccm. FIG. 33 shows the variation in the index of refraction of a film deposition on substrate 16 as the $O_2/N_2$ ratio is varied.

EXAMPLE 8

Alternatively, films can be deposited on substrate 16 from a pure alumina target. In an example deposition with an embodiment of target 12 of alumina in an embodiment of apparatus 10 based on the AKT 1600 reactor, the pulsed DC target power was set at 3 kW and the frequency was varied between about 60 kHz and 200 kHz. The reverse time was set at 2.5 µs. Again, no bias power was supplied to substrate 16. The $O_2$ flow rate was varied from about 20 to about 35 sccm, with particular depositions performed at 22 and 35 sccm. The Ar flow rate was set at 26 sccm. A post deposition anneal of substrate 16 at 800° C. for 30 min. was performed.

FIG. 12 shows the variation of refractive index of the film deposited on substrate 16 with varying frequency of the pulsed DC power supplied to target 12. FIG. 11 shows the variation in refractive index of a film deposited on substrate 16 with varying $O_2/Ar$ ratio. As can be seen from FIGS. 33, 34 and 35, the index of refraction of films deposited from alumina can be adjusted by adjusting the process gas constituents or by adjusting the frequency of the pulsed DC power supplied to target 12 during deposition.

EXAMPLE 9

Additionally, passive films can be deposited from targets having a composition of Si and Al. For example, layers have been deposited from embodiments of target 12 with composition 83% Si and 17% Al. About 4.5 kW of pulsed DC power at about 200 kHz frequency was supplied to target 12. The reverse time was about 2.2 µs. A bias power of about 150 W was supplied to substrate 16 during deposition. FIGS. 14 and 15 show variation of the index of refraction for subsequent runs from this target.

The examples and embodiments discussed above are exemplary only and are not intended to be limiting. One skilled in the art can vary the processes specifically described here in various ways. Further, the theories and discussions of mechanisms presented above are for discussion only. The invention disclosed herein is not intended to be bound by any particular theory set forth by the inventors to explain the results obtained. As such, the invention is limited only by the following claims.

We claim:

1. A method of forming a waveguide amplifier, comprising:
providing a substrate with an undercladding layer;
providing an RF bias to the substrate;
providing a target having a concentration of rare-earth ions opposite the substrate;
supplying process gas between the target and the substrate;
applying pulsed DC power where the voltage on the target oscillates between positive and negative voltages through a narrow band rejection filter that matches the RF bias to the target to deposit an optically active film;
patterning the film to form a core;
depositing an uppercladding layer over the core.

2. The method of claim 1, wherein providing a substrate includes providing a silicon substrate with a thermal oxide layer.

3. The method of claim 1, wherein providing a target includes providing a target having a concentration of up to about 5 cat. % of rare earth ions.

4. The method of claim 3, wherein providing a target includes providing a target of Al and Si.

5. The method of claim 1, wherein providing a target includes providing a target with a concentration of Al.

6. The method of claim 5, wherein providing a target includes providing a target with a concentration of Si.

7. The method of claim 5, wherein providing a target includes providing a target with a concentration of rare earth ions.

8. The method of claim 1, further including providing bias power to the substrate.

9. The method of claim 1, further including scanning a magnet over the target.

10. The method of claim 1, wherein scanning the magnet over the target includes moving the magnet in a first direction.

11. The method of claim 10, wherein the magnet extends beyond the target in a second direction perpendicular to the first direction.

12. The method of claim 1, wherein the target has a surface area greater than the surface area of the substrate.

13. The method of claim 8, wherein the filter rejects power at a frequency of the bias power.

* * * * *